US010910603B2

(12) United States Patent
Tanaka

(10) Patent No.: US 10,910,603 B2
(45) Date of Patent: Feb. 2, 2021

(54) DISPLAY DEVICE INCLUDING ELECTROLUMINESCENCE ELEMENT

(71) Applicant: Mikuni Electron Corporation, Saitama (JP)

(72) Inventor: Sakae Tanaka, Saitama (JP)

(73) Assignee: MIKUNI ELECTRON CORPORATION, Saitama (JP)

( * ) Notice: Subject to any disclaimer, the term of this patent is extended or adjusted under 35 U.S.C. 154(b) by 0 days.

(21) Appl. No.: 16/678,229

(22) Filed: Nov. 8, 2019

(65) Prior Publication Data

US 2020/0274108 A1    Aug. 27, 2020

(30) Foreign Application Priority Data

Feb. 22, 2019   (JP) .................................. 2019-029934

(51) Int. Cl.
*H01L 27/32*   (2006.01)
*G09G 3/3258*  (2016.01)
(Continued)

(52) U.S. Cl.
CPC ....... *H01L 51/5296* (2013.01); *G09G 3/3258* (2013.01); *H01L 27/3248* (2013.01);
(Continued)

(58) Field of Classification Search
CPC ............. H01L 51/5296; H01L 51/5072; H01L 27/3248; H01L 27/3262; H01L 27/3279;
(Continued)

(56) References Cited

U.S. PATENT DOCUMENTS 8,344,387 B2    1/2013  Akimoto et al.
8,421,068 B2    4/2013  Yamazaki et al.
(Continued)

FOREIGN PATENT DOCUMENTS

EP    2634812 B1    12/2016
EP    3618136 A2    3/2020
(Continued)

OTHER PUBLICATIONS

U.S. Office Action for U.S. Appl. No. 16/206,744, dated Mar. 5, 2020.
(Continued)

*Primary Examiner* — Mohsen Ahmadi
(74) *Attorney, Agent, or Firm* — Pearne & Gordon LLP

(57) ABSTRACT

A electroluminescence display device includes a pixel including a selection transistor, a driving transistor, and an EL element, a scanning signal line electrically connected with a gate of the selection transistor, a data signal line electrically connected with a source of the selection transistor, and a carrier injection amount control signal line applying a voltage to the EL element. The EL element includes a first electrode, a third electrode, a first insulating layer between the first electrode and the third electrode, an electron transfer layer between the first insulating layer and the third electrode, a light emitting layer containing an electroluminescence material between the electron transfer layer and the third electrode, and a second electrode located outer to a region where the first electrode, the first insulating layer, the electron transfer layer and the third electrode overlap each other, the second electrode being in contact with the electron transfer layer.

11 Claims, 31 Drawing Sheets

(51) Int. Cl.
*G09G 3/3233* (2016.01)
*H01L 51/52* (2006.01)
*H01L 27/12* (2006.01)
*H01L 51/50* (2006.01)

(52) U.S. Cl.
CPC ...... *H01L 27/3262* (2013.01); *H01L 27/3279* (2013.01); *G09G 2300/0426* (2013.01); *G09G 2300/0452* (2013.01); *G09G 2300/0814* (2013.01); *H01L 27/124* (2013.01); *H01L 27/1225* (2013.01); *H01L 51/5072* (2013.01)

(58) Field of Classification Search
CPC .... H01L 27/124; G09G 3/3258; G09G 3/325; G09G 3/12; G09G 2300/0426; G09G 2300/0452; G09G 2300/0814
See application file for complete search history.

(56) References Cited

U.S. PATENT DOCUMENTS

| | | | |
|---|---|---|---|
| 8,598,610 B2* | 12/2013 | Oda | H01L 51/5088 257/98 |
| 8,816,380 B2* | 8/2014 | Oda | H01L 51/5096 257/98 |
| 10,074,709 B1 | 9/2018 | Tanaka | |
| 2002/0167280 A1 | 11/2002 | Hayashi et al. | |
| 2003/0197666 A1 | 10/2003 | Akimoto et al. | |
| 2005/0199880 A1 | 9/2005 | Hoffman et al. | |
| 2007/0126671 A1 | 6/2007 | Naoaki | |
| 2007/0269936 A1 | 11/2007 | Tanaka et al. | |
| 2009/0135105 A1 | 5/2009 | Nakamura et al. | |
| 2009/0140955 A1 | 6/2009 | Nakamura et al. | |
| 2009/0179195 A1 | 7/2009 | Obata et al. | |
| 2009/0179208 A1 | 7/2009 | Obata et al. | |
| 2009/0315043 A1 | 12/2009 | Nakamura et al. | |
| 2010/0193782 A1 | 8/2010 | Sakata | |
| 2010/0244020 A1 | 9/2010 | Sakata et al. | |
| 2010/0244710 A1 | 9/2010 | Obata et al. | |
| 2011/0108835 A1 | 5/2011 | Kim et al. | |
| 2012/0146062 A1* | 6/2012 | Oda | H01L 27/3211 257/88 |
| 2012/0146713 A1 | 6/2012 | Kim et al. | |
| 2012/0248451 A1 | 10/2012 | Sone et al. | |
| 2012/0313903 A1 | 12/2012 | Pyon et al. | |
| 2013/0001602 A1 | 1/2013 | Park et al. | |
| 2014/0111406 A1 | 4/2014 | Wang et al. | |
| 2015/0137103 A1 | 5/2015 | Hosono et al. | |
| 2016/0155980 A1 | 6/2016 | Lee et al. | |

FOREIGN PATENT DOCUMENTS

| | | |
|---|---|---|
| JP | 2002-343578 A | 11/2002 |
| JP | 2007-053286 A | 3/2007 |
| JP | 2007-149922 A | 6/2007 |
| JP | 2007-157871 A | 6/2007 |
| JP | 2007-310334 A | 11/2007 |
| JP | 2009-075613 A | 4/2009 |
| JP | 2010-153842 A | 7/2010 |
| JP | 2014-154382 A | 8/2014 |
| WO | 2007/043697 A1 | 4/2007 |

OTHER PUBLICATIONS

Hideo Hosono et al., Transparent amorphous oxide semiconductors for organic electronics: Application to inverted OLEDs, PNAS Early Edition, pp. 1-6.
Extended European Search Report, Application No. 19186679.7, dated Feb. 11, 2020.
Extended European Search Report, Application No. 19199145.4, dated Feb. 14, 2020.
Extended European Search Report for 19213814.7 dated May 29, 2020.
European Partial Search Report for Application No. 18173345.2, dated Oct. 2, 2018.
Extended European Search Report for Application No. 18173345.2, dated Jan. 14, 2019.
U.S. Office Action issued in U.S. Appl. No. 16/206,744 dated Oct. 14, 2020.

* cited by examiner (B)

DISPLAY DEVICE INCLUDING ELECTROLUMINESCENCE ELEMENT

CROSS REFERENCE TO RELATED APPLICATIONS

This application is based upon and claims the benefit of priority from the prior Japanese Patent Application No. 2019-029934 filed on Feb. 22, 2019, the entire contents of which are incorporated herein by reference.

FIELD

An embodiment of the present invention relates to a structure of, and a driving system for, a display device in which a pixel includes an electroluminescence element (hereinafter, referred to also as an "EL element").

BACKGROUND

An organic electroluminescence element (organic EL element) includes a pair of electrodes referred to as a "positive electrode" and a "negative electrode") and a light emitting layer located between the pair of electrodes. A basic structure of an organic EL element includes two terminals. However, a three-terminal organic EL element including a third electrode in addition to the two terminals has been disclosed.

For example, an organic EL element including a positive electrode, a layer formed of an organic electroluminescence material and referred to as a "light emitting material layer", a negative electrode, and an auxiliary electrode facing the negative electrode and the light emitting material layer with an insulating layer being provided between the auxiliary electrode and the negative electrode/the light emitting material layer is disclosed (see Japanese Laid-Open Patent Publication No. 2002-343578). A light emitting transistor including a hole injection layer, a carrier dispersion layer, a hole transfer layer and a light emitting layer that are stacked in this order, between a positive electrode and a negative electrode, from the side of the positive electrode, and further including an auxiliary electrode facing the positive electrode with an insulating film being provided between the auxiliary electrode and the positive electrode has been disclosed (see WO2007/043697).

An organic light emitting transistor element including an auxiliary electrode, an insulating film provided on the auxiliary electrode, a first electrode provided with a predetermined size on the insulating film, a charge injection suppression layer provided on the first electrode, a charge injection layer provided on a region of the insulating film where the first electrode is not provided, a light emitting layer provided on the charge injection suppression layer and the charge injection layer or provided on the charge injection layer, and a second electrode provided on the light emitting layer has been disclosed (see Japanese Laid-Open Patent Publication No. 2007-149922 and Japanese Laid-Open Patent Publication No. 2007-157871).

A known example of device in which the organic EL element is usable is a display device. An organic electroluminescence display device includes a display, in which a plurality of pixels is arrayed. Each of the pixels includes an organic EL element, a driving transistor driving the organic EL element, a selection transistor to which a scanning signal is to be input, and the like. The driving transistor and the selection transistor are each formed of a thin film transistor by use of an amorphous silicon semiconductor, a polycrystalline silicon semiconductor or an oxide semiconductor (see Japanese Laid-Open Patent Publication No. 2007-053286 and Japanese Laid-Open Patent Publication No. 2014-154382).

A display device including an electroluminescence element (hereinafter, referred to as an "EL element") is practically used in a multi-functional mobile phone called a "smartphone". Practical application of a display device including an EL element to a TV is now in progress. In order to be further spread, the display device including an EL element is desired to be improved in the reliability.

SUMMARY

A electroluminescence display device in an embodiment according to the present invention includes a pixel including a selection transistor, a driving transistor, and an EL element, a scanning signal line electrically connected with a gate of the selection transistor, a data signal line electrically connected with a source of the selection transistor, and a carrier injection amount control signal line applying a voltage to the EL element. The EL element includes a first electrode, a third electrode including a region facing the first electrode, a first insulating layer between the first electrode and the third electrode, an electron transfer layer between the first insulating layer and the third electrode, a light emitting layer containing an electroluminescence material between the electron transfer layer and the third electrode, and a second electrode located outer to a region where the first electrode, the first insulating layer, the electron transfer layer and the third electrode overlap each other, the second electrode being in contact with the electron transfer layer. The first electrode is electrically connected with the carrier injection amount control signal line, the second electrode is connected with a drain of the driving transistor, and the third electrode is supplied with a constant voltage.

A electroluminescence display device in an embodiment according to the present invention includes a plurality of pixels each including a selection transistor, a driving transistor, and an EL element, the plurality of pixels being arrayed in a first direction and in a second direction crossing the first direction, a plurality of scanning signal lines electrically connected with gates of the selection transistors, the plurality of scanning signal lines extending in the first direction and being arrayed in the second direction, a plurality of data signal lines electrically connected with sources of the selection transistors, the plurality of data signal lines extending in the second direction and being arrayed in the first direction, and a plurality of carrier injection amount control signal lines connected with the EL elements, the plurality of carrier injection amount control signal lines extending in the first direction or the second direction and being arrayed in the second direction or the first direction. The EL element of each of the plurality of pixels includes a first electrode, a third electrode including a region facing the first electrode, a first insulating layer between the first electrode and the third electrode, an electron transfer layer between the first insulating layer and the third electrode, a light emitting layer containing an electroluminescence material between the electron transfer layer and the third electrode, and a second electrode located outer to a region where the first electrode, the first insulating layer, the electron transfer layer and the third electrode overlap each other, the second electrode being in contact with the electron transfer layer. The first electrode is electrically connected with one of the carrier injection amount control signal lines, the second electrode is connected with a drain of the driving transistor, and the third electrode is supplied with a constant voltage.

DESCRIPTION OF EMBODIMENTS

Figure 1:
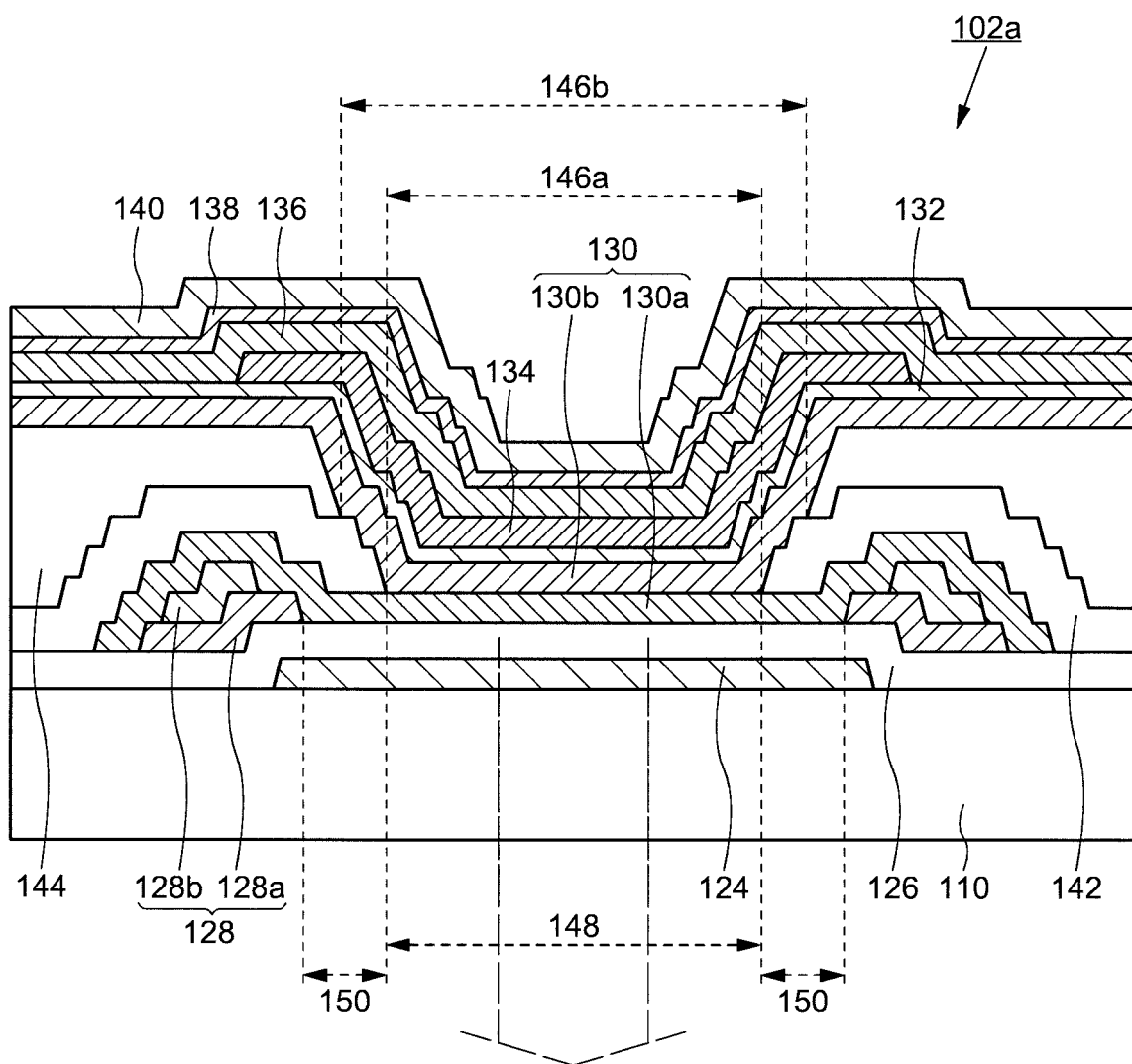
FIG. 1 shows a cross-sectional structure of an organic EL element usable in an EL display device according to an embodiment of the present invention.

Hereinafter, embodiments of the present invention will be described with reference to the drawings and the like. The present invention may be carried out in various embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely examples and do not limit the present invention in any way. In the specification and the drawings, components that are substantially the same as those described or shown previously bear the identical reference signs thereto (or the identical reference signs followed by letters "a", "b" or the like), and detailed descriptions thereof may be omitted. The terms "first", "second" and the like used for elements are merely provided for distinguishing the elements and do not have any other significance unless otherwise specified.

In the specification and the claims, an expression that a component is "on" another component encompasses a case where such a component is in contact with another component and also a case where such a component is above or below the another component, namely, a case where still another component is provided between such a component and the another component, unless otherwise specified.

1. Organic EL Element

A structure and an operation of an EL element according to an embodiment of the present invention will be described.

1-1. Structure of the EL Element

An EL element has a structure in which a positive electrode (or a negative electrode), an organic layer and a negative electrode (or a positive electrode) are stacked on a substrate. The organic layer has a structure in which a light emitting layer containing an EL material and also layers referred to by names representing functions thereof, such as a hole injection layer, a hole transfer layer, an electron injection layer, an electron transfer layer, a hole blocking layer and an electron blocking layer, are stacked in an appropriate manner. One or a plurality of these layers referred to by the names representing the functions thereof may be omitted from the organic layer. In order to allow the EL element to emit light, the negative electrode acts as an electrode that injects electrons into the organic layer, whereas the positive electrode acts as an electrode that injects holes into the organic layer.

The EL element has a structure in which light emitted by the light emitting layer is output through one of the positive electrode and the negative electrode. The EL element is classified into one of a bottom-emission type and a top-emission type based on the direction in which the light is output. In the bottom-emission type, the light is output through the substrate. In the top-emission type, the light is output from the side opposite to the substrate. The EL element may be classified based on the order in which the electrodes and the organic layers are stacked during the production thereof. For example, the EL element is classified into one of a so-called forward stack structure and a reverse stack structure. In the forward stack structure, the positive electrode, the hole transfer layer, the light emitting layer, the electron transfer layer and the negative electrode are stacked on the substrate in this order. In the reverse stack structure, the layers are stacked in an opposite order thereto.

1-1-1. Bottom Emission-Type Organic EL Element

FIG. 1 shows an example of cross-sectional structure of an organic EL element 102a. The organic EL element 102a shown in FIG. 1 has a structure in which a first electrode 124, a first insulating layer 126, a second electrode 128, an electron transfer layer 130 (a first electron transfer layer 130a and a second electron transfer layer 130b), an electron injection layer 132, a light emitting layer 134, a hole transfer layer 136, a hole injection layer 138, and a third electrode 140 are stacked on a substrate 110 in this order from the side of the substrate 110. The second electrode 128 corresponds to the negative electrode, and is provided to be in contact with the electron transfer layer 130 (first electron transfer layer 130a). The third electrode 140 corresponds to the positive electrode.

Although not shown in FIG. 1, a hole blocking layer may be located between the electron injection layer 132 and the light emitting layer 134, and an electron blocking layer may be located between the light emitting layer 134 and the hole transfer layer 136. Among the organic layers, one of the hole transfer layer 136 and the hole injection layer 138 may be omitted, or the hole transfer layer 136 and the hole injection layer 138 may be replaced with a hole injection and transfer layer having a function of hole injection and a function of hole transfer.

The organic EL element 102a includes a region (overlapping region) where the first electrode 124, the first insulating layer 126, the electron transfer layer 130 (the first electron transfer layer 130a and the second electron transfer layer 130b), the electron injection layer 132, the light emitting layer 134, the hole transfer layer 136, the hole injection layer 138 and the third electrode 140 overlap each other in a vertical direction (thickness direction). This overlapping region is a light emitting region 148 of the EL element 102a. Since the EL element 102a is of a bottom-emission type, the light output from the light emitting layer 134 is output through the first electrode 124. Therefore, the first electrode 124 is formed of a conductive material that is light-transmissive. By contrast, the third electrode 140 is formed of a metal film or a stack structure of a transparent conductive film and a metal film, so as to reflect the light output from the light emitting layer 134.

The second electrode 128 is located outer to the light emitting region 148, and is located to be electrically connected with the electron transfer layer 130 (first electron transfer layer 130a). The second electrode 128 is provided to be in contact with at least a part of the electron transfer layer 130 (first electron transfer layer 130a). For example, the second electrode 128 is located between the electron transfer layer 130 (first electron transfer layer 130a) and the first insulating layer 126, such that a top surface of the second electrode 128 is in contact with a bottom surface of the electron transfer layer 130 (first electron transfer layer 130a).

FIG. 1 shows an embodiment in which the second electrode 128 includes a metal oxide conductive layer 128a, which is conductive, and a metal layer 128b stacked on each other. Since the metal oxide conductive layer 128a is in contact with the electron transfer layer 130 (first electron transfer layer 130a), the second electrode 128 decreases the contact resistance thereof. The metal layer 128b is provided as an auxiliary electrode decreasing the sheet resistance (planar resistivity) of the metal oxide conductive layer 128a. The metal layer 128b provided in contact with the metal oxide conductive layer 128a contributes to decreasing the resistance of the second electrode 128 and thus contributes to decreasing the serial resistance component of the EL element 102a.

In the EL element 102a, the second electrode 128 is an electrode that has a function of injecting electrons into the electron transfer layer 130 and is referred to as a "negative electrode" or a "cathode". By contrast, the third electrode 140 is an electrode that has a function of injecting holes into the hole injection layer 138 and is referred to as a "positive electrode" or an "anode". The electrons are injected from the second electrode 128 into the electron transfer layer 130, and the holes are injected from the third electrode 140 into the hole transfer layer 138, and as a result, the EL element 102a emits light. The first electrode 124 is insulated from the electron transfer layer 130 and thus is not an electrode that directly injects carriers. However, the first electrode 124 is located such that an electric field generated by application of a voltage to the first electrode 124 acts on the electron transfer layer 130. The electric field formed by the first electrode 124 influences the distribution of the carriers in the electron transfer layer 130, and also has a function of controlling the amount of the carriers to flow into the light emitting layer 134. Because of such functions, the first electrode 124 is referred to also as a "carrier injection amount control electrode", and is used as an electrode that controls the light emission state of the EL element 102a.

FIG. 1 shows an embodiment in which the electron transfer layer 130 includes two layers, more specifically, the first electron transfer layer 130a and the second electron transfer layer 130b. The first electron transfer layer 130a is located to be in contact with the second electrode 128, whereas the second electron transfer layer 130b is located closer to the light emitting layer 134 than the first electron transfer layer 130a. The first electron transfer layer 130a and the second electron transfer layer 130b are common in the function of transferring the carriers (electrons) injected from the second electrode 128 to the light emitting layer 134. The first electron transfer layer 130a in contact with the second electrode 128 and the second electron transfer layer 130b located closer to the light emitting layer 134 than the first electron transfer layer 130a are different from each other in the carrier (electron) concentration and the carrier (electron) mobility. Specifically, the carrier (electron) concentration of the second electron transfer layer 130b has a value lower than that of the carrier (electron) concentration of the first electron transfer layer 130a in order to prevent the deactivation of excitons.

The second electron transfer layer 130b may be omitted from the EL element 102a. Namely, the first electron transfer layer 130a may be in contact with the electron injection layer 132. The first electron transfer layer 130a and the second electron transfer layer 130b have the common function of transferring the electrons injected from the second electrode 128 to the light emitting layer 134, and therefore, may be functionally regarded as being one layer.

The EL element 102a may include an insulating layer having an opening in order to demarcate the light emitting region 148. FIG. 1 shows an embodiment in which a second insulating layer 142 having a first opening 146a is provided between the first electron transfer layer 130a and the second electron transfer layer 130b. The second insulating layer 142 is provided as an upper layer to the first electron transfer layer 130a (provided on the side opposite to the substrate 110). The second insulating layer 142 has the first opening 146a exposing a part of a top surface of the first electron transfer layer 130a. The second electron transfer layer 130b is provided as an upper layer to the second insulating layer 142 (provided on the side opposite to the substrate 110) to be in contact with the first electron transfer layer 130a in the first opening 146a.

In the first opening 146a, the first electron transfer layer 130a, the second electron transfer layer 130b, the electron injection layer 132, the light emitting layer 134, the hole transfer layer 136, the hole injection layer 138 and the third electrode 140 are stacked in series so as not to inhibit the flow of the carriers (electrons, holes). The region where these layers are stacked in series is the light emitting region 148. Namely, the light emitting region 148 of the EL element 102a is demarcated by the first opening 146a.

FIG. 1 shows an embodiment in which a third insulating layer 144 is provided as an upper layer to the second insulating layer 142 (provided on the side opposite to the substrate 110). In terms of the stacking order, the third insulating layer 144 is provided between the second insulating layer 142 and the second electron transfer layer 130b. The third insulating layer 144 has a second opening 146b overlapping the first opening 146a. The third insulating layer 144 has the second opening 146b to demarcate the light emitting region 148. The second electrode 128 is covered with the second insulating layer 142 to be insulated from the third electrode 140. The third insulating layer 144 provided on the second insulating layer 142 extends the distance between the second electrode 128 and the third electrode 140. Such a structure decreases the parasitic capacitance formed in a region where the second insulating layer 142 and the third electrode 140 overlap each other. The third insulating layer 144 may be omitted from the EL element 102a.

It is preferred that the second opening 146b of the third insulating layer 144 has a diameter that is equal to, or longer than, that of the first opening 146a of the second insulating layer 142. With the structure in which the diameter of the second opening 146b is longer than the diameter of the first opening 146a, steps are formed. It is preferred that the first opening 146a of the second insulating layer 142 and the second opening 146b of the third insulating layer 144 each have a side surface inclining so as to open upward (the side opposite to the substrate 110). In the case where the side surfaces of the first opening 146a and the second opening 146b are inclining, the steepness of the steps is alleviated. Such a structure prevents the steps of the first opening 146a and the second opening 146b from causing cracks in the second electron transfer layer 130b, the electron injection layer 132, the light emitting layer 134, the hole transfer layer 136, the hole injection layer 138 or the third electrode 140.

The second electrode 128 is located outer to the first opening 146a of the second insulating layer 142 so as not to be exposed to the first opening 146a. As shown in FIG. 1, an end of the second electrode 128 is located away from an opening end of the second insulating layer 142. In other words, the second electrode 128 is located away from the light emitting region 148. The end of the second electrode 128 and an end of the light emitting region 148 are connected with each other via the first electron transfer layer 130a. A region between the end of the second electrode 128 and the end of the light emitting region 148 is referred to as an "offset region 150". The offset region 150 is a region where the first electron transfer layer 130a is held between the first insulating layer 126 and the second insulating layer 142, and overlaps the first electrode 124. Where a total thickness of the electron transfer layer 130, the electron injection layer 132, the light emitting layer 134, the hole transfer layer 136 and the hole injection layer 138 is 100 nm to 1000 nm, it is preferred that the offset region 150 has a length that is longer than, or equal to, ten times the total thickness, specifically, a length of about 1 μm to about 20 μm, for example, 2 μm to 5 μm, for the purpose of preventing the concentration of the electric field. The EL element 102a includes the offset region 150 having such a structure to have an increased withstand voltage.

The amount of the carriers (electrons) to be transferred from the electron transfer layer 130 (the first electron transfer layer 130a and the second electron transfer layer 130b) to the light emitting layer 134 is controlled by the first electrode 124. As the voltage applied to the first electrode 124 is increased, the electric field acting on the electron transfer layer 130 (the first electron transfer layer 130a and the second electron transfer layer 130b) is increased. The electric field generated by an application of a positive voltage to the first electrode 124 acts to draw the carriers (electrons) from the second electrode 128 to the first electron transfer layer 130a. Therefore, the amount of the carriers (electrons) transferred to the light emitting layer 134 may be increased. Namely, the amount of the carriers (electrons) transferred from the first electron transfer layer 130a to the light emitting layer 134 may be controlled by the level of the voltage applied to the first electrode 124. The first electrode 124 may directly control the amount of the carriers (electrons) to be injected into the light emitting layer 134. This property is usable to balance the amount of the carriers (electrons) injected into the light emitting layer 134 from the first electron transfer layer 130a and the amount of the carriers (holes) injected into the light emitting layer 134 from the third electrode 140 (this balance between the electrons and the holes is referred to as the "carrier balance"). Namely, the EL element 102a has an element structure capable of adjusting the carrier balance.

The electric field formed by the first electrode 124 also acts on the offset region 150. When a positive voltage is applied to the first electrode 124, the carriers (electrons) are induced to a part of the first electron transfer layer 130a that is in the offset region 150. Such an action prevents the offset region 150 from having an increased resistance. In the case where the length of the offset region 150 is about 1 μm to about 5 μm, when the first electrode 124 has the ground potential, the electrons are prevented from flowing from the second electrode 128 to the first electron transfer layer 130a.

The electron transfer layer 130 (the first electron transfer layer 130a and the second electron transfer layer 130b) is formed of a light-transmissive oxide semiconductor. The light-transmissive oxide semiconductor is an inorganic material and an oxide, and therefore, has a thermal stability higher than that of an organic material. Since the electron transfer layer 130 is formed of an oxide semiconductor, the EL element 102a may have a stable structure with no deterioration in the characteristics even though having a reverse stack structure.

1-1-2. Top-Emission EL Element

Figure 2:
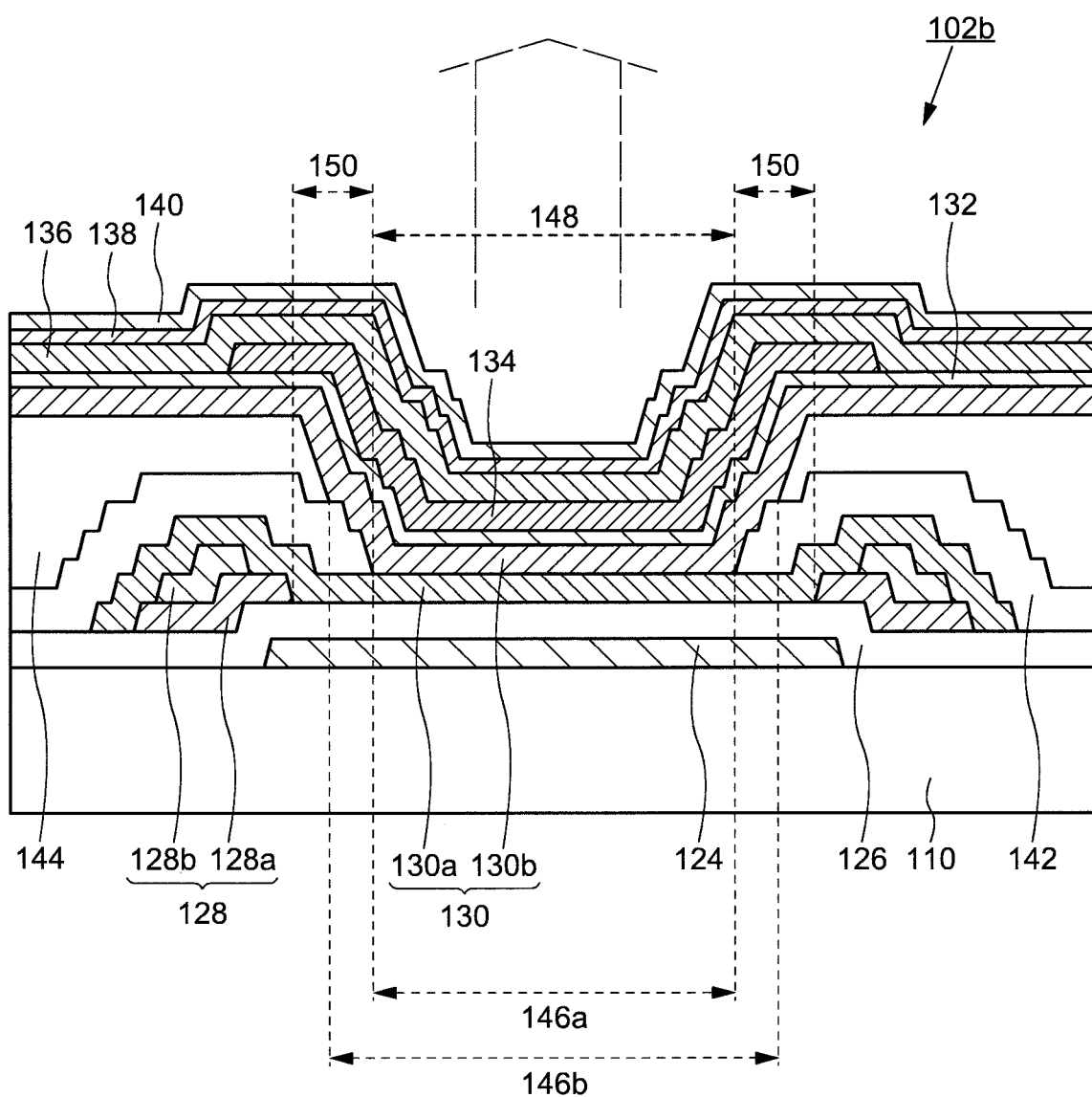
FIG. 2 shows a cross-sectional structure of an organic EL element usable in the EL display device according to an embodiment of the present invention.

FIG. 2 shows an EL element 102b of the top-emission type. The EL element 102b of the top-emission type has a structure same as that of the EL element 102a of the bottom-emission type shown in FIG. 1 except for the structures of the third electrode 140 and the first electrode 124. In the case of the EL element 102b of the top-emission type, the first electrode 124 is formed of a metal film such that a light reflective surface is formed, and the third electrode 140 is formed of a transparent conductive film such that the light output from the light emitting layer 134 is transmitted through the third electrode 140. The second electrode 128 is located outer to the light emitting region 148, and therefore, has the same structure as that of the second electrode 128 of the EL element 102a of the bottom-emission type. The organic layers have a structure in which the electron transfer layer 130 (the first electron transfer layer 130a and the second electron transfer layer 130b), the electron injection layer 132, the light emitting layer 134, the hole transfer layer 136 and the hole injection layer 138 are stacked on the substrate 110 in this order from the side of the substrate 110.

As described above, the EL element 102b of the top-emission type is realized by changing the structures of the first electrode 124 and the third electrode 140. Namely, an EL element 102 according to this embodiment may be provided either as a bottom emission-type element or a top emission-type element by changing the structures of the electrodes while keeping the reverse stack structure.

1-2. Operation of the EL Element

Figure 3:
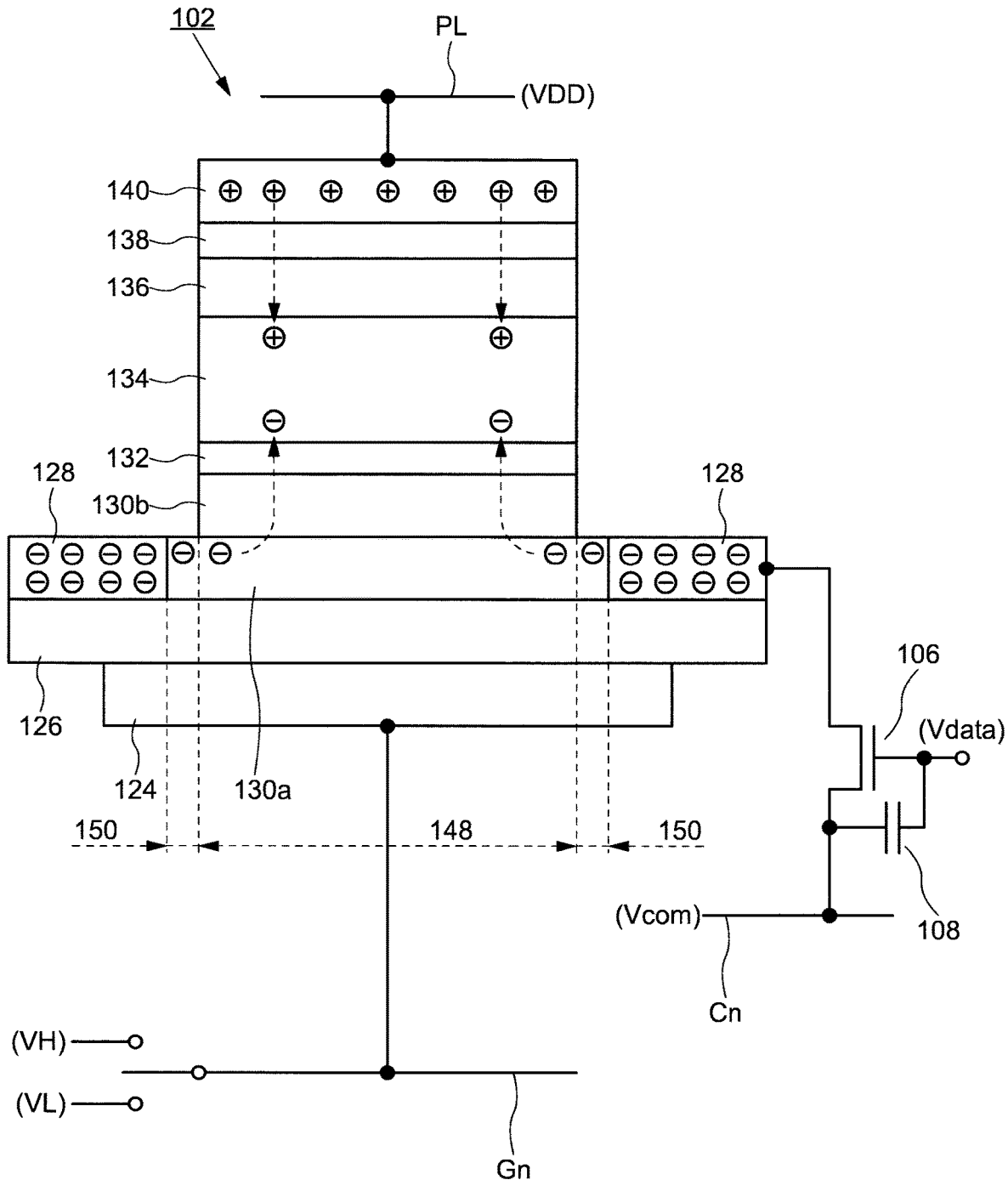
FIG. 3 shows an operation state of an EL element usable in the EL display device according to an embodiment of the present invention while a carrier injection amount control electrode is floating.
Figure 4:
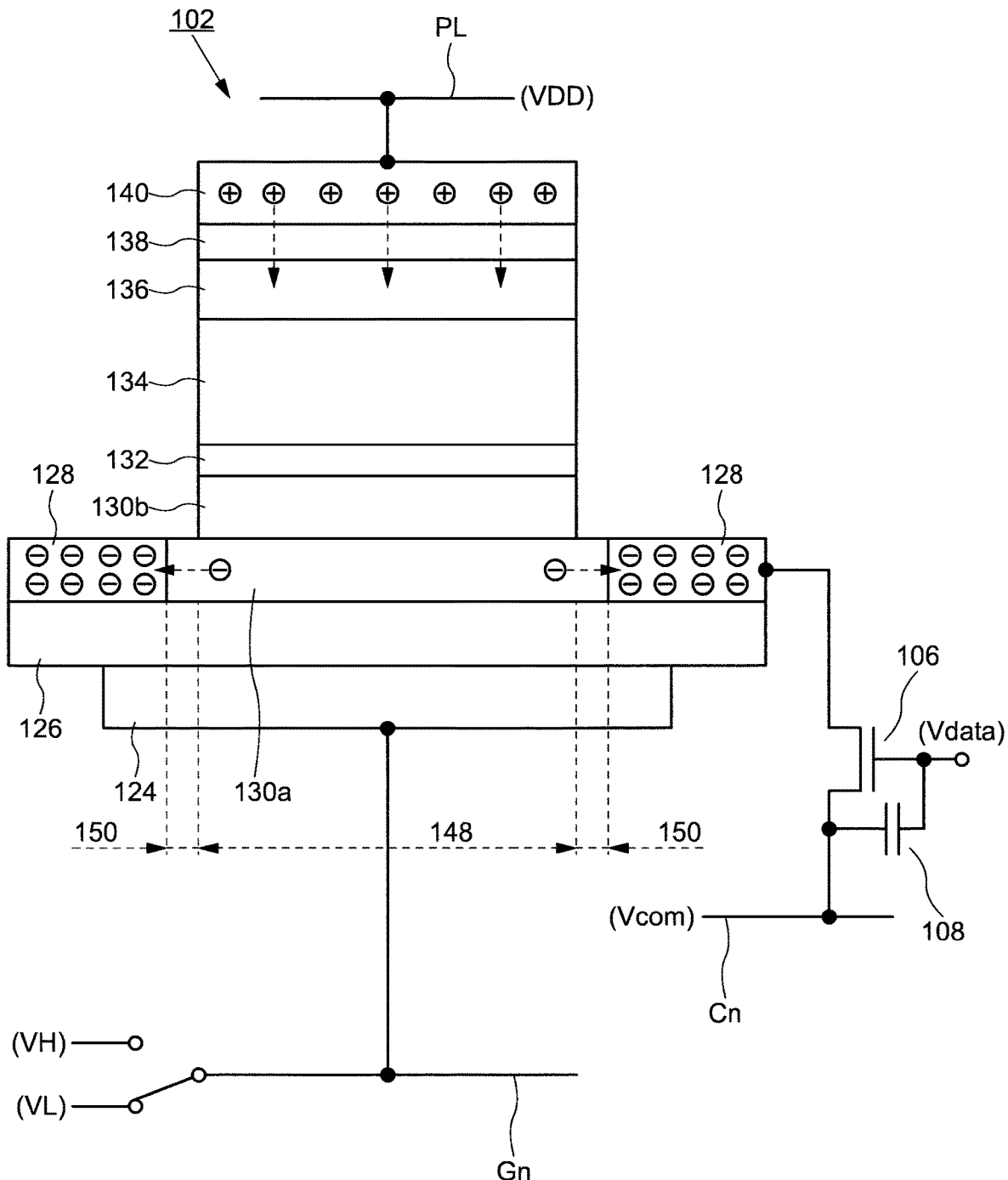
FIG. 4 shows an operation state of an EL element usable in the EL display device according to an embodiment of the present invention while the carrier injection amount control electrode is supplied with a low voltage.
Figure 5:
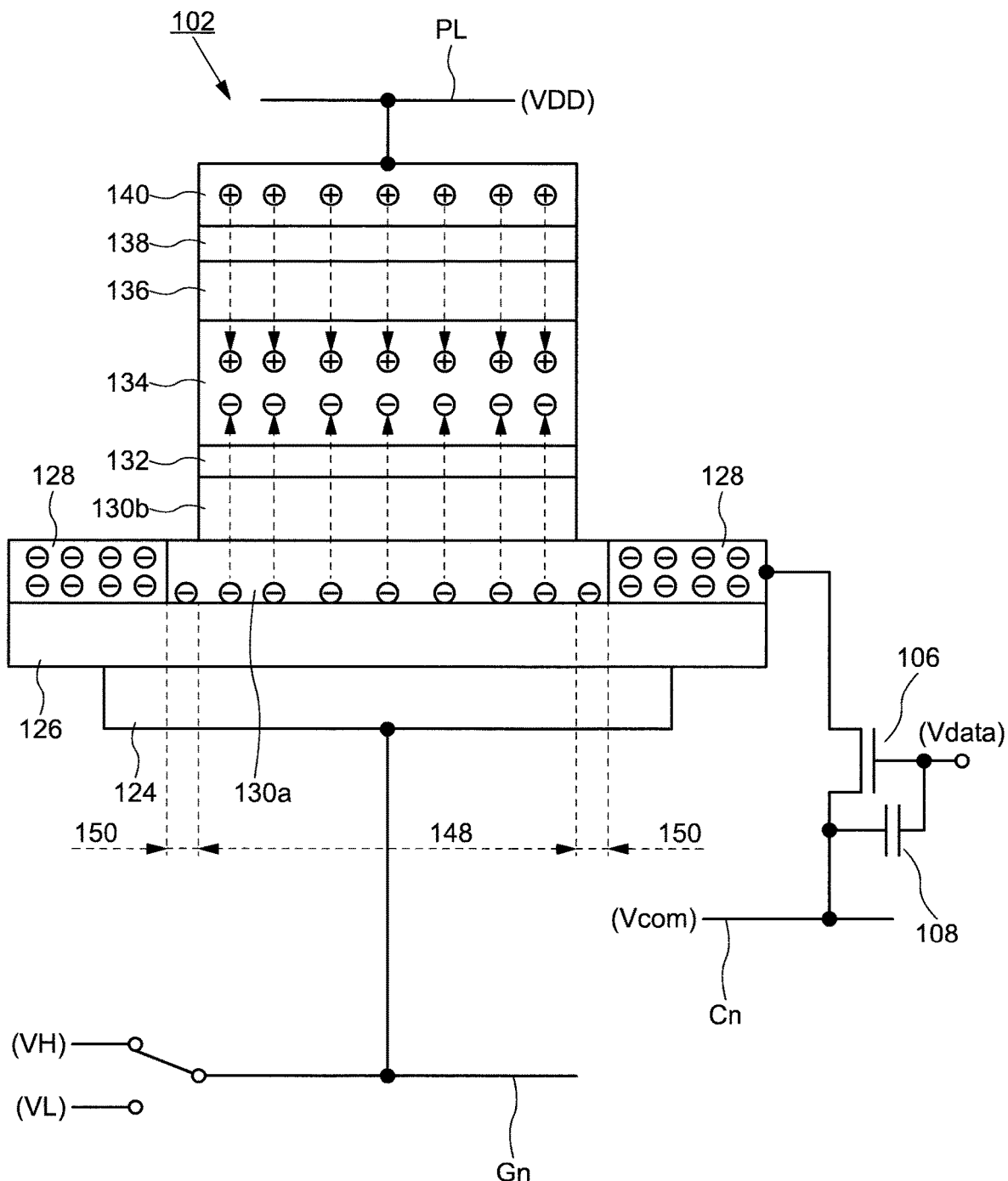
FIG. 5 shows an operation state of an EL element usable in the EL display device according to an embodiment of the present invention while the carrier injection amount control electrode is supplied with a high voltage.

With reference to FIG. 3, FIG. 4 and FIG. 5, an operation of the EL element 102 will be described. FIG. 3, FIG. 4 and FIG. 5 each schematically show the positional arrangement of the first electrode 124, the first insulating layer 126, the second electrode 128, the electron transfer layer 130, the electron injection layer 132, the light emitting layer 134, the hole transfer layer 136, the hole injection layer 138 and the third electrode 140, which are included in the EL element 102.

1-2-1. Operation of Light Emission and Light Non-Emission of the EL Element

The EL element 102 emits light by a forward current flowing both in the third electrode (positive electrode) 140 and the second electrode (negative electrode) 128. FIG. 3 shows an embodiment in which the first electrode (carrier injection amount control electrode) 124 is connected with a carrier injection amount control signal line Gn, the second electrode 128 is connected with a drain of a driving transistor 106, and the third electrode 140 is connected with a power supply line PL.

FIG. 3 shows a state where a voltage (Vdata) based on a data signal is applied to a gate of the driving transistor 106, the EL element 102 is biased forward (biased such that the third electrode 140 has a potential higher than that of the second electrode 128), and the first electrode 124 is floating. When the forward voltage applied to the EL element 102 is higher than, or equal to, the light emission start voltage of the EL element 102, holes are injected from the third electrode, whereas electrons are injected from the second electrode 128. The light emission intensity of the EL element 102 is controlled by the magnitude of the forward current. The current flowing in the EL element 102 is controlled by a drain current of the driving transistor 106. The drain current of the driving transistor 106 is controlled by the gate voltage (Vdata) held by a capacitive element 108.

The EL element 102 has a structure in which the electron transfer layer 130 (the first electron transfer layer 130a and the second electron transfer layer 130b) and the third electrode 140 face each other while having the light emitting layer 134 therebetween on the first insulating layer 126, and the second electrode 128 does not overlap the third electrode 140 but is connected with the third electrode 140 in a peripheral region of the first electron transfer layer 130a. In the EL element 102, the electrons are injected from the second electrode 128 into the first electron transfer layer 130a, whereas the holes are injected from the third electrode 140 into the hole injection layer 138. Since the first electrode 124 has a floating potential, the electrons injected into the first electron transfer layer 130a is drifted only by the electric field generated between the third electrode 140 and the second electrode 128. In this case, the electric field distribution generated between the second electrode 128 and the third electrode 140 is not uniform in the light emitting region 148 due to the structure of the EL element 102.

In this state, even if a forward voltage higher than, or equal to, the light emission start voltage is applied to the EL element 102, the carriers (electrons) injected from the second electrode 128 into the first electron transfer layer 130a do not flow in the light emitting region 148 with a uniform concentration distribution. Therefore, a central region of the light emitting region 148 of the EL element 102 is dark, whereas a peripheral region of the light emitting region 148 emits bright light. In addition, the amount of the current flowing in the EL element 102 is small and the light emission intensity is not high due to the influence of the offset region 150.

FIG. 4 shows a state where a carrier injection amount control voltage VL of a first level is applied to the first electrode 124 from the carrier injection amount control signal line Gn while a data signal Vdata is applied to the gate of the driving transistor 106 and the EL element 102 is biased forward. It is assumed that the carrier injection amount control voltage VL has a potential equal to the ground potential. In this state, no electron is present in the first electron transfer layer 130a, and the first electron transfer layer 130a changes to an insulating state. As a result, the forward current does not flow in the EL element 102, and the EL element 102 is in a light non-emission state.

FIG. 5 shows a state where a carrier injection amount control voltage VH of a second level, which is higher than the first level, is applied to the first electrode 124 while the EL element 102 is biased forward. The carrier injection amount control voltage VH of the second level is a positive voltage, and the electric field formed by the first electrode 124 acts to cause the electrons to drift from the first electron transfer layer 130a toward the light emitting layer 134. Since the electric field generated by the first electrode 124 acts on the first electron transfer layer 130a, the electrons injected from the second electrode 128 into the first electron transfer layer 130a are drifted from the peripheral region of the first electron transfer layer 130a toward the central region of the light emitting region 148.

Since the EL element 102 is biased forward, the carriers (electrons) transferred toward the central region of the light emitting region 148 are transferred from the first electron transfer layer 130a toward the light emitting layer 134. The holes injected from the third electrode 140 and the electrons injected from the second electrode 128 are recombined in the light emitting layer 134 to generate excitons. In the light emitting layer 134, photons are released when the excitons in an excited state are transited into a ground state, and as a result, the light is emitted (light emission state).

In the state where the EL element 102 is biased forward and the carrier injection amount control voltage VH of the second level is applied to the first electrode 124, the amount of the electrons injected into the first electron transfer layer 130a is controlled by the level of the voltage of the second electrode 128. The amount of the electrons injected into the first electron transfer layer 130a may be increased by increasing the voltage of the second electrode 128. The amount of the electrons injected from the first electron transfer layer 130a into the light emitting layer 134 may be controlled by the level of the voltage of the first electrode 124. The voltage of the first electrode 124 may be increased, so that the electrons injected from the second electrode 128 are drawn to the light emitting region 148 in an increased amount and thus the amount of the carriers to be injected into the light mitting region 148 is increased.

As can be seen, the EL element 102 includes the second electrode 128 as the negative electrode and the third electrode 140 as the positive electrode, and also includes the first electrode 128 applying a voltage independently from the second electrode 128 and the third electrode 140, so as to control the concentration of the carriers to be injected into the light emitting layer 134.

In order to allow the light emitting region 148 to emit light at a uniform intensity, it is preferred that the electrons flowing in the second electron transfer layer 130b form a space charge limited current. In order to allow the space charge limited current to flow in the second electron transfer layer 130b, it is preferred that the oxide semiconductor layer forming the second electron transfer layer 130b is in an amorphous state, a nano-sized crystalline state, or a mixed state thereof. It is preferred that the first electron transfer layer 130a is a film containing nano-sized crystals and having a high density.

1-2-2. Band Diagram of the EL Element

Figure 6:
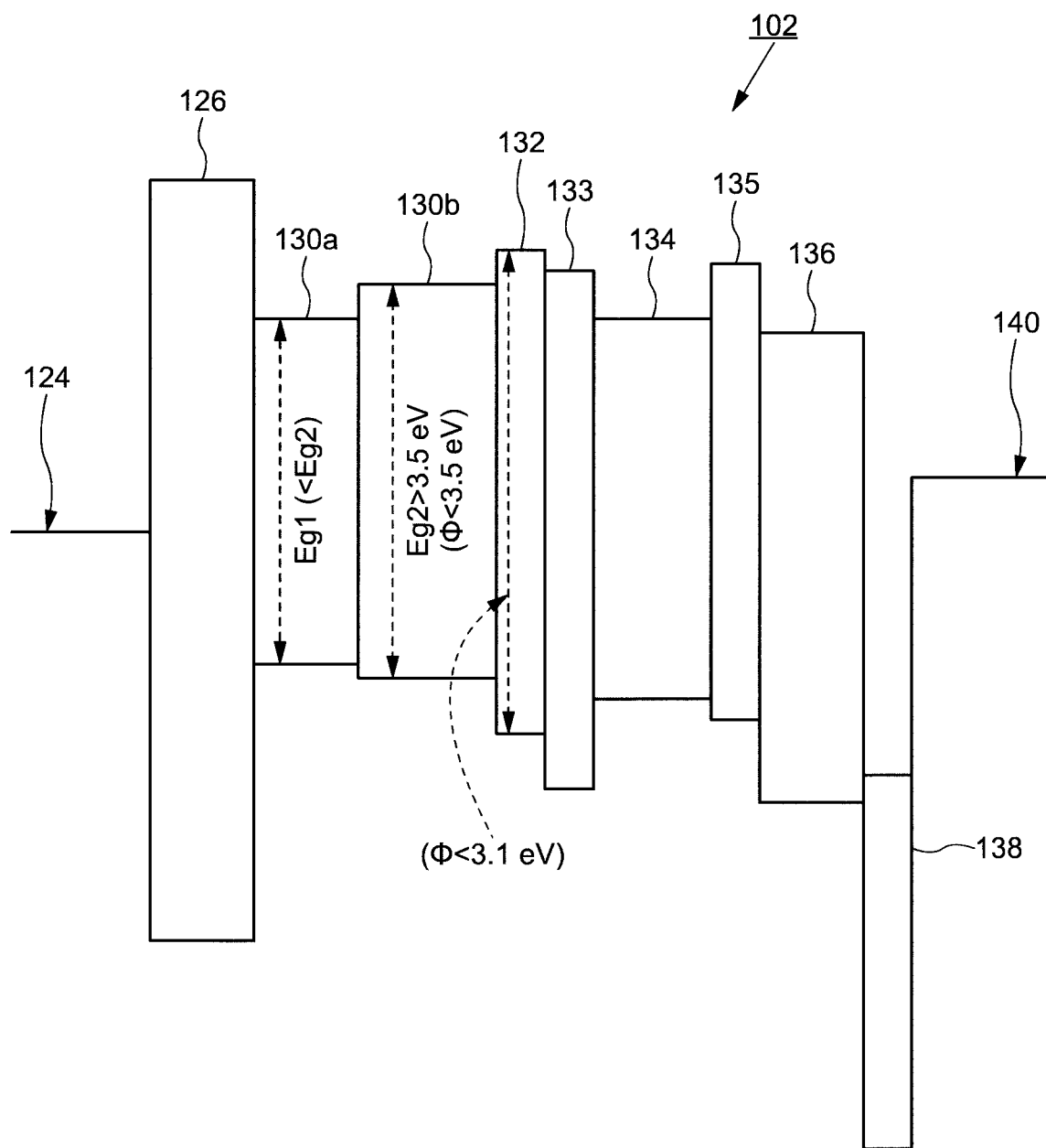
FIG. 6 shows an energy band structure of an EL element usable in the EL display device according to an embodiment of the present invention.

FIG. 6 shows an example of energy band structure of the EL element 102. The energy band diagram shown in FIG. 6 is of a structure in which the first electrode 124, the first insulating layer 126, the first electron transfer layer 130a, the second electron transfer layer 130b, the electron injection layer 132, a hole blocking layer 133, the light emitting layer 134, an electron blocking layer 135, the hole transfer layer 136, the hole injection layer 138 and the third electrode 140 are stacked from the left. In the energy band diagram shown in FIG. 6, the second electrode 128 is omitted.

The energy band diagram shown in FIG. 6 is of a case where the first electrode 124 is formed of a transparent conductive film of indium tin oxide (ITO) or the like, the third electrode 140 is formed of a metal film of aluminum or the like, and the first electron transfer layer 130a and the second electron transfer layer 130b are formed of an oxide semiconductor. The oxide semiconductor forming the first electron transfer layer 130a and the oxide semiconductor forming the second electron transfer layer 130b have different compositions from each other, and the second electron transfer layer 130b has a bandgap (Eg2) of a value larger than that of a bandgap (Eg1) of the first electron transfer layer 130a. The second electron transfer layer 130b has a thickness greater than that of the first electron transfer layer 130a. On the basis of the vacuum level, the second electron transfer layer 130b has a lowest unoccupied molecular orbital (LUMO) shallower than that of the first electron transfer layer 130a.

While the EL element 102 is biased forward, the electrons injected from the second electrode 128 (not shown) into the first electron transfer layer 130a are drifted toward the light emitting layer 134, whereas the holes injected from the third electrode 140 into the hole injection layer 138 are drifted toward the light emitting layer 134. The energy level of the lowest unoccupied molecular orbital (LUMO) of the electron blocking layer 135 provided adjacent to the light emitting layer 134 is shallower than the energy level of the lowest unoccupied molecular orbital (LUMO) of the light emitting layer 134, and thus the electrons injected into the light emitting layer 134 are prevented from running through the electron blocking layer 135 toward the hole transfer layer 136. The energy level of the lowest unoccupied molecular orbital (LUMO) of the hole blocking layer 133 provided adjacent to the light emitting layer 134 is deeper than the energy level of the lowest unoccupied molecular orbital (LUMO) of the light emitting layer 134, and thus the holes injected into the light emitting layer 134 are prevented from running through the hole blocking layer 133 toward the electron injection layer 132.

1-2-3. Light Emitting Region of the EL Element

Figure 7:
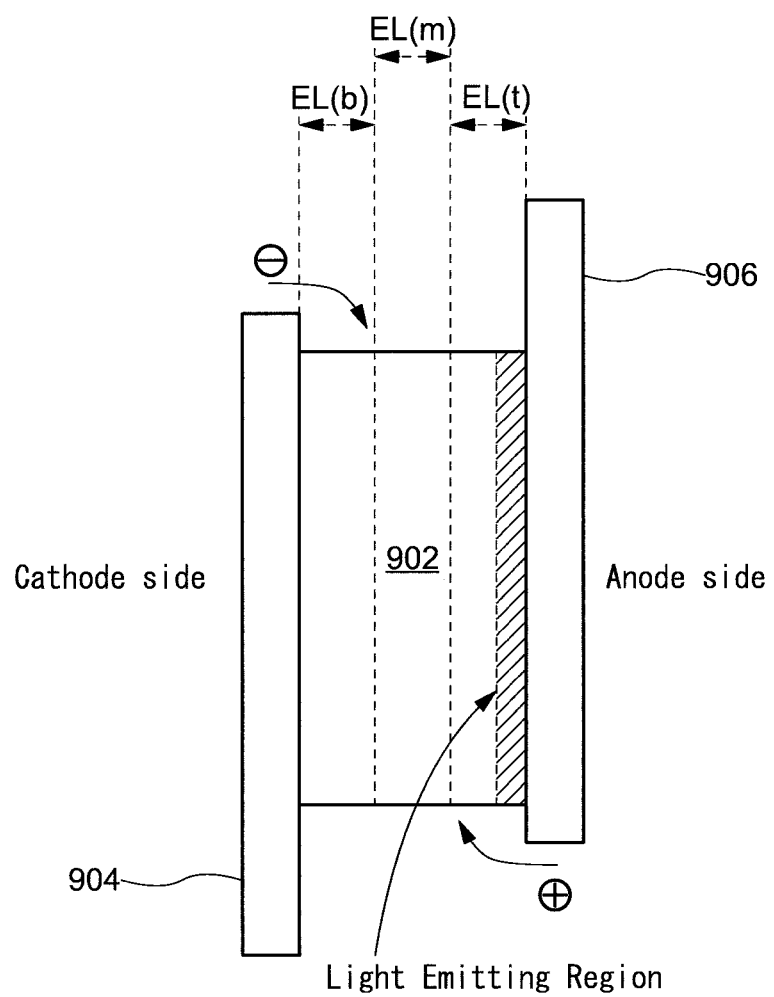
FIG. 7 shows an energy band structure of a light emitting layer, an electron blocking layer and a hole blocking layer of the EL element.

FIG. 7 shows an example of energy band structure of a light emitting layer 902, a hole blocking layer 904 provided on the negative electrode side of the light emitting layer 902 and an electron blocking layer 906 provided on the positive electrode side of the light emitting layer 902. The EL element emits light by the electrons and the holes being recombined in the light emitting layer 902. Specifically, the electrons and the holes are recombined in the light emitting layer 902 to generate excitons, and the generated excitons are subjected to radiative deactivation to emit light. In order to increase the current efficiency (light emission efficiency), it is ideal that the electrons and the holes are distributed uniformly to emit light in the entirety of the light emitting layer 902. A reason for this is that light emission occurring in the entirety of the light emitting layer 902 is expected to increase the current efficiency (light emission efficiency). In actuality, it is analyzed that a region that actually emits light in the light emitting layer 902 has a thickness of about 10 nm. However, if the light emitting layer 902 is formed to have a thickness of 10 nm, the current efficiency (light emission efficiency) is decreased. Therefore, the light emitting layer 902 is practically formed to have a thickness of about 30 nm to about 50 nm.

As shown in FIG. 7, it is expected to increase the probability of recombination by holding the light emitting layer 902 between the electron blocking layer 906 and the hole blocking layer 904 and confining the electrons and the holes in the light emitting layer 902. However, the mobility of the electrons and the holes in the light emitting layer 902 is as small as about $10^{-5}$ cm$^{-2}$/V·sec to about $10^{-2}$ cm$^2$/V·sec. In addition, the mobility of the holes is several to several ten times larger than the mobility of the electrons, and therefore, the distribution of the electrons and the holes is non-uniform in the light emitting layer 902. For this reason, the carrier balance (balance between the electrons and the holes) is destroyed in the light emitting layer 902, and as a result, the current efficiency (light emission efficiency) is decreased. When the carrier balance is destroyed and the number of the holes becomes excessive in the light emitting layer 902, the holes are accumulated on the negative electrode side of the light emitting layer 902, and as a result, the current efficiency (light emission efficiency) is decreased. It is conceivable to inject an excessive number of electrons into the light emitting layer 902 so as to prevent the accumulation of an excessive number of holes. However, if the light emission is stopped in the state where the electrons remain in the light emitting layer 902, the light emitting layer 902 is oxidized and progressively deteriorated.

In order to prevent the deterioration of the EL element, the balance of the electrons and the holes injected into the light emitting layer needs to be controlled. Namely, if the balance between the amounts of the carriers to be injected is controlled, the decrease in the current efficiency (light emission efficiency) is prevented. Although the element structure of the EL element may be adjusted to temporarily control the carrier balance, there is a problem that the element structure, once determined, cannot be changed in accordance with the deterioration of the EL element or the temperature change. Therefore, regarding the conventional EL element, it is theoretically considered to be difficult to use the entirety of the light emitting layer to emit light even though the element structure is optimized.

For an EL element that emits light of a blue wavelength region, the element structure is designed such that the amount of the electrons injected into the light emitting layer is larger than the amount of the holes injected into the light emitting layer, with a material having an electron mobility higher than a hole mobility being selected as a host material of the light emitting layer. Therefore, as shown in FIG. 7, the light emitting layer 902 has light emission positions (positions in a thickness direction) that are concentrated in the vicinity of the border with the light blocking layer 906. In this case, even if the value of the current flowing in the EL element is small, the exciton formation concentration may be increased in a region of the light emitting layer 902 that is in the vicinity of the border with the light blocking layer 906. As a result, the TTF (Triplet-Triplet Fusion) phenomenon that a singlet exciton is generated by fusion of two triplet excitons may be expressed to increase the light emission efficiency. As shown in FIG. 7, in the structure of the conventional two-terminal diode-type EL element, the light emission positions in the light emitting layer 902 (position in the thickness direction) are concentrated in the vicinity of the border with the light blocking layer 906 in any of a low current region, a medium current region and a high current region. In this case, the excitons generated in the light emitting layer 902 are diffused into the light blocking layer 906, and the deterioration of the light blocking layer 906 is promoted. Namely, the structure of the conventional EL element has a problem that the light emission positions in the light emitting layer 902 (position in the thickness direction) are fixed and thus cannot be controlled.

1-2-4. Control on the Carrier Balance and Control on the Light Emission Positions In order to increase the current efficiency (light emission efficiency) of the EL element and to suppress the deterioration in the luminance of the EL element, it is preferred to control the amounts of the electrons and the holes to be injected into the light emitting layer to realize a good balance therebetween. The EL element 102 according to this embodiment may directly control, by the first electrode 124, the amount of the electrons to be injected into the light emitting layer 134. The EL element 102 may control, by the first electrode 124, the amount of the electrodes to be transferred, such that the amount of the electrons to be transferred from the second electrode 128 to the light emitting layer 134 is not insufficient as compared with the amount of the holes to be transferred from the third electrode 140 to the light emitting layer 134. In this manner, the EL element 102 may control the such that the amount of the holes is not excessive in the light emitting layer 134 or such that the amount of the electrons is not insufficient in the light emitting layer 134. In other words, the EL element 102 controls, by the first electrode 124, the electron current such that the magnitude of the electron current flowing from the second electrode 128 to the light emitting layer 134 is equal to the magnitude of the hole current flowing from the third electrode 140 to the light emitting layer 134. In this manner, the EL element 102 controls the carrier balance in the light emitting layer 134.

Figure 8:
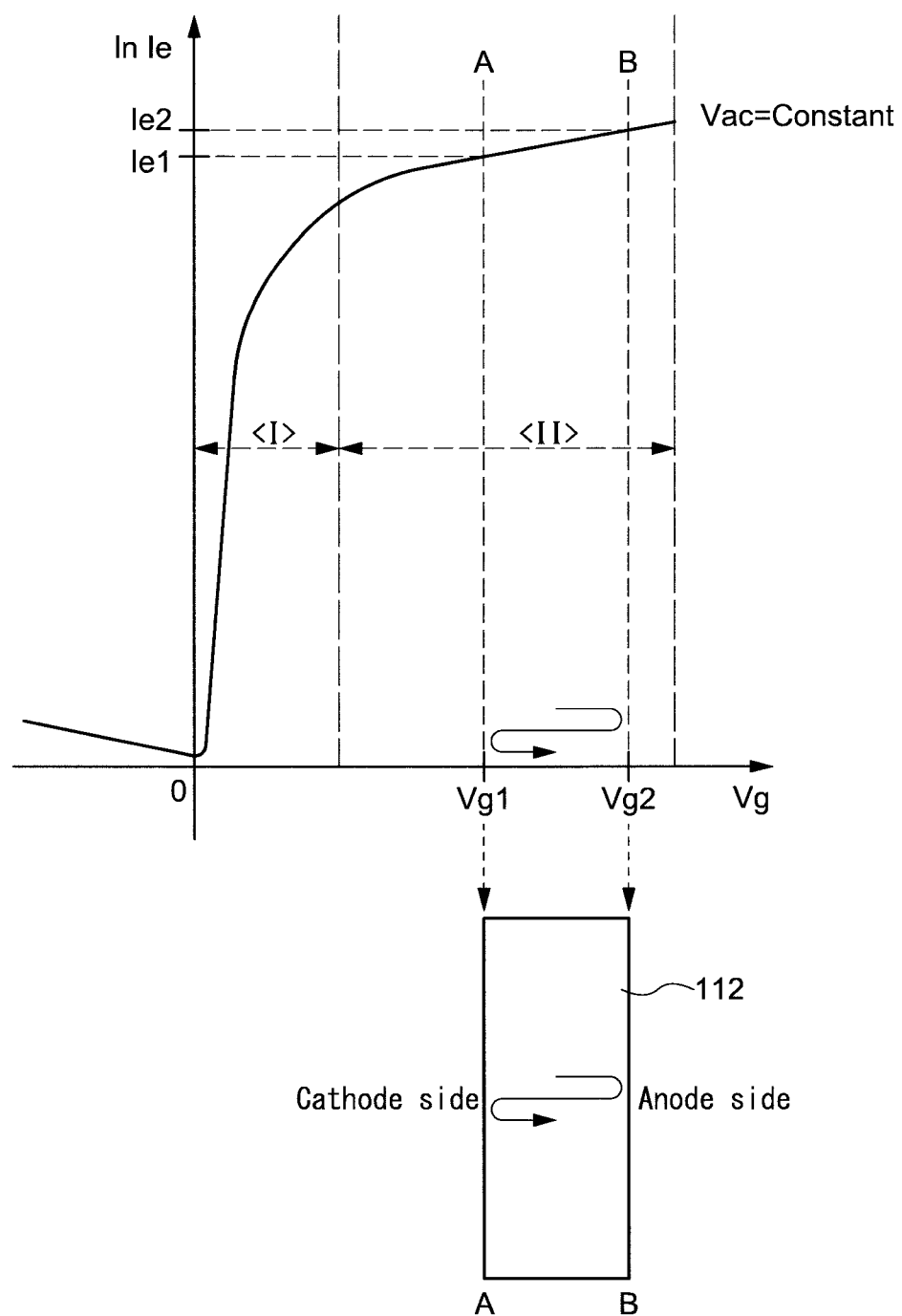
FIG. 8 schematically shows a current vs. voltage characteristic of an EL element usable in the EL display device according to an embodiment of the present invention.

FIG. 8 is a graph, regarding the EL element 102, schematically showing the relationship between the voltage (Vg) applied to the first electrode 124 and the current (Ie) flowing between the third electrode 140 and the second electrode 128, with the voltage (Vac) applied between the third electrode 140 and the second electrode 128 being constant. As shown in FIG. 8, when the voltage (Vg) applied to the first electrode 124 is 0 V, the magnitude of the current (Ie) is small and the light emission of the EL element 102 is not observed. When the voltage applied to the first electrode 124 is increased from this state in the positive direction, the carriers (electrons) injected from the second electrode 128 into the electron transfer layer 130 form a current flowing toward the light emitting layer 134. At this point, the current (Ie) is exponentially increased like the forward current of a diode ("I region" shown in FIG. 8).

When the voltage (Vg) applied to the first electrode 124 is further increased, the amount of increase in the current (Ie) as compared with the amount of change in the voltage (Vg) tends to be saturated, and the gradient of the Ie vs. Vg characteristic curve becomes mild ("II region" shown in FIG. 8). In the II region, when the level of the voltage (Vg) applied to the first electrode 124 is changed between a first voltage (Vg1) and a second voltage (Vg2), the magnitude of the current (Ie) is changed between a first current (Ie1) and a second current (Ie2). A region where the voltage (Vg) of the first electrode 124 is changed between the first voltage (Vg1) and the second voltage (Vg2) is a region where the magnitude of the current (Ie) is not rapidly changed, and is a region where the light emission intensity of the EL element 102 is becoming saturated.

The change in the magnitude of the current (Ie) flowing in the EL element 102 indicates an increase or a decrease in the amount of the electrons injected into the light emitting layer 134. When the voltage (Vg) of the first electrode 124 is changed between the first voltage (Vg1) and the second voltage (Vg2), the amount of the electrons injected into the light emitting layer 134 is changed. Namely, the carrier balance between the electrons and the holes in the light emitting layer 134 may be controlled by changing the voltage (Vg) of the first electrode 124. When the amount of the electrons to be injected into the light emitting layer 134 is changed, the central position of the region where the electrons and the holes are recombined (position in the light emitting region in the thickness direction of the light emitting layer 134) may be shifted. For example, when the first electrode 124 has the first voltage (Vg1), the magnitude of the electron current is relatively small as compared with the magnitude of the hole current, and the light emission positions in the light emitting layer 134 are on the negative electrode side ("A" side in FIG. 8). By contrast, when the first electrode 124 has the second voltage (Vg2), the magnitude of the electron current is relatively large as compared with the magnitude of the hole current, and the light emission positions in the light emitting layer 134 are shifted to the positive electrode side ("B" side in FIG. 8).

As described above, the EL element 102 may control, by the voltage of the first electrode 124, the light emission positions, in the thickness direction, in the light emitting layer 134. For example, when the voltage of the first electrode 124 is changed between the first voltage (Vg1) and the second voltage (Vg2), the light emission positions in the light emitting layer 134 may be moved between the negative electrode side A and the positive electrode side B. The entirety of the light emitting layer 134 may be used as the light emitting region by controlling the voltage of the first electrode 124. Since the entirety of the light emitting layer 134 is used as the light emitting region, the life until the luminance is deteriorated (e.g., time until the luminance is decreased to 70% of the initial luminance) may be extended. The voltage of the first electrode 124 may be changed between Vg1 and Vg2 shown in FIG. 8, and the level of the luminance may be controlled by the potential difference (voltage) between the second electrode 128 and the third electrode 140.

As described above, in the EL element 102 according to this embodiment, the first electrode 124 controlling the amount of the carriers to be injected is located to face the electron transfer layer 130 with the first insulating layer 126 being located between the first electrode 124 and the electron transfer layer 130, and the first electrode 124 is located also to face the third electrode 140, which is the positive electrode. With such a structure, the EL element 102 may control the amount of the electrons to be injected into the light emitting layer 134. The EL element 102 according to this embodiment may control the carrier balance between the electrons and the holes in the light emitting layer 134 by the action of the first electrode 124 controlling the amount of the carriers to be injected. In this manner, the EL element 102 may increase the current efficiency thereof and extend the life thereof.

By contrast, in the EL element disclosed in Japanese Laid-Open Patent Publication No. 2002-343578, the light emitting material layer has a low electron mobility. Therefore, the amount of the electrons to be injected from the negative electrode is substantially determined by the potential difference between the positive electrode and the negative electrode, and the bias voltage applied by the auxiliary electrode does not influence the carrier injection almost at all. For this reason, the EL element disclosed in Japanese Laid-Open Patent Publication No. 2002-343578, even if used in a pixel in a display device, does not emit light uniformly in the pixel plane. In the light emitting transistor disclosed in WO2007/043697, the auxiliary electrode controls the light emission/light non-emission state. Therefore, the amounts of the electrons and the holes to be injected into the light emitting layer cannot be controlled independently. In addition, the light emitting transistor disclosed in WO2007/043697 cannot control the position of the region where the electrons and the holes are recombined in the light emitting layer, namely, the position of the light emitting region. In the organic light emitting transistor disclosed in each of Japanese Laid-Open Patent Publication No. 2007-149922 and Japanese Laid-Open Patent Publication No. 2007-157871, the electron transfer layer formed of an organic material has a low carrier (electron) mobility. Therefore, the display screen cannot be large or of high definition. The electron transfer layer formed of an organic material as described in each of Japanese Laid-Open Patent Publication No. 2007-149922 and Japanese Laid-Open Patent Publication No. 2007-157871 has a carrier (electron) mobility of 2.5 $cm^2/V \cdot sec$ or lower. For this reason, it is considered to be difficult to make the display panel large or of high definition.

In addition, in the structure of the conventional EL element, the light emitting layer is not entirely deteriorated uniformly in the thickness direction, but is deteriorated non-uniformly. Therefore, it is difficult to suppress the deterioration in the luminance, and thus the life of the EL element cannot be extended. By contrast, the EL element 102 according to this embodiment allows the entirety of the light emitting layer 134 to act as the light emitting region by controlling the voltage of the first electrode 124, and therefore, may extend the life until the luminance is deteriorated as compared with the conventional EL element. Even if the thickness of the light emitting layer 134 is increased to 45 nm to 90 nm, which is 1.5 times to 3 times the thickness of the conventional EL element (e.g., 30 nm), the entirety of the light emitting layer 134 in the thickness direction may emit light, and the life of the EL element 102 may be extended.

2. Display Device Including the EL Element

A display device including the EL element has a use such as a TV, a mobile information terminal (e.g., a mobile phone including an internet-connectable OS (operating system) called a "smartphone") or the like. Hereinafter, an example of display device including the EL element 102a of the bottom-emission type shown in FIG. 1 or the EL element 102b of the top-emission type shown in FIG. 2 will be described.

2-1. Circuit Configuration of the Display Device Including the EL Element (EL Display Device)

Figure 9:
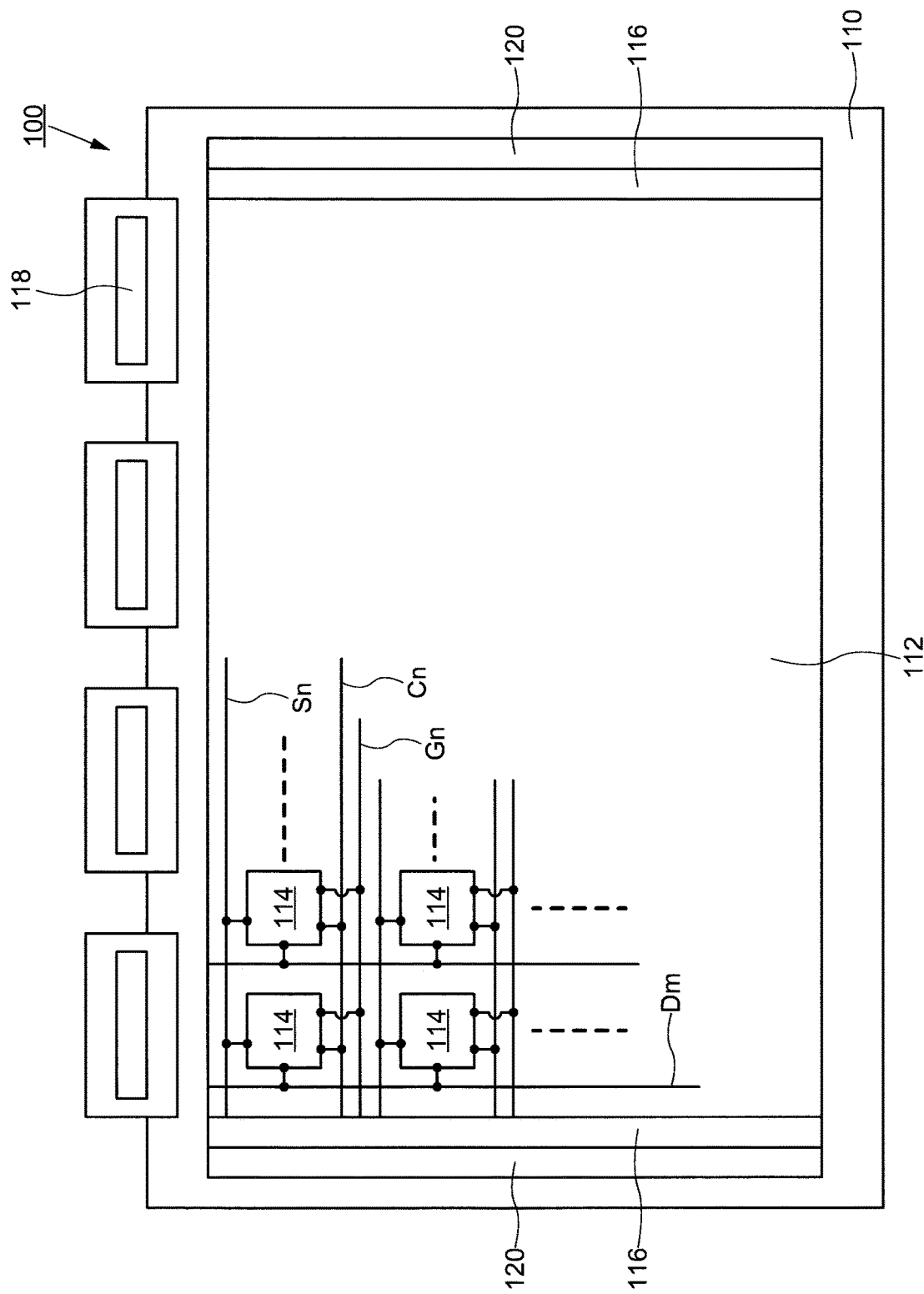
FIG. 9 shows a structure of the EL display device according to an embodiment of the present invention.

FIG. 9 shows a structure of an EL display device 100 according to an embodiment of the present invention. The EL display device 100 includes the substrate 110, and also includes a display 112 including an array of a plurality of pixels 114, a scanning signal line driving circuit block 116 outputting a scanning signal to scanning signal lines Sn, a data driver IC 118 outputting a data signal to data signal lines Dm, and a carrier injection amount control signal line driving circuit block 120 outputting a control signal to the carrier injection amount control signal lines Gn, which are provided on the substrate 110.

The display 112 includes the scanning signal lines Sn, the data signal lines Dm, the carrier injection amount control signal lines Gn and common lines Cn provided therein. The plurality of pixels 114 is each electrically connected with one of the scanning signal lines Sn, one of the data signal lines Dm, one of the carrier injection amount control signal lines Gn and one of the common lines Cn. Although not shown in detail in FIG. 9, the plurality of pixels 114 each include an EL element and a transistor controlling the light emission of the EL element. As shown in FIG. 1 and FIG. 2, the EL element is a three-terminal element including the first electrode (carrier injection amount control electrode) 124, the second electrode (negative electrode) 128 and the third electrode (positive electrode) 140.

2-1-1. Equivalent Circuit of the Pixel

Figure 10:
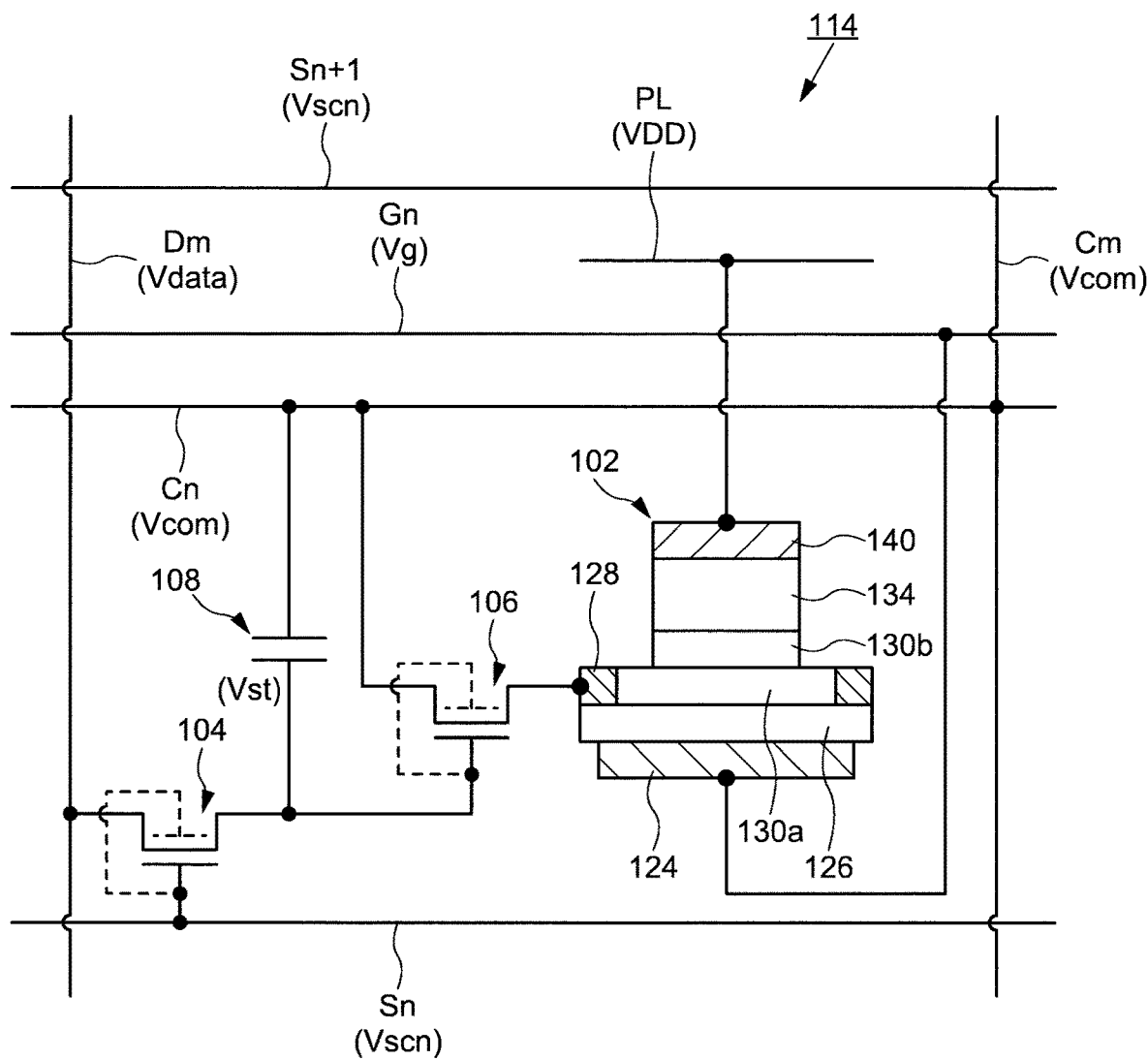
FIG. 10 shows an equivalent circuit of a pixel of the EL display device according to an embodiment of the present invention.

FIG. 10 shows an example of equivalent circuit of the pixel 114. The pixel 114 includes the EL element 102, a selection transistor 104, the driving transistor 106, and the capacitive element 108. FIG. 10 schematically shows the positional arrangement of the electrodes instead of using circuit symbols, in order to show the connection structure of the EL element 102. FIG. 10 schematically shows the structure of the EL element 102 as a stack of the first electrode 124, the second electrode 128, the third electrode 140, and also the first insulating layer 126, the electron transfer layer 130 (the first electron transfer layer 130a and the second first electron transfer layer 130b) and the light emitting layer 134 between the first electrode 124 and the third electrode 140.

The selection transistor 104 includes a gate electrically connected with the scanning signal line Sn, a source electrically connected with the data signal line Dm and a drain electrically connected with a gate of the driving transistor 106. The driving transistor 106 includes a source electrically connected with the common line Cn and a drain electrically connected with the second electrode 128 of the EL element 102. The capacitive element 108 is electrically connected between the gate of the driving transistor 106 and the common line Cn. Regarding the EL element 102, the first electrode 124 is connected with the carrier injection amount control signal line Gn, the second electrode 128 is connected with the drain of the driving transistor 106, and the third electrode 140 is connected with the power supply line PL. As represented by the dashed line in FIG. 10, the selection transistor 104 and the driving transistor 106 may each have a dual-gate structure. The common line Cn provided parallel to the carrier injection amount control signal line Gn and the scanning signal line Sn may be electrically connected with a common line Cm in a region where the common lines Cn and Cm cross each other. The common line Cm is provided parallel with the data signal line Dm.

The scanning signal line Sn is supplied with a scanning signal controlling the selection transistor 104 to be on or off. The data signal line Dm is supplied with a data signal (video signal). The common lines Cm and Cn are kept at a constant potential (e.g., ground potential). The power supply line PL is supplied with a supply voltage (VDD). The carrier injection amount control signal line Gn is supplied with a carrier injection amount control signal controlling the amount of the carriers to be injected. As described below, the carrier injection amount control signal is not of a constant voltage, but is of a voltage having a level changing along with the time.

Figure 11:
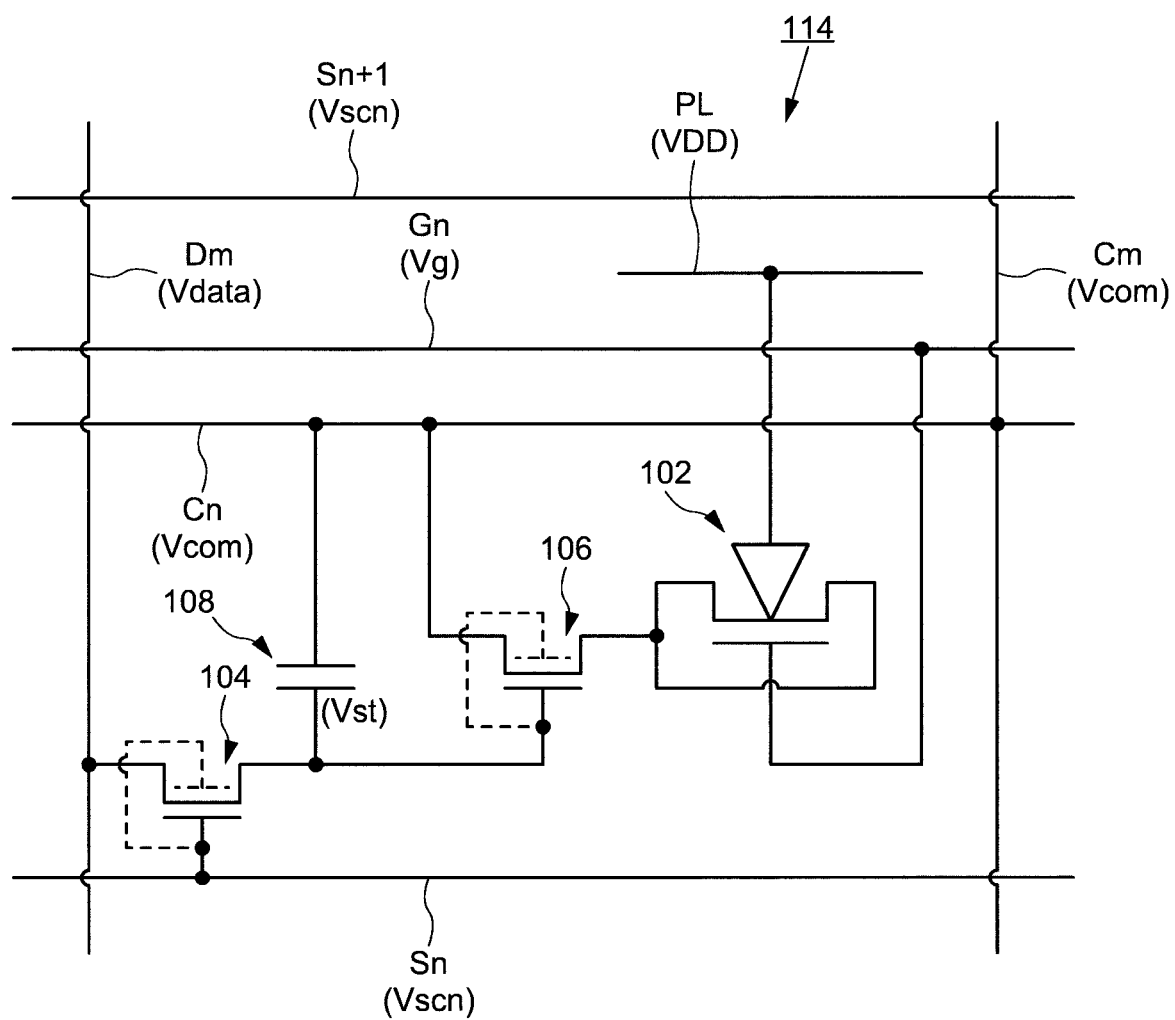
FIG. 11 shows an equivalent circuit of a pixel of the EL display device according to an embodiment of the present invention.

FIG. 11 shows an equivalent circuit of the EL element 102 represented with circuit symbols, and the circuit configuration shown in FIG. 11 is the same as that in FIG. 10. The EL element 102 is a three-terminal element. The second electrode (negative electrode) 128 is connected with the drain of the driving transistor 106, the third electrode (positive electrode) 140 is connected with the power supply line PL, and the first electrode (carrier injection amount control signal) 124 is connected with the carrier injection amount control signal line Gn. The circuit symbols shown in FIG. 11 show that the EL element 102 is a three-terminal element including the first electrode 124, the second electrode 128 and the third electrode 140.

As shown in FIG. 1 and FIG. 2, the EL element 102 includes the offset region 150. The offset region 150 overlaps the first electrode 124 with the first insulating layer 126 being provided between the offset region 150 and the first electrode 124. The amount of the carriers (electrons) flowing in the offset region 150 is controlled by the first electrode 124. Because of such a structure, the EL element 102 may be regarded as including a parasitic transistor, or may be regarded as a composite element of a diode and a transistor. The circuit symbols used for the EL element 102 in FIG. 11 indicate that the EL element 102 has substantially the same structure as that of a transistor.

The equivalent circuit shown in FIG. 10 and FIG. 11 operates as follows. When the gate of the selection transistor 104 is supplied with a scanning signal from the scanning signal line Sn, the selection transistor 104 is turned on, and a voltage based on a data signal is applied to the gate of the driving transistor 106 from the data signal line Dm. The capacitive element 108 is charged with the voltage of the data signal line Dm, and temporarily holds the data signal. When the driving transistor 106 becomes conductive, a current flows from the power supply line PL into the EL element 102. The current to flow into the EL element 102 is controlled by the gate voltage of the driving transistor 106.

The current to flow into the EL element 102 is also controlled by the first electrode 124. The current to flow into the EL element 102 is controlled by the driving transistor 106 and the first electrode 124 independently.

2-1-2. Waveform of the Carrier Injection Amount Control Signal

Figure 12:
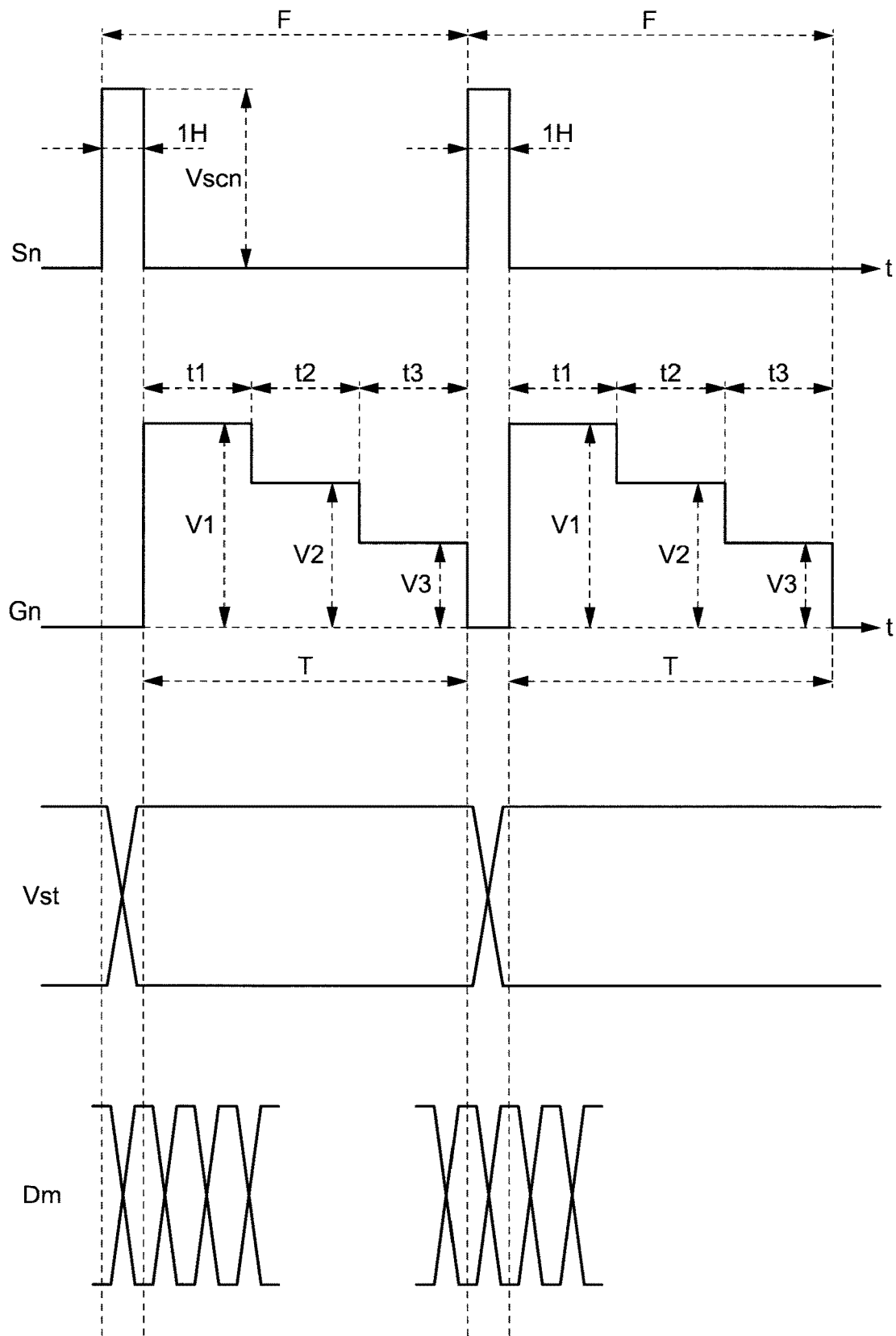
FIG. 12 shows waveforms and timings of signals applied to a scanning signal line and a carrier injection amount control signal line of the EL display device according to an embodiment of the present invention.

FIG. 12 shows an example of voltage waveforms of signals applied to the scanning signal line Sn, the carrier injection amount control signal line Gn and the data signal line Dm and an example of waveform of a voltage Vst of the capacitive element 108. FIG. 12 indicates that one frame period F includes a horizontal period 1H in which the scanning signal line Sn is supplied with a scanning signal and a light emission period T in which the EL element 102 emits light. In the horizontal period 1H, when a scanning signal (Vscn) is applied to the scanning signal line Sn, the selection transistor 104 is turned on, a data signal (data voltage Vdata) is applied from the data signal line Dm to the gate of the driving transistor 106, and at the same time, the capacitive element 108 is charged with the data voltage Vdata. The voltage Vst charging the capacitive element 108 is changed in accordance with the data voltage Vdata. Even after the selection transistor 104 is turned off, the capacitive element 108 is charged with the data voltage Vdata. Therefore, the gate voltage of the driving transistor 106 is maintained.

In the horizontal period 1H, the carrier injection amount control signal line Gn is supplied with a carrier injection amount control signal Vg (Vg=VL=0 V) of a first level. Therefore, even if the gate of the driving transistor 106 is supplied with a data signal (signal of a voltage of a level higher than the level of a threshold voltage of the driving transistor 106) and a forward voltage is applied between the second electrode (negative electrode) 128 and the third electrode (positive electrode) 140 of the EL element 102, the light non-emission state is maintained.

When the horizontal period 1H is finished, the EL element 102 is transited to the light emission period T. During the light emission period T, the carrier injection amount control signal line Gn is supplied with a carrier injection amount control signal Vg having a voltage of a level higher than the first level. As a result of the first electrode (carrier injection amount control electrode) 124 being supplied with the carrier injection amount control signal Vg, the EL element 102 emits light. The voltage of the carrier injection amount control signal Vg may be maintained at a constant level, or may be a modulation voltage, the level of which is changed along with the time as shown in FIG. 12.

The carrier injection amount control signal Vg shown in FIG. 12 has a voltage waveform that is changed from V1 to V2 to V3 as the time elapses from t1 to t2 to t3. The voltages of the carrier injection amount control signal Vg have the relationship of V1>V2>V3, and the relationship of (V1, V2, V3)>VL. Namely, the carrier injection amount control signal Vg has a voltage waveform that decreases in a step-like manner from the first voltage V1 to the second voltage V2 to the third voltage V3 in the light emission period T. The voltage of the carrier injection amount control signal Vg may be changed in this manner, so that the amount of the carriers to be injected into the light emitting layer 134 is controlled and the light emission positions in the light emitting layer 134 are controlled. When the light emission period T is finished, the voltage of the carrier injection amount control signal Vg is changed to the voltage VL of the first level. As a result, the light emission of the EL element 102 is stopped. In this manner, the level of the voltage of the carrier injection amount control signal Vg to be applied to the carrier injection amount control signal line Gn may be controlled, so that the EL element 102 is controlled to be in the light emission state or in the light non-emission state, and the light emission positions in the light emitting layer 134 are controlled.

It is preferred to set the voltage of the carrier injection amount control signal Vg as follows. The voltage V1 is set such that the light emission positions (position in the thickness direction of the light emitting layer 134) of the EL element 102 are in a positive electrode-side light emitting region EL(t), the voltage V2 is set such that the light emission positions are in a central light emitting region EL(m), and the voltage V3 is set such that the light emission positions are in a negative electrode-side light emitting region EL(b). These values of the voltages are examples, and the values of the voltages of the carrier injection amount control signal Vg may be appropriately set in accordance with the structure of the EL element 102.

Figure 13A:
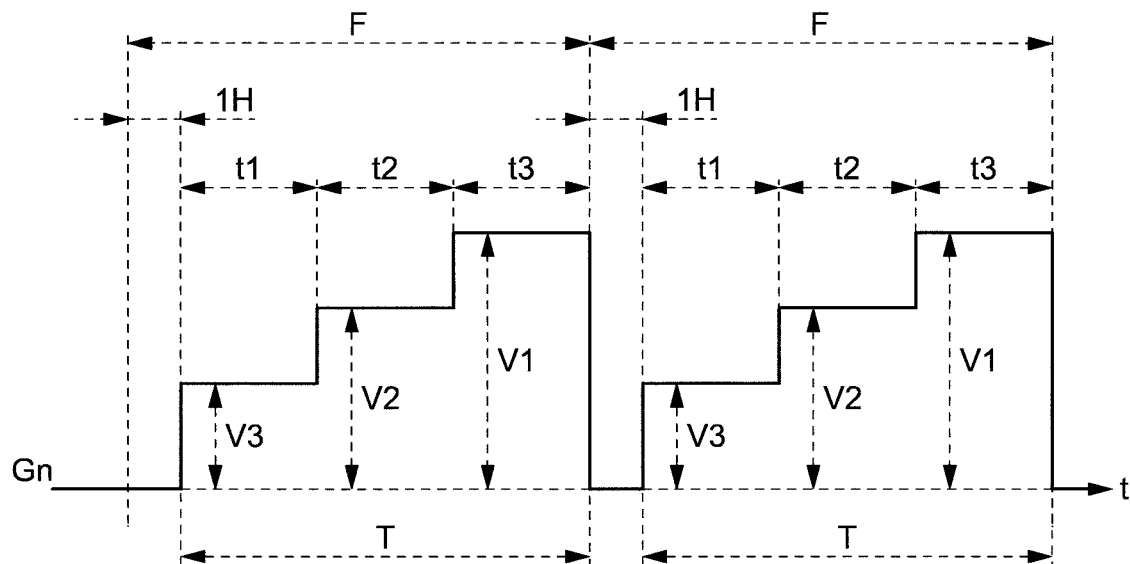
FIG. 13A shows an example of waveform showing that the voltage of a signal applied to the carrier injection amount control signal line of the EL display device according to an embodiment of the present invention increases in a step-like manner.
Figure 13B:
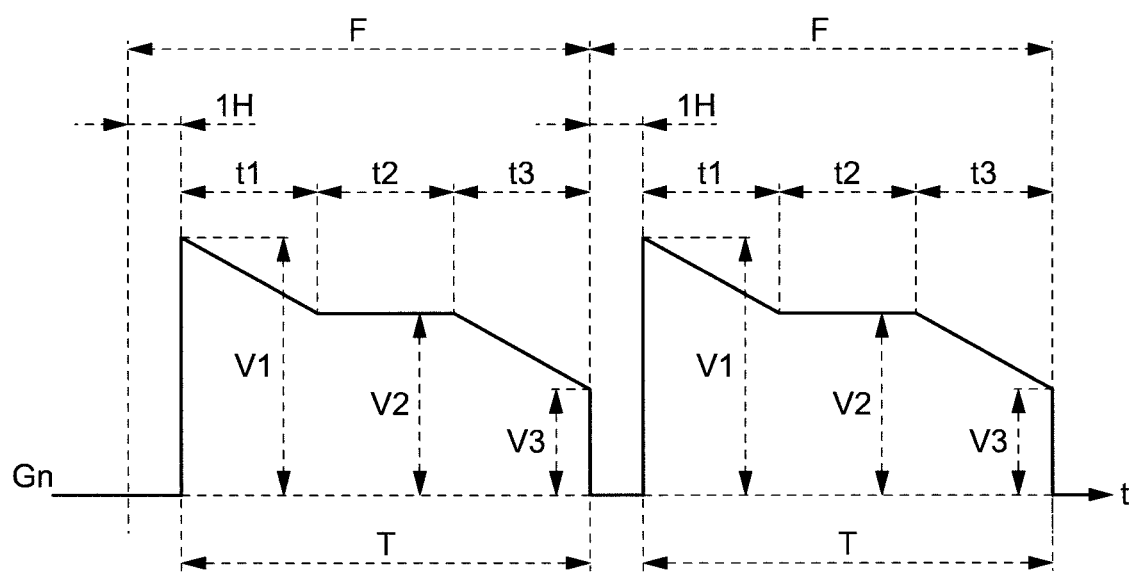
FIG. 13B shows an example of waveform showing that the voltage of a signal applied to the carrier injection amount control signal line of the EL display device according to an embodiment of the present invention has a period in which the voltage is kept at a constant level during a period in which the voltage decreases continuously.
Figure 14A:
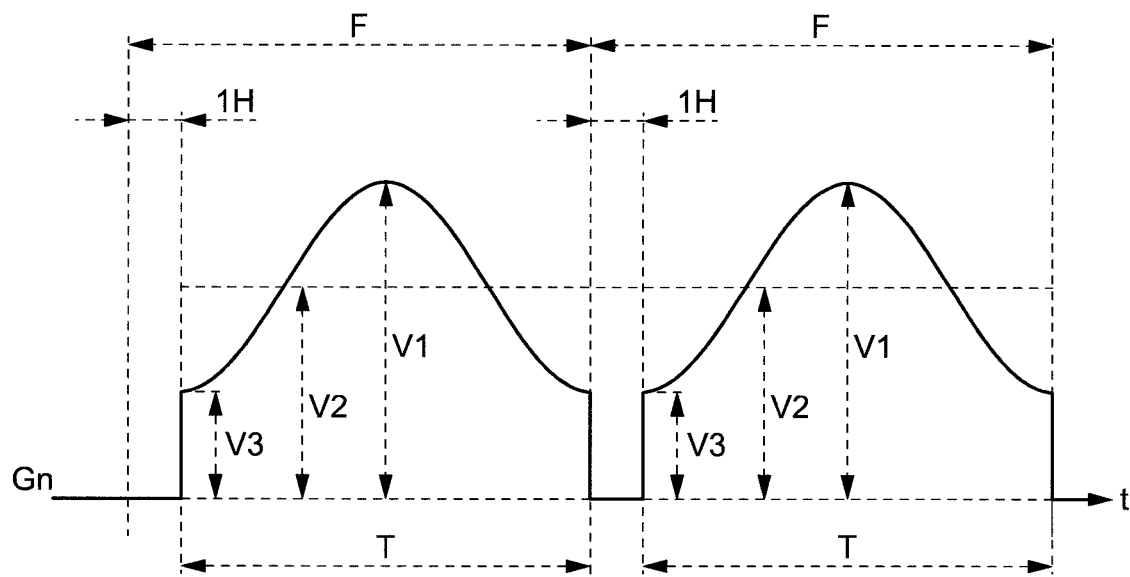
FIG. 14A shows an example of waveform showing that the voltage of a signal applied to the carrier injection amount control signal line of the EL display device according to an embodiment of the present invention increases and then decreases in a sine wave manner.
Figure 14B:
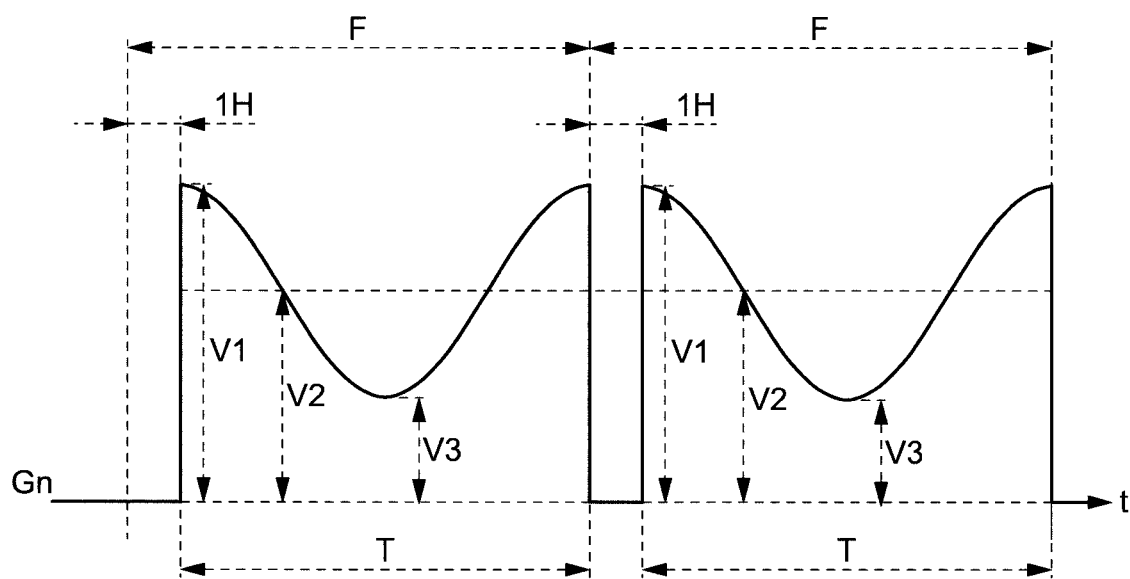
FIG. 14B shows an example of waveform showing that the voltage of a signal applied to the carrier injection amount control signal line of the EL display device according to an embodiment of the present invention decreases and then increases in a sine wave manner.

FIG. 13A, FIG. 13B, FIG. 14A and FIG. 14B show other examples of the voltage waveform of the carrier injection amount control signal Vg. As shown in FIG. 13A, the carrier injection amount control signal Vg may have a voltage waveform that increases in a step-like manner from V3 to V2 to V1 as the time elapses from t1 to t2 to t3 in the light emission period T. As shown in FIG. 13B, the carrier injection amount control signal Vg may have a voltage waveform that continuously changes from V1 to V2 in time period t1 in the light emission period T, is kept at V2 in time period T2, and continuously changes from V2 to V3 in time period T3 (V1>V2>V3). Although not shown, in a modification of FIG. 13, the carrier injection amount control signal Vg may have a voltage waveform that increases from V3 to V1 as the time elapses in the light emission period T. FIG. 14A and FIG. 14B show examples in which the voltage waveform of the carrier injection amount control signal Vg changes in a sine wave manner. FIG. 14A shows a waveform of the voltage Vg of the carrier injection amount control signal that continuously increases from V3 to V2 to V1 and then continuously decreases from V1 to V2 to V3 in the light emission period T. FIG. 14B shows a waveform of the voltage Vg of the carrier injection amount control signal that continuously decreases from V1 to V2 to V3 and then continuously increases from V3 to V2 to V1 in the light emission period T. As can be seen, the voltage waveform of the carrier injection amount control signal Vg may be changed, so that the light emission positions in the light emitting layer 134 are controlled and the state of deterioration is made uniform in the light emitting layer 134.

The EL element, in the case of being formed of a phosphorescent material or a thermally activated delayed fluorescence (TADF) material, emits light in a central region of the light emitting layer 134, instead of in the vicinity of the interface between the light emitting layer 134 and a layer adjacent thereto. In this manner, the light emission efficiency may be increased, and the life until the luminance is deteriorated may be extended. Therefore, the period in which the carrier injection amount control signal Vg of an intermediate voltage level is applied may be extended. For example, in the case of the example of FIG. 12, the time period t2 may be extended (t2≥t1, t3).

For a light emitting layer that emits blue light, a fluorescent material is used as a light emitting material. Therefore, in order to increase the light emission efficiency of the EL element and extend the life thereof, the light emitting region needs to be formed in a concentrated manner in the vicinity of the positive electrode-side interface of the light emitting layer 134 or in the vicinity of the negative electrode-side interface of the light emitting layer 134 to express the TTF phenomenon. Therefore, for a single light emitting layer 134 emitting blue light, it is preferred to extend the time period t1 or the time period t3. In general, the light emission efficiency and the length of the life are superior in the case where the light emission positions (positions in the thickness direction) are concentrated in the vicinity of the positive electrode-side interface of the light emitting layer 134. For this reason, it is preferred to extend the time period t1, in which the voltage V1, at which the amount of the electrons to be injected may be maximized, is applied.

Figure 15A:
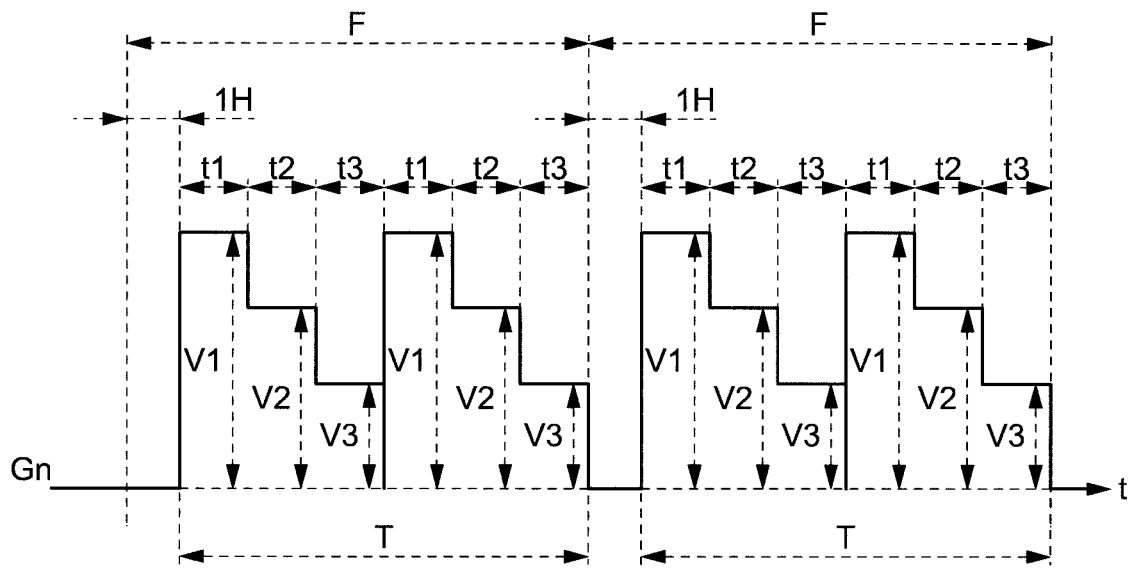
FIG. 15A shows an example of waveform showing that the voltage of a signal applied to the carrier injection amount control signal line of the EL display device according to an embodiment of the present invention decreases in a step-like manner a plurality of times in one frame period.
Figure 15B:
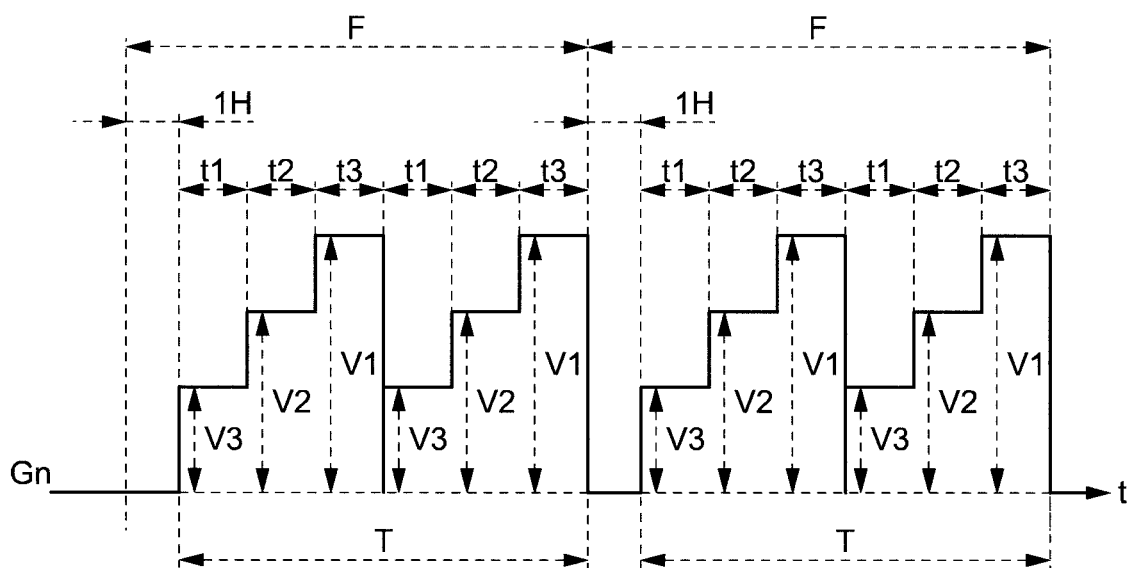
FIG. 15B shows an example of waveform showing that the voltage of a signal applied to the carrier injection amount control signal line of the EL display device according to an embodiment of the present invention increases in a step-like manner a plurality of times in one frame period.
Figure 16A:
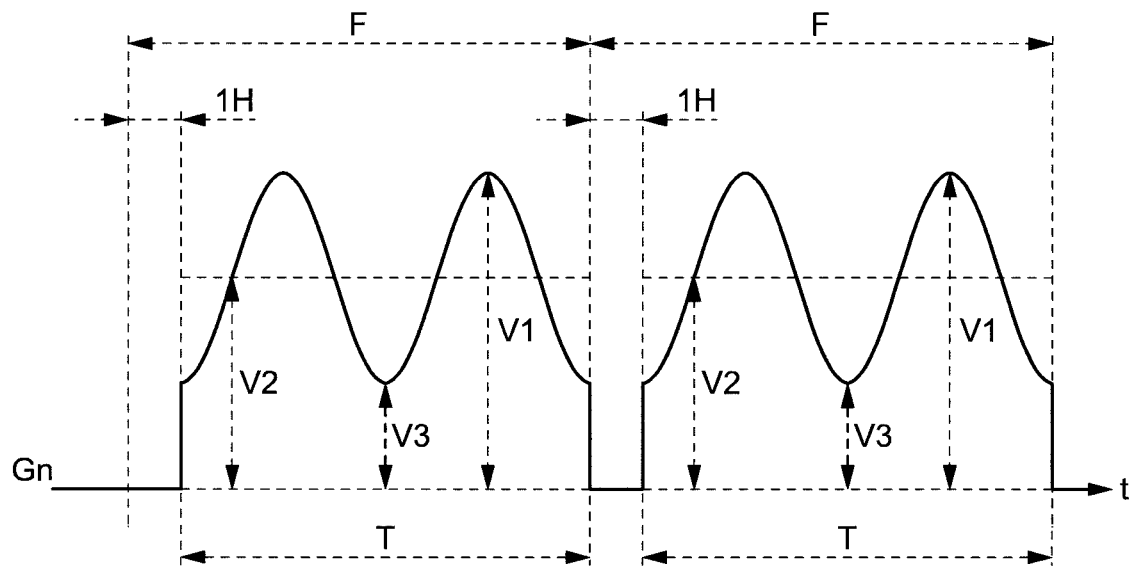
FIG. 16A shows an example of waveform showing that the voltage of a signal applied to the carrier injection amount control signal line of the EL display device according to an embodiment of the present invention increases and then decreases in a sine wave manner a plurality of times in one frame period.
Figure 16B:
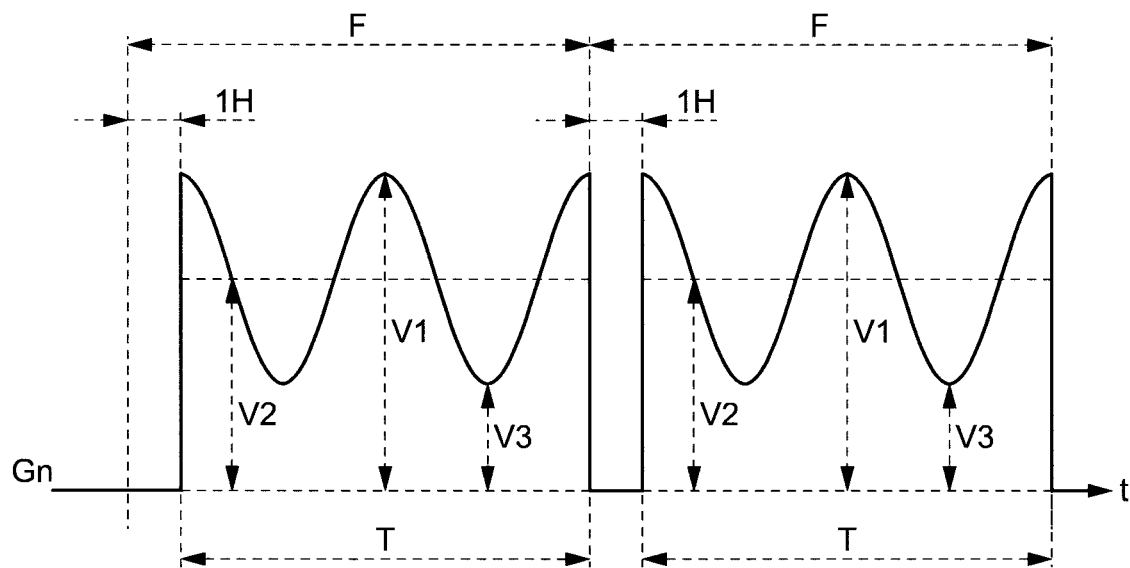
FIG. 16B shows an example of waveform showing that the voltage of a signal applied to the carrier injection amount control signal line of the EL display device according to an embodiment of the present invention decreases and then increases in a sine wave manner a plurality of times in one frame period.

However, if the light emission positions are kept on concentrated only in the vicinity of the positive electrode-side interface of the light emitting layer 134, the deterioration of the electron blocking layer (or the hole transfer layer) adjacent to the light emitting layer 134 is promoted. In order to prevent such deterioration, the EL element 102 according to an embodiment of the present invention may change the voltage of the carrier injection amount control signal Vg to be applied to the first electrode (carrier injection amount control electrode) 124 to move the light emission positions in the light emitting layer 134. Alternatively, the hole blocking layer may be provided at the negative electrode-side interface of the light emitting layer 134, so that the voltage of the carrier injection amount control signal Vg is decreased to move the light emission positions in the light emitting layer 134 to the vicinity of the negative electrode-side (electron transfer layer-side) interface. As a result, the TTF phenomenon may be expressed also in the vicinity of the negative electrode-side (electron transfer layer-side) interface of the light emitting layer 134. Thus, the light emission efficiency of the EL element emitting blue light may be increased in all the current regions, more specifically, the small current region, the medium current region and the large current region. FIG. 12, FIG. 13A and FIG. 13B show an embodiment in which a set of control voltages V1, V2 and V3 are applied in one frame period F. The embodiment of the present invention is not limited to this. As shown in FIG. 15A and FIG. 15B, an application of a set of control voltages V1, V2 and V3 in a step-like manner may be repeated a plurality of times in one frame period F. Alternatively, as shown in FIG. 16A and FIG. 16B, an application of a set of control voltages in a sine wave manner may be repeated a plurality of times in one frame period F. In the case where, for example, the frame frequency is 60 Hz, the maximum possible number of times of repetition may be about 1000 times.

The ratio at which the voltage value of the carrier injection amount control signal Vg is changed may be arbitrarily set. For example, FIG. 12 indicates that the voltage value is changed in three steps. Alternatively, the voltage value may be changed in a larger number of steps. The voltage value of the carrier injection amount control signal Vg may be changed in a large number of steps, so that the light emission positions in the light emitting layer 134 are controlled more precisely. Alternatively, the voltage value of the carrier injection amount control signal Vg may be changed in two steps. In this case, the light emission positions in the light emitting layer 134 may be changed, and also the power consumption of a carrier injection amount control signal line driving circuit may be decreased.

2-1-3. Circuit Configuration of the Display

A circuit configuration of the display 112 of the EL element 102 will be described. The circuit configuration of each of the pixels 114 in the display 112 is equivalent to the equivalent circuit shown in FIG. 11.

2-1-3-1. Circuit Configuration 1 of the Display

Figure 17:
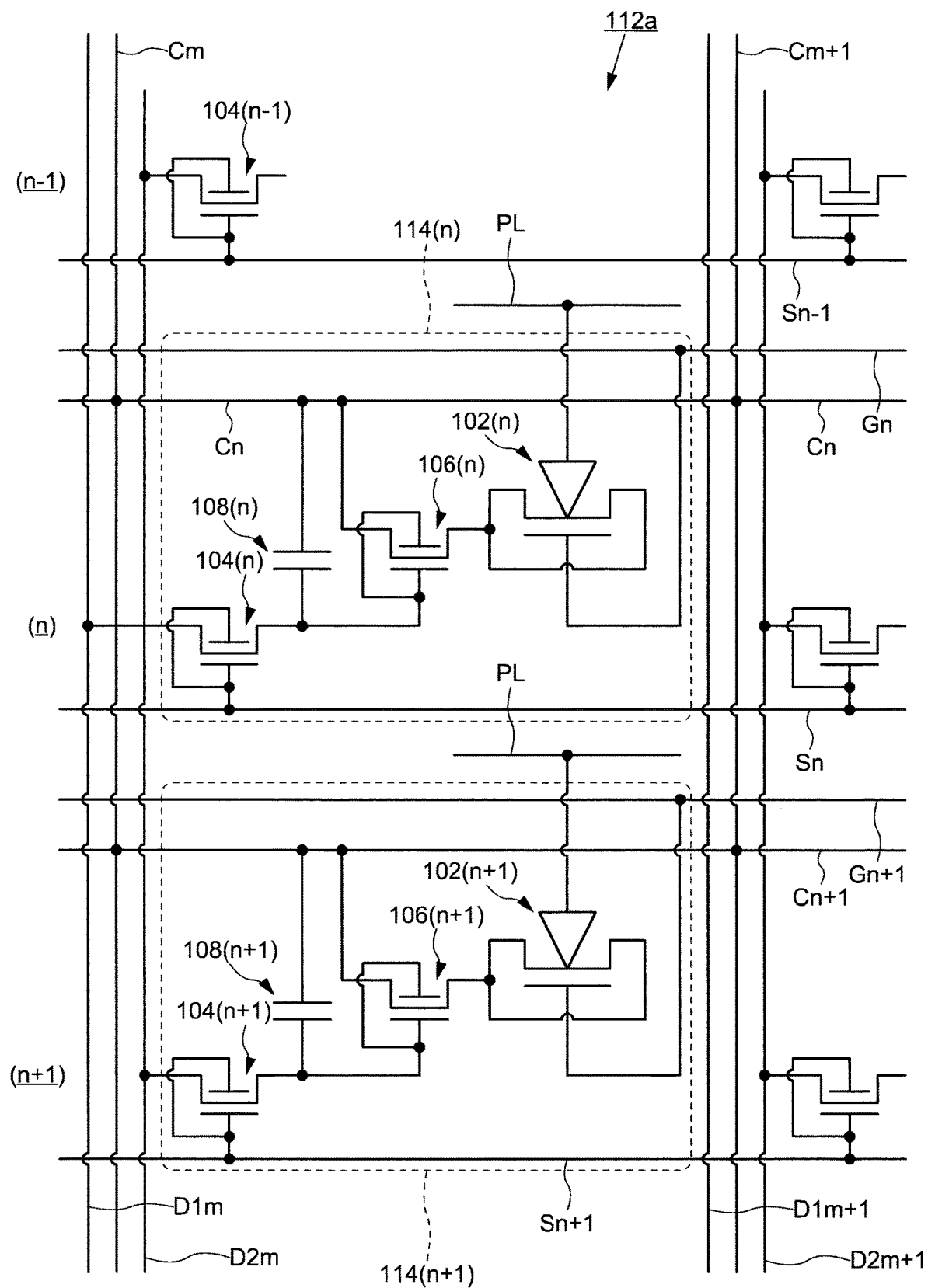
FIG. 17 shows a circuit configuration of a display of the EL display device according to an embodiment of the present invention.

FIG. 17 shows a circuit configuration of a display 112a of the EL display device 100. The display 112a includes the pixels 114 arrayed in a matrix. FIG. 17 shows a first pixel 114(n) located at the n'th row and a certain column and a second pixel 114(n+1) located at the (n+1)'th row and the certain column. The first pixel 114(n) and the second pixel 114(n+1) each have a circuit configuration substantially the same as that of the pixel 114 described above with respect to FIG. 11.

FIG. 17 also shows an embodiment in which scanning signal lines Sn−1, Sn and Sn+1, data signal lines D1m, D1m+1, D2m and D2m+1, common lines Cm, Cm+1, Cn and Cn+1, and carrier injection amount control signal lines Gn and Gn+1 located in the display 112a. The common lines Cm and Cm+1 and the common lines Cn and Cn+1 are located in directions crossing each other, and are electrically connected with each other in an appropriate manner at positions where the common lines cross each other. The pixels 114 are assumed to be arrayed in k rows and j columns. It is also assumed that m=1 to j (m1=1 to 0.5×j, m2=1 to 0.5×j), and that n=1 to k.

The first pixel 114(n) includes a selection transistor 104(n), a driving transistor 106(n), a capacitive element 108(n), and an EL element 102(n). Similarly, the second pixel 114(n+1) includes a selection transistor 104(n+1), a driving transistor 106(n+1), a capacitive element 108(n+1), and an EL element 102(n+1).

The first pixel 114(n) has the following connection structure. The selection transistor 104(n) includes a gate electrically connected with the scanning signal line Sn, a source electrically connected with the data signal line D1m, and a drain electrically connected with a gate of the driving transistor 106(n). The driving transistor 106(n) includes a source electrically connected with the common line Cn and a drain electrically connected with the second electrode (negative electrode) 128 of the EL element 102(n). The capacitive element 108(n) is connected between the gate of the driving transistor 106(n) and the common line Cn. The EL element 102(n) includes the first electrode (carrier injection amount control electrode) 124 electrically connected with the carrier injection amount control signal line Gn and the third electrode (positive electrode) 140 electrically connected with the power supply line PL.

The second pixel 114(n+1) has the following connection structure. The selection transistor 104(n+1) include a gate electrically connected with the scanning signal line Sn+1 and a source electrically connected with the data signal line D2m. The driving transistor 106(n+1) includes a source electrically connected with the common line Cn+1. The capacitive element 108(n+1) is connected between a gate of the driving transistor 106(n+1) and the common line Cn+1. The EL element 102(n+1) includes the first electrode (carrier injection amount control electrode) 124 electrically connected with the carrier injection amount control signal line Gn+1 and the third electrode (positive electrode) 140 electrically connected with the power supply line PL.

In the display 112a, two data signal lines D1m and D2m are arrayed on one column. The selection transistor 104(n) on the n'th row is connected with the data signal line D1m, and the selection transistor 104(n+1) on the (n+1)'th row is connected with the data signal line D2m. Such a circuit configuration allows two pixels to be selected at the same time so that a data signal is written to each of the two pixels.

2-1-3-2. Driving System 1 of the Display

Figure 18:
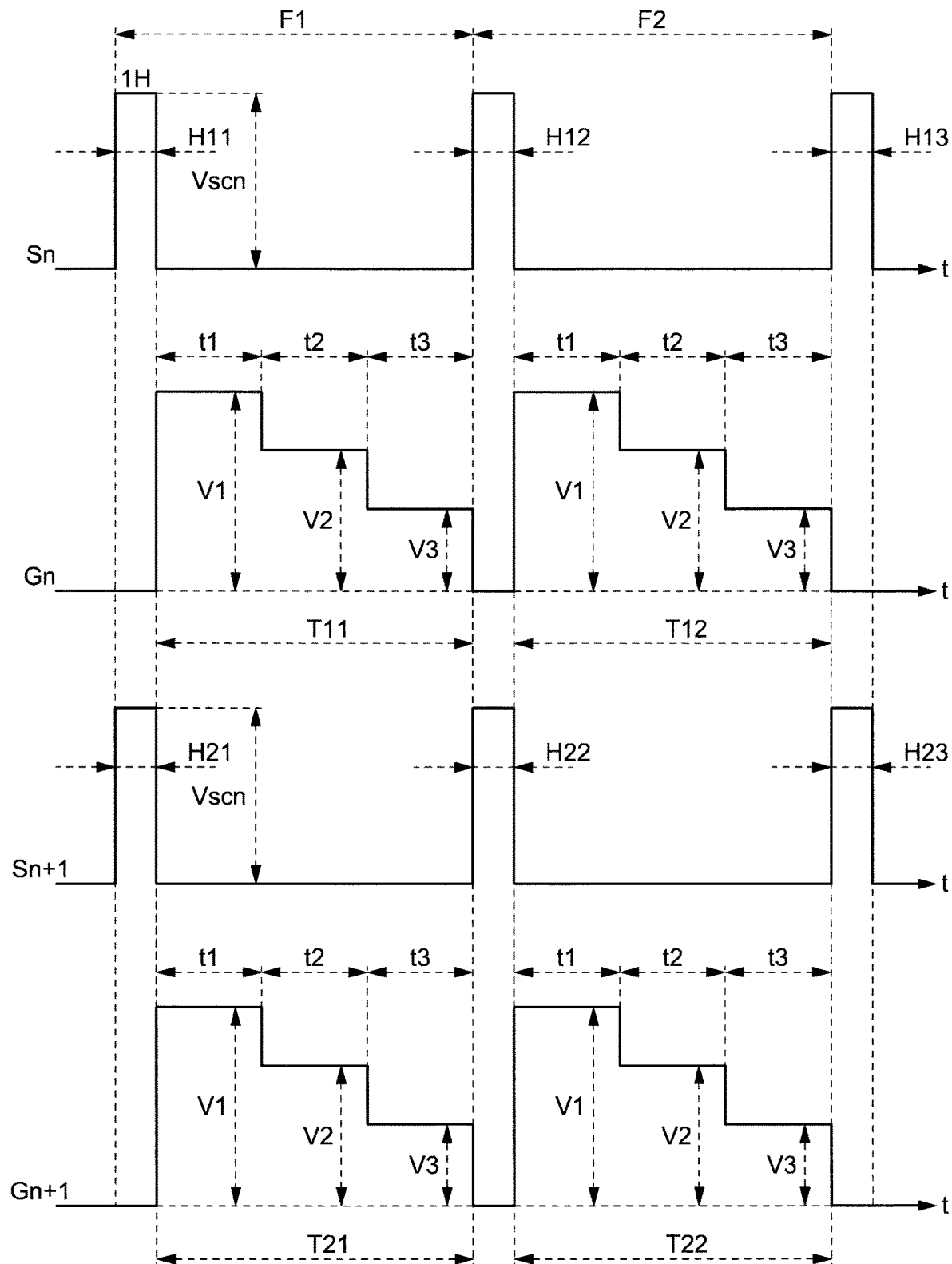
FIG. 18 shows waveforms of signals applied to the scanning signal line and the carrier injection amount control signal line of the EL display device according to an embodiment of the present invention.

FIG. 18 shows an operation of the first pixel 114(n) and the second pixel 114(n+1) shown in FIG. 17. In a certain frame period F1, a data signal is written to the first pixel 114(n) from the data signal line D1m in a horizontal period H11, in which the scanning signal Vscn is applied to the scanning signal line Sn. After the horizontal period H11 is finished, the first pixel 114(n) is transited to a light emission period T11. In the light emission period T11, the first pixel 114(n) is supplied with the carrier injection amount control signal Vg from the carrier injection amount control signal line Gn, and as a result, emits light.

The second pixel 114(n+1) is selected at the same time as the first pixel 114(n). A data signal is written to the second pixel 114(n+1) from the data signal line D2m, and a light emission period T21 is started at the same time as the light emission period T11. Namely, the data signal is written to the second pixel 114(n+1) from the data signal line D2m in a selection period H21, in which the scanning signal Vscn is applied to the scanning signal line Sn+1. After the selection period H21 is finished, the second pixel 114(n+1) is transited to the light emission period T21. In the light emission period T21, the second pixel 114(n+1) is supplied with the carrier injection amount control signal Vg from the carrier injection amount control signal line Gn+1, and as a result, emits light.

The first pixel 114(n) and the second pixel 114(n+1) are generally operated as described above in one frame period F1. Substantially the same operation is performed in the next frame period F2. Namely, the operation in which the first pixel 114(n) is transited to a light emission period T12 after one horizontal period H12 and the second pixel 114(n+1) is transited to a light emission period T22 after a one horizontal period H22 is repeated. Such an operation is performed at the same time in the pixels arrayed in the row direction along the scanning signal lines Sn and Sn+1. In FIG. 18, the carrier injection amount control signals Vg applied to the carrier injection amount control signal lines Gn and Gn+1 have the waveform substantially the same as that shown in FIG. 12. The waveform of the carrier injection amount control signals Vg may be replaced with the waveform shown in FIG. 13A or FIG. 13B.

As shown in FIG. 17, the data signal line D1m and the data signal line D2m may be arrayed on one column, so that two pixels are selected at the same time and the data signal is written to each of the two pixels. With such a structure, even in the case where the number of the horizontal lines (number of the scanning signal lines) is increased, there is a sufficient duration of time in which the data signal is written to each pixel. The carrier injection amount control signal lines are provided respectively for each row as shown as carrier injection amount control signal lines Gn and Gn+1, and therefore, light emission state of the EL elements may be controlled in all the pixels in the display.

FIG. 18 shows an embodiment in which the data signal Vdata is written to two scanning signal lines Sn and Sn+1 at the same time in one horizontal period 1H. Since two scanning signal lines are allowed to be selected at the same time, the period in which the data signal Vdata is written may be extended to two horizontal periods 2H. In this case, there is a sufficient duration of time in which the data signal is written to each pixel.

2-1-3-3. Circuit Configuration 2 of the Display

Figure 19:
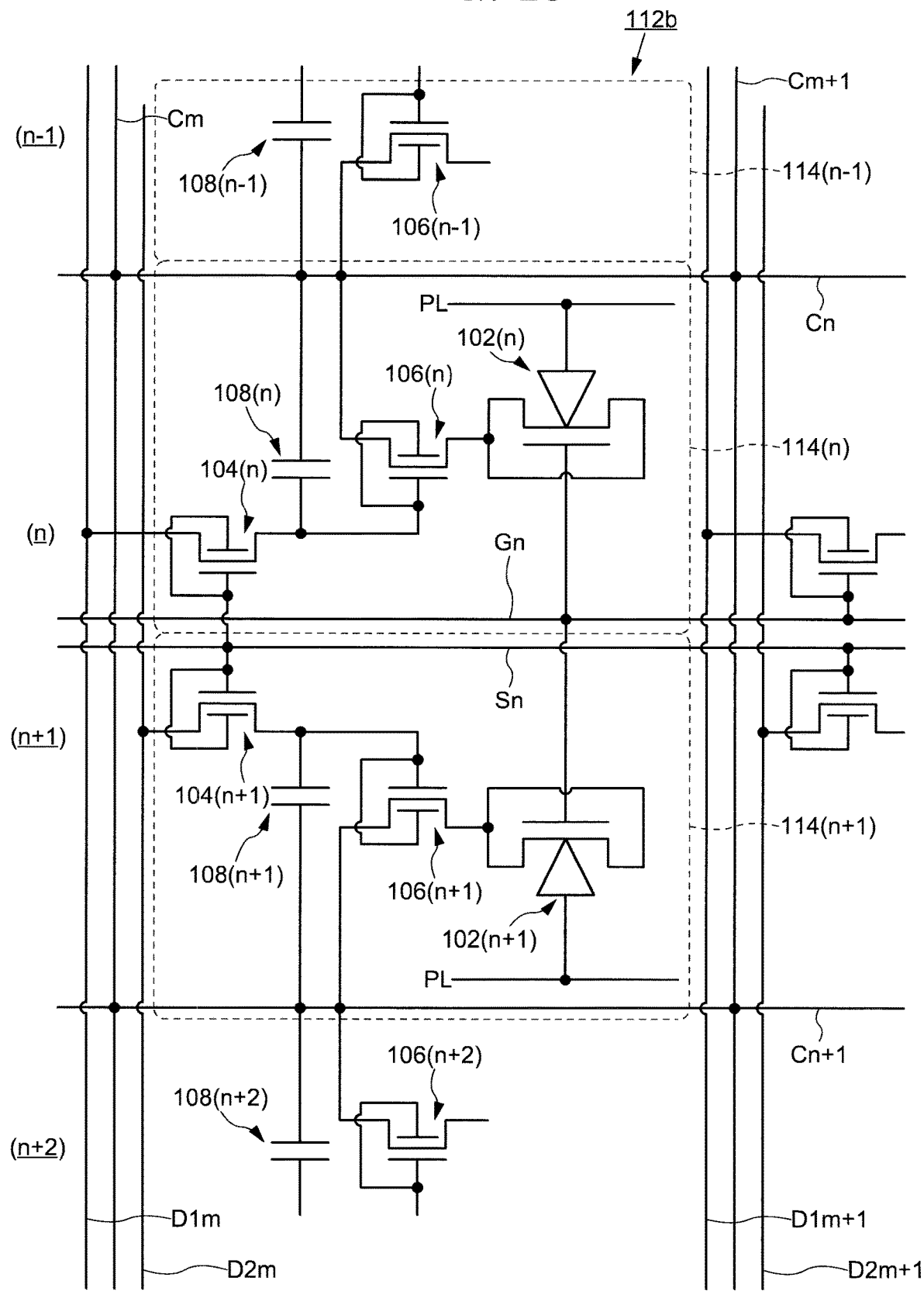
FIG. 19 shows a circuit configuration of a display of the EL display device according to an embodiment of the present invention.

FIG. 19 shows a circuit configuration of a display 112b of the EL display device 100. In the display 112b shown in FIG. 19, the first pixel 114(n) and the second pixel 114(n+1) each have a structure substantially the same as that shown in FIG. 17. The display 112b shown in FIG. 19 is different from the display 112a shown in FIG. 17 in the structures of the scanning signal line Sn, the common line Cn and the carrier injection amount control signal line Gn. Hereinafter, the differences will be described.

The scanning signal line Sn is common to the first pixel 114(n) and the second pixel 114(n+1). Namely, the gate of the selection transistor 104(n) of the first pixel 114(n) and the gate of the selection transistor 104(n+1) of the second pixel 114(n+1) are both connected with the scanning signal line Sn. The carrier injection amount control signal line Gn is common to the first pixel 114(n) and the second pixel 114(n+1). Namely, the first electrode 124 of the EL element 102(n) of the first pixel 114(n) is connected with the carrier injection amount control signal line Gn, and the first electrode 124 of the EL element 102(n+1) of the second pixel 114(n+1) is also connected with the carrier injection amount control signal line Gn.

The common line Cn is common to the pixels belonging to the n'th row and the pixels belonging to the (n−1)'th row. The driving transistor 106(n) and the capacitive element 108(n) of the first pixel 114(n) are connected with the common line Cn, and the driving transistor 106(n−1) and the capacitive element 108(n−1) of the third pixel 114(n−1) are also connected with the common line Cn. On the other hand, the driving transistor 106(n+1) and the capacitive element 108(n+1) of the second pixel 114(n+1) are connected with the common line C(n+1).

In this manner, the scanning signal line Sn, the carrier injection amount control signal line Gn and the common line Cn may be provided to be common to the pixels belonging to two rows adjacent to each other, so that the number of the lines provided in the display 112b is decreased. Such a structure simplifies the circuit configurations of the scanning signal line driving circuit block 116 and the carrier injection amount control signal line driving circuit block 120, in addition to decreasing the number of the lines provided in the display 112b. In the case where the EL element 102a of the bottom-emission type is provided in the pixel 114, the numerical aperture of the pixel may be increased.

2-1-3-4. Driving System 2 of the Display

Figure 20:
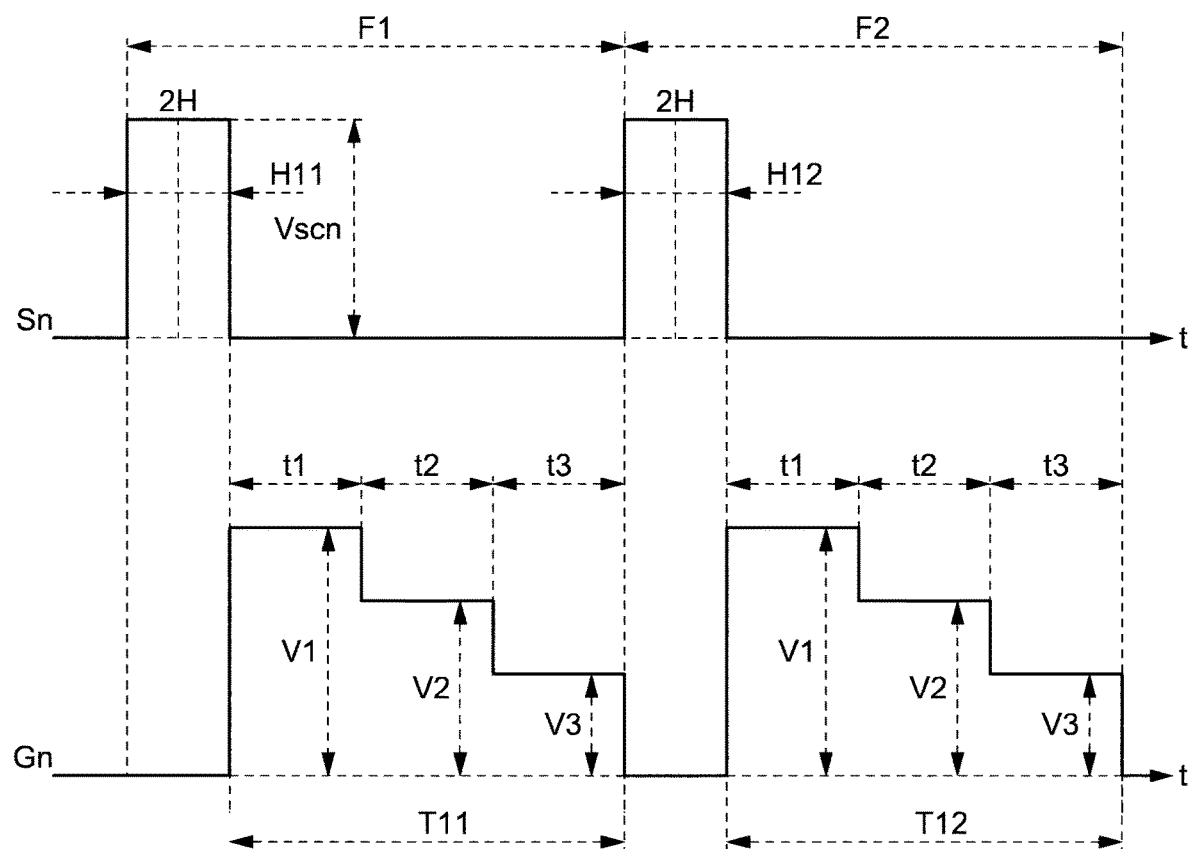
FIG. 20 shows waveforms of signals applied to the scanning signal line and the carrier injection amount control signal line of the EL display device according to an embodiment of the present invention.

FIG. 20 shows an operation of the first pixel 114(n) and the second pixel 114(n+1) shown in FIG. 19. In a certain frame period F1, a data signal is written to each of the first pixel 114(n) and the second pixel 114(n+1) respectively from the data signal lines D1m and D2m in two horizontal periods H11, in which the scanning signal Vscn is applied to the scanning signal line Sn. After the two horizontal periods H11 are finished, the first pixel 114(n) and the second pixel 114(n+1) are transited to a light emission period T11. In the light emission period T11, the first pixel 114(n) and the second pixel 114(n+1) are each supplied with the carrier injection amount control signal Vg from the carrier injection amount control signal line Gn, and as a result, emit light.

As described above, the first pixel 114(n) and the second pixel 114(n+1) are selected at the same time by the scanning signal line Sn. A data signal is written to each of the first pixel 114(n) and the second pixel 114(n+1) respectively from the data signal lines D1m and D2m, and the light emission period T11 is started at the same time in the first pixel 114(n) and the second pixel 114(n+1). As shown in FIG. 19, the pixels of two rows are selected by one scanning line Sn, and the data signal Vdata is written to each of the pixels of the two rows at the same time. With such a structure, even in the case where the number of the horizontal lines (number of the scanning signal lines) is increased, there is a sufficient duration of time in which the data signal is written to each pixel. In addition, the period in which the data signal Vdata is written may be set to two horizontal periods. In this case, there is a sufficient duration of time in which the data signal is written to each pixel.

2-1-3-5. Driving System 3 of the Display

According to the video format of the international standard, 4K refers to a resolution of about 8 million pixels (3,840×2,160 pixels), and 8K refers to a resolution of about 3,300 million pixels (7,680×4,320 pixels). The density of the pixels in a display panel needs to be increased in correspondence with such a high definition of the video. However, when the number of the horizontal lines (scanning signal lines) is increased in a display panel, there is a problem that if the frame frequency is of a certain constant level, the time duration in which the signal is written to one horizontal line is shortened. By contrast, if the frame frequency is decreased, there is a problem that the quality of a moving image is decreased.

In a display device, an image is displayed by rewriting an image once every frame. It is considered in principle that a smoother moving image is displayed when the frame frequency is higher. Specifically, it is considered that a frame frequency of 120 Hz or 240 Hz is more suitable to reproduce a moving image than a frame frequency of 60 Hz.

Figure 21:
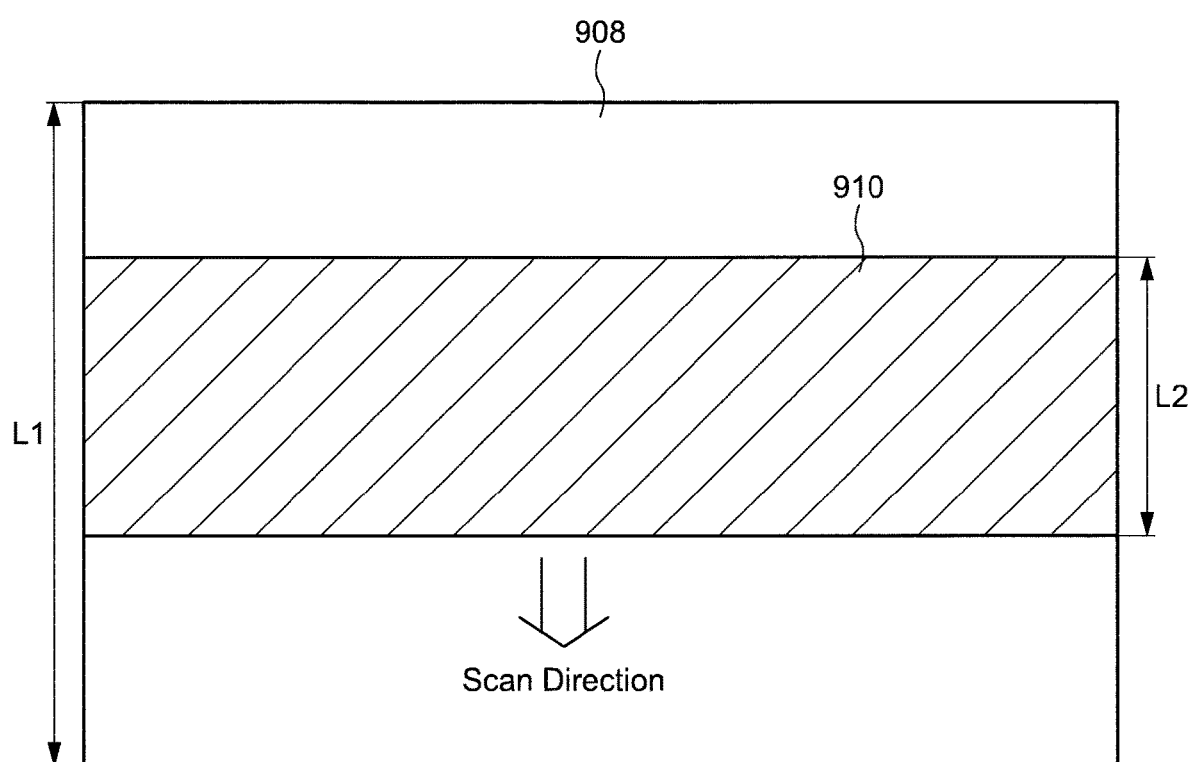
FIG. 21 schematically shows a method for driving the EL display device.

Even in the case where the frame frequency is 60 Hz, a driving system shown in FIG. 21 provides moving image characteristics equivalent to those of the case where the frame frequency of 120 Hz. According to the driving system shown in FIG. 21, a display screen 908 has a length L1 in a vertical direction, and a length L2 of an image display region 910 in the vertical direction is half of the length L1 (L2=0.5×L1). In one frame period, the image display region 910 of the display screen 908 is scanned once from the top to the bottom. In the case where the length L2 of the image display region 910 in the vertical direction is about ¼ of the length L1 of the display screen 908 in the vertical direction (L2=0.25×L1), moving image characteristics equivalent to those in the case where the frame frequency is 240 Hz are provided. Namely, even in the case where the frame frequency is 60 Hz, the moving image characteristics that are the same as those of the case where the frame frequency is 120 Hz may be provided by setting one frame period to 16.6 msec and setting the light emission period to 8.3 msec. Even in the case where the frame frequency is 60 Hz, the moving image characteristics that are the same as those of the case where the frame frequency is 240 Hz may be provided by setting one frame period to 16.6 msec and setting the light emission period to 4.16 msec.

Figure 22:
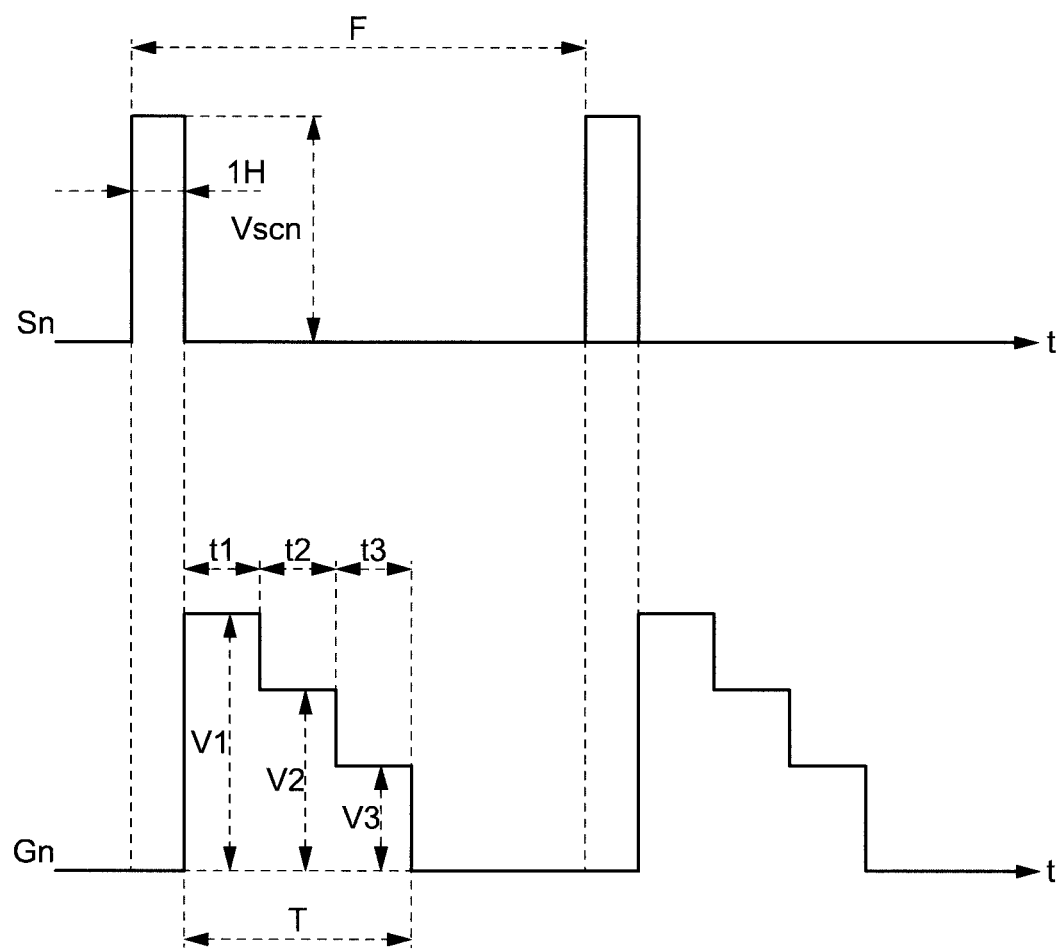
FIG. 22 shows waveforms of signals applied to the scanning signal line and the carrier injection amount control signal line of the EL display device according to an embodiment of the present invention.

FIG. 22 shows the waveform of the carrier injection amount control signal Vg in the case where the driving system of scanning the image display region 910 of the display screen 908 in one frame period, as described above is adopted. In one horizontal period 1H, the scanning signal Vscn is applied to the scanning signal line Sn, and as a result, the selection transistor 104 is turned on and the data signal Vdata is written to the gate of the driving transistor 106. After the one horizontal period 1H is finished, the pixel 114 is transited to a light emission period T. The light emission period T is set to be shorter than one frame period F. In the case where, for example, the frame frequency is 60 Hz and the one frame period F is 16.6 msec, the light emission period T is set to 8.3 msec. With such settings, moving image characteristics equivalent to those of the case where the frame frequency is 120 Hz may be provided. In the case where the light emission period T is set to 4.16 msec, moving image characteristics equivalent to those of the case where the frame frequency is 240 Hz may be provided.

In this case also, as shown in FIG. 22, the voltage of the carrier injection amount control signal Vg may be changed in a step-like manner from V1 to V2 to V3 as the time elapses from t1 to t2 to t3 in the light emission period T, so that the light emission positions in the light emitting layer are controlled as described above. When the light emission period T is finished, the voltage of the carrier injection amount control signal Vg may be changed to the voltage VL of the first level (VL=0 V), so that the light emission of the EL element 102 is stopped before the one frame period F is finished. The waveform of the carrier injection amount control signal Vg may be substantially the same as that shown in FIG. 13A or FIG. 13B.

As described above, even in the case where the driving system of scanning 134 are controlled the image display region 910 of the display screen 908 in one frame period is adopted, the waveform of the carrier injection amount control signal Vg may be controlled, so that the light emission positions in the light emitting layer and thus the luminance of the EL element 102 is suppressed from being deteriorated. In this manner, the light emission period T in one frame period F may be set to be short and the waveform of the carrier injection amount control signal may be controlled, so that even when the frame frequency is 60 Hz, an image having superb moving image characteristics are displayed and a highly reliable display device is provided.

2-1-3-6. Circuit Configuration 3 of the Display

Figure 23:
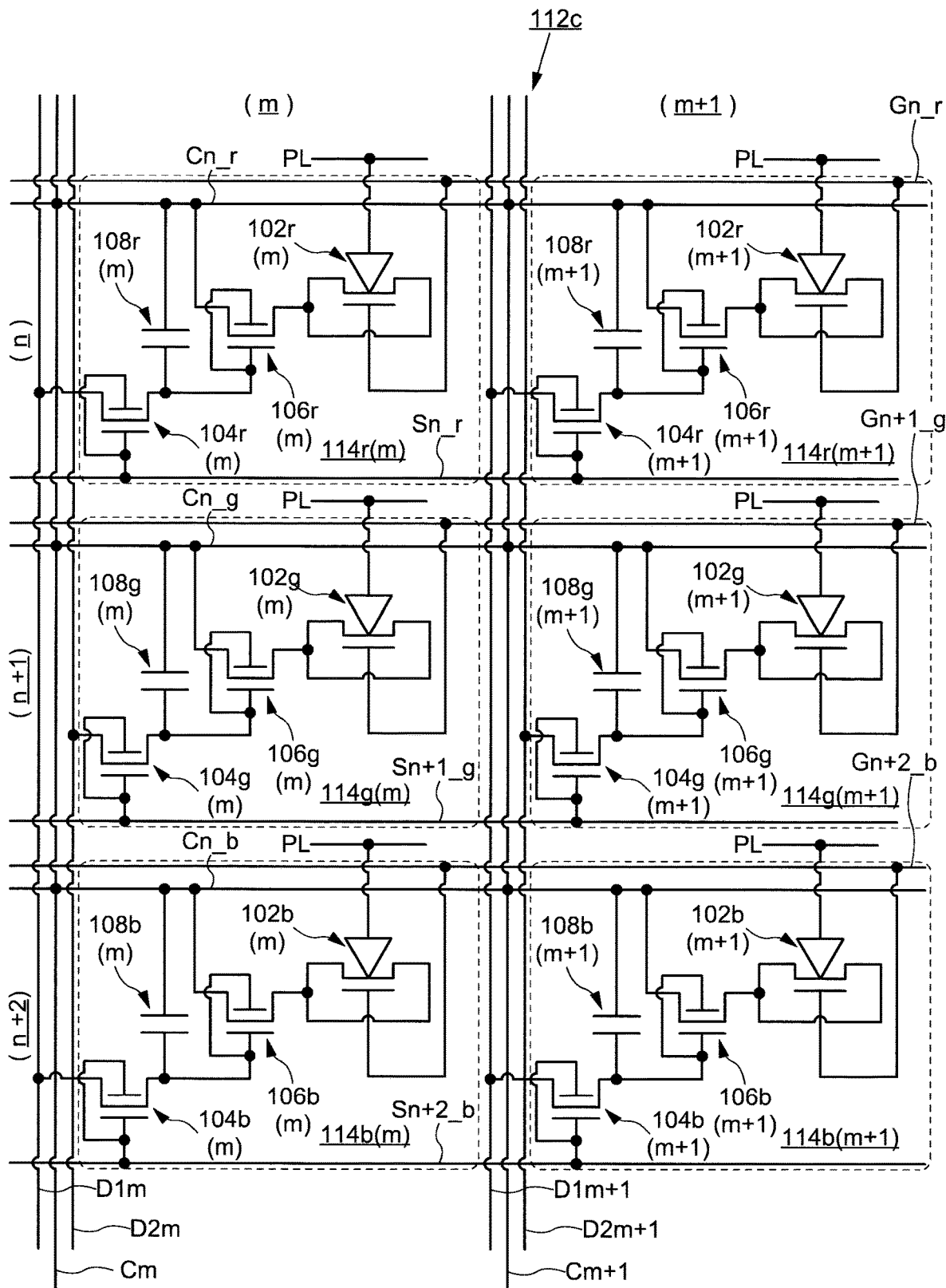
FIG. 23 shows a circuit configuration of a display of the EL display device according to an embodiment of the present invention.

FIG. 23 shows a circuit configuration of a display 112c of the EL display device 100. FIG. 23 shows a configuration in which pixels corresponding to the same color are arrayed in the row direction. Specifically, FIG. 23 shows an embodiment in which a first R pixel 114r(m) and a second R pixel 114r(m+1) corresponding to red are provided on the n'th row, a first G pixel 114g(m) and a second G pixel 114g(m+1) corresponding to green are located on the (n+1)'th row, and a first B pixel 114b(m) and a second B pixel 114b(m+1) corresponding to blue are located on the (n+2)'th row.

The structure of each pixel is substantially the same as that in FIG. 17. For example, the first R pixel 114r(m) includes an EL element 102r(m), a selection transistor 104r(m), a driving transistor 106r(m), and a capacitive element 108r(m). The EL element 102r(m) of the first R pixel 114r(m) includes a first electrode (carrier injection amount control electrode) connected with a carrier injection amount control signal line Gn_r, and the EL element 102r(m+1) of the second R pixel 114r(m+1) includes a first electrode (carrier injection amount control electrode) also connected with the carrier injection amount control signal line Gn_r. An EL element 102g(m) of the first G pixel 114g(m) includes a first electrode (carrier injection amount control electrode) connected with a carrier injection amount control signal line Gn+1_g, and an EL element 102g(m+1) of the second G pixel 114g(m+1) includes a first electrode (carrier injection amount control electrode) also connected with the carrier injection amount control signal line Gn+1_g. An EL element 102b(m) of the first B pixel 114b(m) includes a first electrode (carrier injection amount control electrode) connected with a carrier injection amount control signal line Gn+2_b, and an EL element 102b(m+1) of the second B pixel 114b(m+1) includes a first electrode (carrier injection amount control electrode) also connected with the carrier injection amount control signal line Gn+2_b.

The first R pixel 114r(m), the first G pixel 114g(m) and the first B pixel 114b(m) located on the m'th column respectively include EL elements emitting light of different colors. For example, the EL element 102r(m) includes a light emitting layer formed of a light emitting material that emits red light. The EL element 102g(m) includes a light emitting layer formed of a light emitting material that emits green light. The EL element 102b(m) includes a light emitting layer formed of a light emitting material that emits blue light. The same is applicable to the second R pixel 114r(m+1), the second G pixel 114g(m+1) and the second B pixel 114b(m+1) located on the (m+1)'th column.

Figure 24:
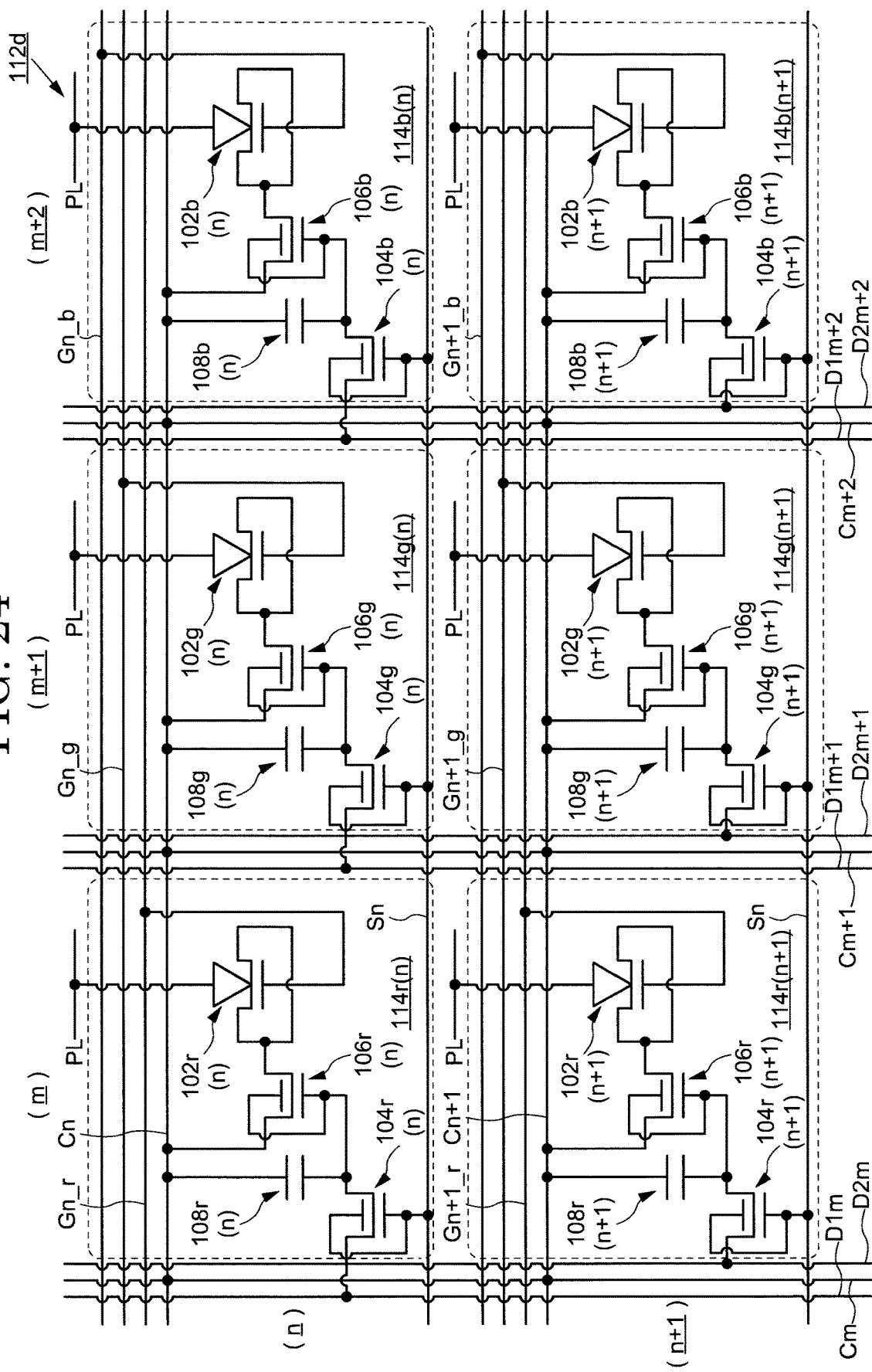
FIG. 24 shows a circuit configuration of a display of the EL display device according to an embodiment of the present invention.

An EL element including a light emitting layer formed of a different material exhibits a different timewise change (deterioration) in the current-voltage characteristic and the current efficiency. For this reason, as shown in FIG. 24, a display 112d includes the carrier injection amount control signal lines Gn in accordance with the EL elements emitting light of different colors. With such a structure, a different carrier injection amount control voltage may be applied to the light emitting layer of the EL element that emits light of a different color. FIG. 24 shows an embodiment in which the carrier injection amount control signal line Gn_r is provided for the first R pixel 114r(n) located on the n'th row, the carrier injection amount control signal line Gn_g is provided for the first G pixel 114g(n) located on the n'th row, and the carrier injection amount control signal line Gn_b is provided for the first B pixel 114b(n) located on the n'th row. In this manner, a plurality of carrier injection amount control signal lines may be provided for each row, namely, may be provided in correspondence with the colors of light, so that the carrier injection amount of the EL element that emits light of each color is independently controlled. In the case where, for example, the deterioration rate of the current efficiency of the EL element 102b(n) emitting blue light is higher than that of the EL element 102r(n) emitting red light, the carrier injection amount control voltage to be applied to the carrier injection amount control signal line Gn_b connected with the EL element 102b(n) emitting blue light may be made higher than the carrier injection amount control voltage to be applied to the carrier injection amount control signal line Gn_r connected with the EL element 102r(n) emitting red light, in consideration of the deterioration in the current efficiency. In this manner, the optimal light emission positions at which the light emission efficiency may be increased may be controlled, so that the deterioration in the image quality is prevented and the life of the display device is extended.

In the example shown in FIG. 23, the pixels that emit the same color are provided on the same row. Therefore, the number of the carrier injection amount control signal lines Gn provided per row may be decreased. For example, in the display 112d shown in FIG. 24, three carrier injection amount control signal lines Gn_r, Gn_g and Gn_b, are provided per row. By contrast, in the display 112c shown in FIG. 23, Gn_r is provided on the n'th row, Gn+1_g is provided on the (n+1)'th row, and Gn_b is provided on the (n+2)'th row. With such a structure, in the display 112c shown in FIG. 23, the amount of the carriers to be injected into the light emitting layer of the EL element may be controlled for each color of light, and thus the number of the carrier injection amount control signal lines Gn to be provided may be decreased.

2-2. Structure of the Display Device Including the EL Element

A structure of the display device including a pixel including the EL element according to an embodiment of the present invention will be described. By way of the embodiment described below, the structures of the EL element, the selection transistor, the driving transistor and the capacitive element provided in the pixel will be described.

2-2-1. Structure 1 of the Display Device

Figure 25:
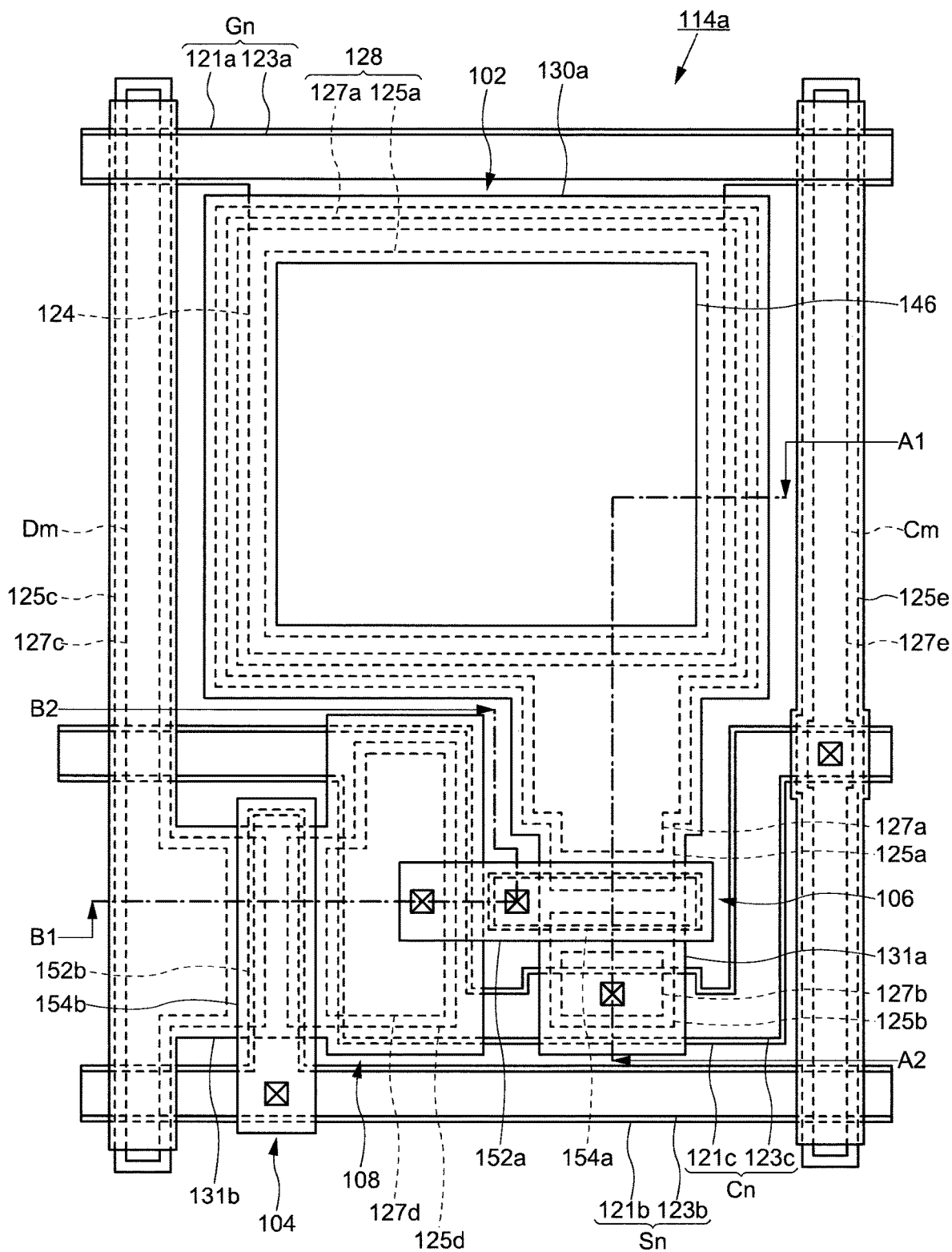
FIG. 25 shows a planar structure of a pixel of the EL display device according to an embodiment of the present invention.
Figure 26A:
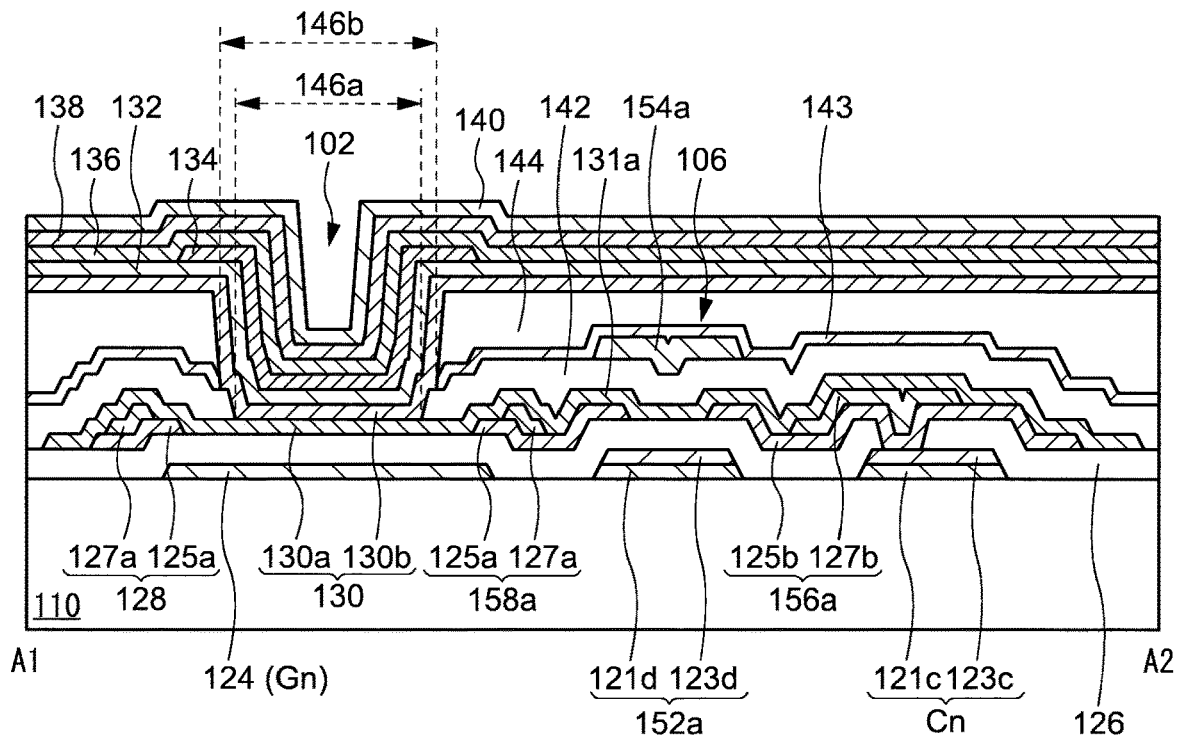
FIG. 26A shows a cross-sectional structure of the pixel of the EL display device according to an embodiment of the present invention, taken along line A1-A2 in FIG. 25.
Figure 26B:
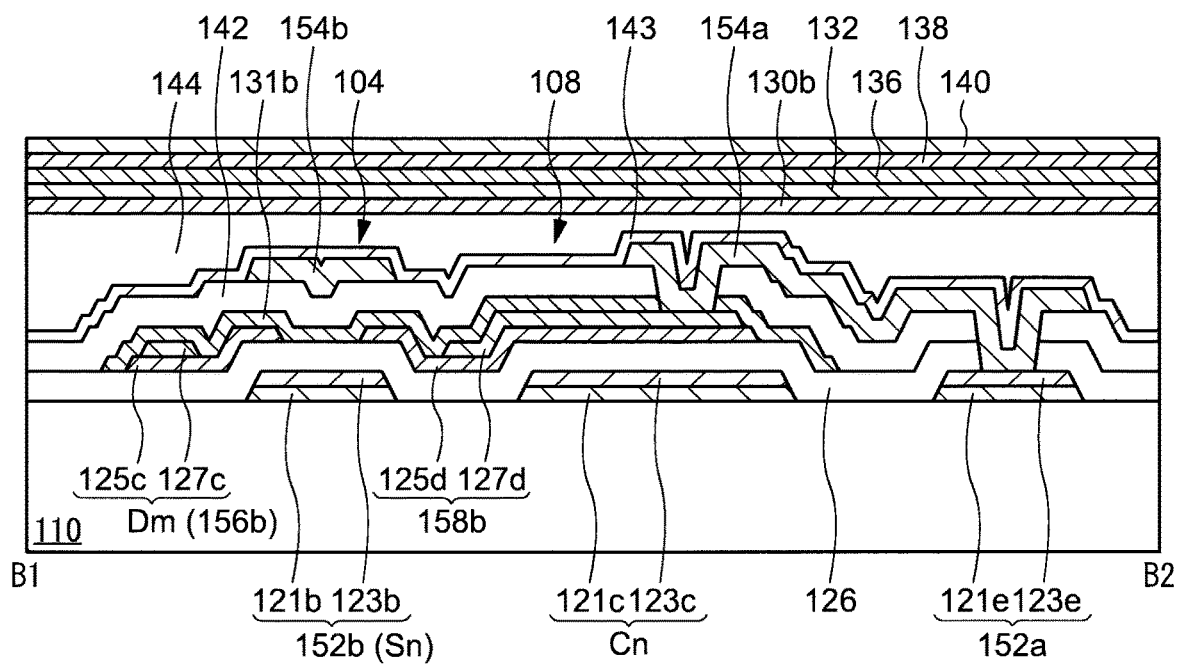
FIG. 26B shows a cross-sectional structure of the pixel of the EL display device according to an embodiment of the present invention, taken along line B1-B2 in FIG. 25.

FIG. 25 shows an example of layout of the pixel corresponding to the equivalent circuit shown in FIG. 11. FIG. 25 is a plan view of a pixel 114a. FIG. 26A shows a cross-sectional structure taken along line A1-A2 in FIG. 25, and FIG. 26B shows a cross-sectional structure taken along line B1-B2 in FIG. 25. FIG. 26A shows a cross-sectional structure of the EL element 102 and the driving transistor 106, and FIG. 26B shows a cross-sectional structure of the selection transistor 104 and the capacitive element 108. The following description will be made with reference to FIG. 25, FIG. 26A and FIG. 26B. In FIG. 25, the stack structure of the EL element 102 is omitted.

As shown in FIG. 25, the scanning signal line Sn, the data signal line Dm, the common line Cn, the common line Cm, and the carrier injection amount control signal line Gn are provided in a region where the pixel 114a is provided. As shown in FIG. 26A and FIG. 26B, the scanning signal line Sn, the common line Cn and the carrier injection amount control signal line Gn are provided between the substrate 110 and the first insulating layer 126. The data signal line Dm and the common line Cm are provided between the first insulating layer 126 and the second insulating layer 142. The scanning signal line Sn, the common line Cn and the carrier injection amount control signal line Gn have the same layer structure. Specifically, the scanning signal line Sn, the common line Cn and the carrier injection amount control signal line Gn have a structure in which a transparent conductive layer 121 and a conductive layer 123 formed of a low-resistance metal material are stacked on each other. The data signal Dm and the common line Cm includes a metal layer 127. The metal layer 127 may be held between a metal oxide conductive layer 125 and an oxide semiconductor layer 131.

The carrier injection amount control signal line Gn has a structure in which a first transparent conductive layer 121a formed of indium tin oxide (ITO) or the like and a first conductive layer 123a formed of a low-resistance metal material such as aluminum (Al) or the like are stacked on each other. The carrier injection amount control signal line Gn is electrically connected with the first electrode 124 of the EL element 102. Specifically, the first electrode 124 is formed in the same layer as the first transparent conductive layer 121a, and thus the carrier injection amount control signal line Gn and the first electrode 124 are electrically connected with each other. The carrier injection amount control signal line Gn is formed of the stack structure of the first transparent conductive layer 121a and the first conductive layer 123a, and therefore, is highly adhesive with an underlying layer and is electrically connected with the first electrode 124 with no use of a contact hole. Hereinafter, the structure of each of components included in the pixel 114a will be described in detail.

2-2-1-1. Driving Transistor

The driving transistor 106 has a structure in which a first gate electrode 152a, the first insulating layer 126, a first oxide semiconductor layer 131a, the second insulating layer 142 and a second gate electrode 154a are stacked. The first gate electrode 152a is provided between the substrate 110 and the first insulating layer 126. The second gate electrode 154a is provided as an upper layer to the second insulating layer 142 (provided on the side opposite to the substrate 110).

A first metal oxide conductive layer 125a and a second metal oxide conductive layer 125b are provided between the first insulating layer 126 and the first oxide semiconductor layer 131a. The first metal oxide conductive layer 125a and the second metal oxide conductive layer 125b are in contact with a surface of the first oxide semiconductor layer 131a on the side of the first insulating layer 126. The first metal oxide conductive layer 125a and the second metal oxide conductive layer 125b are provided to hold the first gate electrode 152a and the second gate electrode 154a from both of two sides thereof as seen in a plan view. The first gate electrode 152a has a layer structure same as that of the scanning signal line Sn. Namely, the first gate electrode 152a has a structure in which a second transparent conductive layer 121d and a second conductive layer 123d are stacked on each other. By contrast, the second gate electrode 154a may have a single metal layer formed of aluminum or the like.

The driving transistor 106 has a dual-gate structure in which the first gate electrode 152a and the second gate electrode 154a overlap each other with the first oxide semiconductor layer 131a being provided therebetween. The first insulating layer 126 between the first gate electrode 152a and the first oxide semiconductor layer 131a, and the second insulating layer 142 between the second gate electrode 154a and the first oxide semiconductor layer 131a, each act as a gate insulating film. It is preferred that the first insulating layer 126 and the second insulating layer 142 are formed of an oxide insulating material such as silicon oxide or the like in order to suppress generation of a defect based on oxygen deficiency of the first oxide semiconductor layer 131a. The driving transistor 106 is not limited to having a dual-gate structure, and may include only the first gate electrode 152a or only the second gate electrode 154a.

In the driving transistor 106, a region in which the first oxide semiconductor layer 131a is in contact with the first metal oxide conductive layer 125a is a drain region, and a region where the first oxide semiconductor layer 131a is in contact with the second metal oxide conductive layer 125b is a source region. Because of this structure, the first metal oxide conductive layer 125a and a first metal layer 127a substantially form a drain electrode 158a, and the second metal oxide conductive layer 125b and a second metal layer 127b substantially form a source electrode 156a.

The first metal layer 127a is in contact with the first metal oxide conductive layer 125a, whereas the second metal layer 127b is in contact with the second metal oxide conductive layer 125b. The first metal layer 127a and the first metal layer 127b are respectively provided to decrease the sheet resistances of the first metal oxide conductive layer 125a and the second metal oxide conductive layer 125b. The first metal oxide conductive layer 125a and the first metal layer 127a extend to the region of the EL element 102 and are provided to enclose the first opening 146a and the second opening 146b. The second metal oxide conductive layer 125b and the second metal layer 127b are electrically connected with the common line Cn via a contact hole formed in the first insulating layer 126. The common line Cn has a structure in which a third transparent conductive layer 131c and a third conductive layer 123c are stacked on each other.

The driving transistor 106 is covered with the third insulating layer 144 and a passivation layer 143. The third insulating layer 144 is formed of an organic resin material such as, for example, acrylic resin, polyimide resin, epoxy resin, polyamide resin or the like. When a composition containing a precursor of the organic resin material is applied during the production of the EL display device 100, the third insulating layer 144 has a surface thereof flattened by a levelling action of a film of the applied composition. In another embodiment, the third insulating layer 144 may be formed of an inorganic insulating film of silicon oxide or the like by plasma CVD or the like and then have a surface thereof flattened by chemical mechanical polishing (CMP). It is preferred that the passivation layer 143 is formed of silicon nitride.

2-2-1-2. Selection Transistor

The selection transistor 104 has a structure substantially the same as that of the driving transistor 106. Namely, the selection transistor 104 has a structure in which a first gate electrode 152b, the first insulating layer 126, a second oxide semiconductor layer 131b, the second insulating layer 142 and a second gate electrode 154b are stacked. In the selection transistor 104, a channel is formed in a region where the second oxide semiconductor layer 131b overlaps the first gate electrode 152b and the second gate electrode 154b. A third metal oxide conductive layer 125c and a fourth metal oxide conductive layer 125d are provided between the first insulating layer 126 and the second oxide semiconductor layer 131b. A region where the second oxide semiconductor layer 131b is in contact with the third metal oxide conductive layer 125c is a source region, and a region where the second oxide semiconductor layer 131b is in contact with the fourth metal oxide conductive layer 125d is a drain region. Because of this structure, the third metal oxide conductive layer 125c and a third metal layer 127c substantially form a source electrode 156b, and the fourth metal oxide conductive layer 125d and a fourth metal layer 127d substantially form a drain electrode 158b. The third metal oxide conductive layer 125c and the fourth metal oxide conductive layer 125d are provided to hold the first gate electrode 152a and the second gate electrode 154a from both of two sides thereof as seen in a plan view.

The third metal oxide conductive layer 125c and the third metal layer 127c are stacked on each other. The stack body of the third metal oxide conductive layer 125c and the third metal layer 127c forms the data signal line Dm. The third metal layer 127c substantially decreases the sheet resistance of the third metal oxide conductive layer 125c. The second oxide semiconductor layer 131b extends to the region where the data signal line Dm is located and is provided to cover the data signal line Dm. The data signal line Dm has a top surface and a side surface thereof covered with the second oxide semiconductor layer 131b, and therefore, is not exposed to an oxidizing atmosphere or a reducing atmosphere during the production of the EL display device 100. For this reason, the data signal line Dm may suppress surfaces of the third metal oxide conductive layer 125c and the third metal layer 127c from having an increased resistance.

2-2-1-3. Capacitive Element

The capacitive element 108 is formed in a region where the common line Cn, the first insulating layer 126, the fourth metal oxide conductive layer 125d and the fourth metal layer 127d are stacked. Namely, in the region where the capacitive element 108 is formed, the stack of the common line Cn, the fourth metal oxide conductive layer 125d and the fourth metal layer 127d acts as a capacitive electrode.

The second oxide semiconductor layer 131b and the second insulating layer 142 are provided as upper layers to the stack of the fourth metal oxide conductive layer 125d and the fourth metal layer 127d. The stack of the fourth metal oxide conductive layer 125d and the fourth metal layer 127d is electrically connected with the second gate electrode 154a via a contact hole running through the second insulating layer 142 and the second oxide semiconductor layer 131b. The second gate electrode 154a is electrically connected with the first gate electrode 152a via a contact hole running through the first insulating layer 126 and the second insulating layer 142.

2-2-1-4. EL Element

The EL element 102 has a structure in which the first electrode 124, the first insulating layer 126, the electron transfer layer 130 (the first electron transfer layer 130a and the second electron transfer layer 130b), the electron injection layer 132, the light emitting layer 134, the hole transfer layer 136, the hole injection layer 138 and the third electrode 140 are stacked on the substrate 110 in this order from the side of the substrate 110. The electron transfer layer 130 and the second electrode 128 are electrically connected with each other. The details of the structure of the EL element 102 are substantially the same as those described above with reference to FIG. 1 and FIG. 2.

The EL element 102 is formed in a region where the first opening 146a running through the second insulating layer 142, and the second opening 146b running through the third insulating layer 140 and the passivation layer 143, overlap each other. The first opening 146a and the second opening 146b expose the first electron transfer layer 130a. The second electron transfer layer 130b, the electron injection layer 132, the light emitting layer 134, the hole transfer layer 136, the hole injection layer 138 and the third electrode (positive electrode) 140 are stacked on the first electron transfer layer 130a. The second electrode 128 is electrically connected with the drain of the driving transistor 106, and is held between the first insulating layer 126 and the second insulating layer 142 to be insulated from the first electrode (carrier injection amount control electrode) 124 and the third electrode (positive electrode) 140.

FIG. 26A shows a structure in which the first electron transfer layer 130a is continuous from the first oxide semiconductor layer 131a of the driving transistor 106. The pixel 114a is not limited to having such a structure, and the first electron transfer layer 130a and the first oxide semiconductor layer 131a may be formed of separate layers not continuous to each other.

As shown in FIG. 25, FIG. 26A and FIG. 26B, the first insulating layer 126 and the second insulating layer 142 included in the EL element 102 may be used as the gate insulating films of the driving transistor 106 and the selection transistor 104. The conductive layer forming the first electrode 124 of the EL element 102 may be used to form the first gate electrode 152 of the driving transistor 106 and the first gate electrode 152 of the selection transistor 104. The conductive layer forming the second electrode 128 of the EL element 102 may be used to form electrodes that are in contact with the sources and the drains of the driving transistor 106 and the selection transistor 104. As described above, the EL element 102 according to an embodiment of the present invention may be formed by use of the same layers as the layers included in the transistors included in the pixel. This may suppress the production cost from being increased.

2-2-2. Structure 2 of the Display Device

Figure 27:
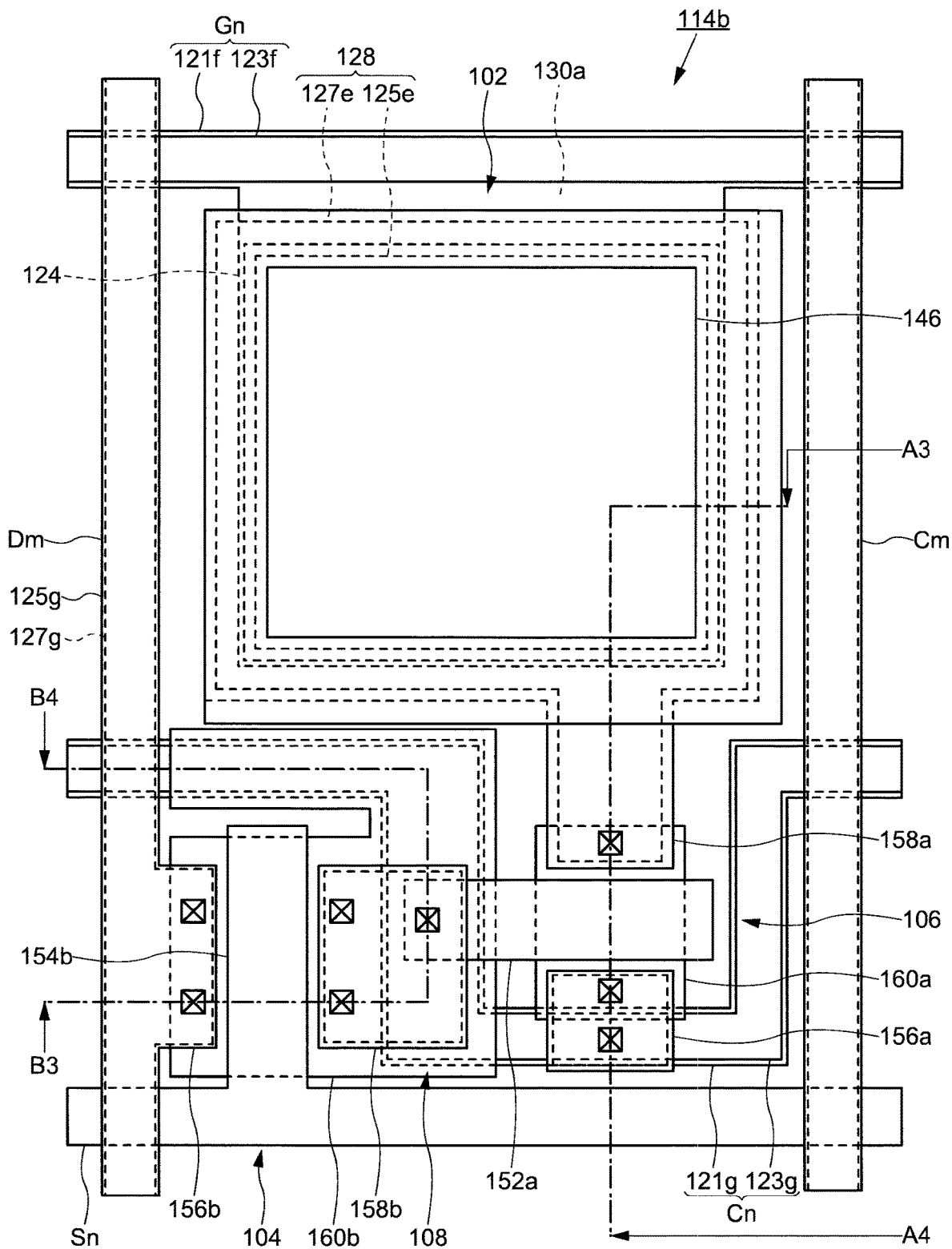
FIG. 27 shows a planar structure of a pixel of the EL display device according to an embodiment of the present invention.
Figure 28A:
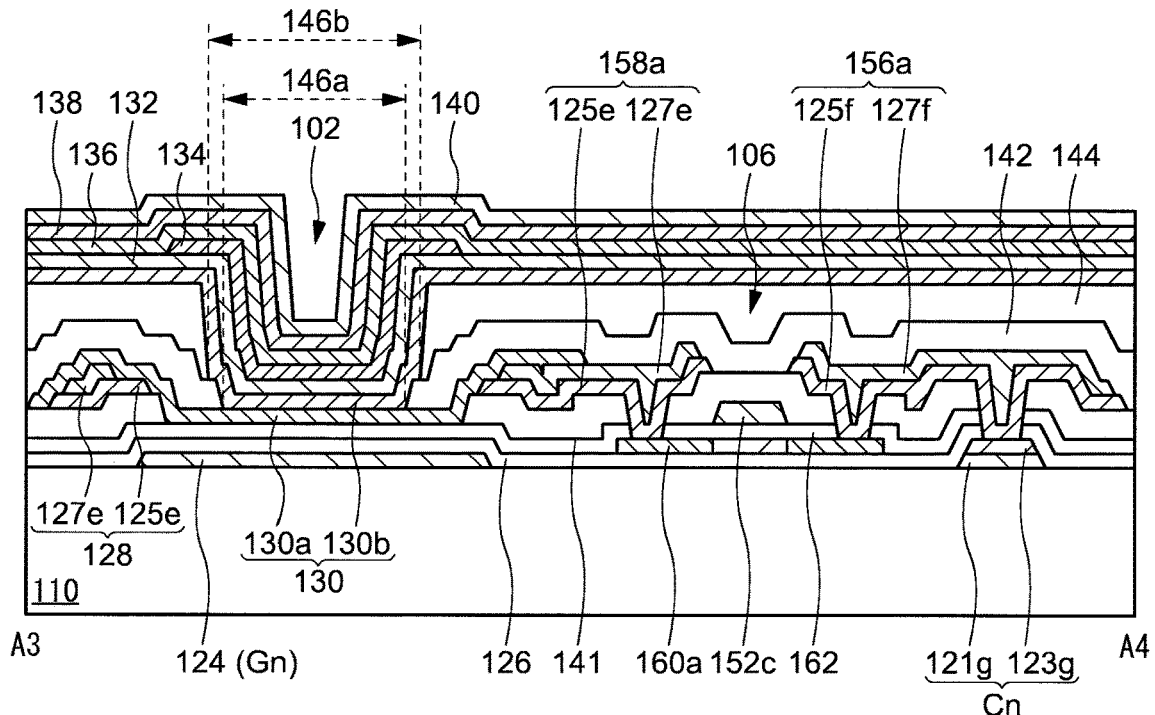
FIG. 28A shows a cross-sectional structure of the pixel of the EL display device according to an embodiment of the present invention, taken along line A3-A4 in FIG. 27.
Figure 28B:
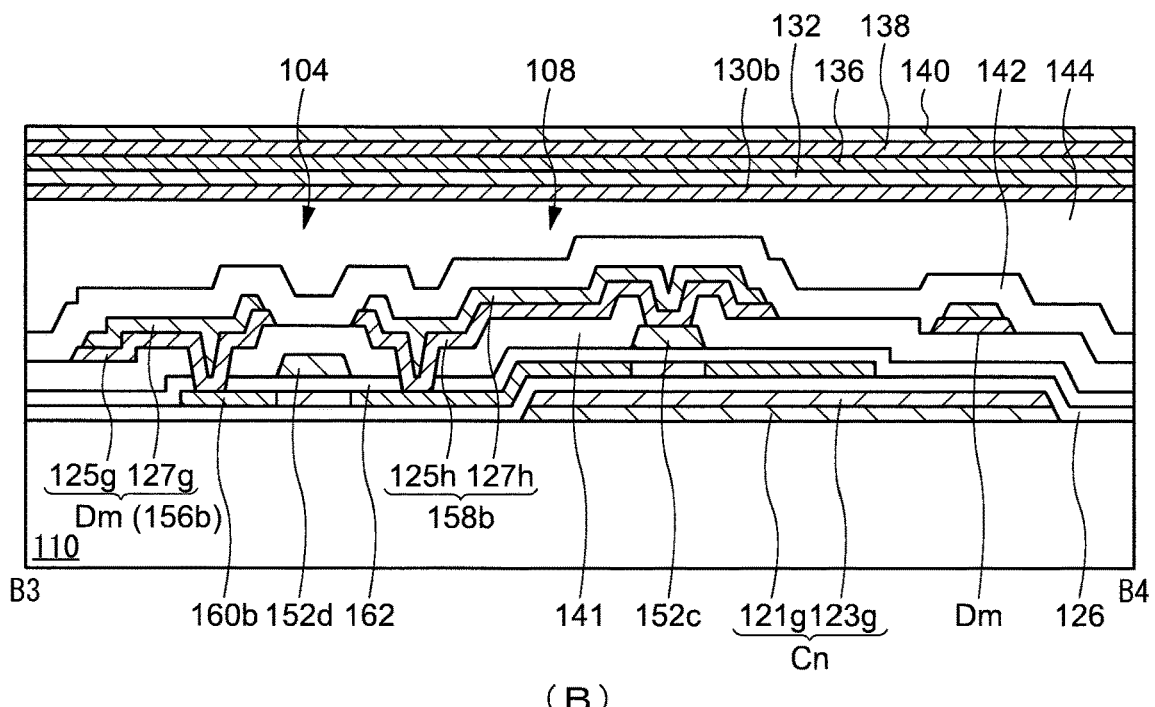
FIG. 28B shows a cross-sectional structure of the pixel of the EL display device according to an embodiment of the present invention, taken along line B3-B4 in FIG. 27.

FIG. 27 shows another example of layout of the pixel corresponding to the equivalent circuit shown in FIG. 11. FIG. 27 is a plan view of a pixel 114b. FIG. 28A shows a cross-sectional structure taken along line A3-A4 in FIG. 27, and FIG. 28B shows a cross-sectional structure taken along line B3-B4 in FIG. 27. FIG. 28A shows a cross-sectional structure of the EL element 102 and the driving transistor 106, and FIG. 28B shows a cross-sectional structure of the selection transistor 104 and the capacitive element 108. The following description will be made with reference to FIG. 27, FIG. 28A and FIG. 28B. In FIG. 27, the stack structure of the EL element 102 is omitted.

As shown in FIG. 27, the scanning signal line Sn, the data signal line Dm, the common line Cn, the common line Cm, and the carrier injection amount control signal line Gn are provided in a region where the pixel 114b is provided. A layer in which the scanning signal line Sn, the common line Cn and the carrier injection amount control signal line Gn are formed is provided between the substrate 110 and the first insulating layer 126. The data signal line Dm and the common line Cm are provided between the first insulating layer 126 and the second insulating layer 142. The common line Cn have a structure in which a transparent conductive layer 121g and a conductive layer 123g formed of a low-resistance metal material are stacked on each other. The carrier injection amount control signal line Gn have a structure in which a transparent conductive layer 121f and a conductive layer 123f formed of a low-resistance metal material are stacked on each other. The data signal line Dm (source electrode 156b) includes a seventh metal oxide conductive layer 125g and a seventh metal layer 127g, and the drain electrode 158b includes an eighth metal oxide conductive layer 125h and an eighth metal layer 127h. An interlayer insulating layer 141 is provided to insulate first gate electrodes 152c and 152d from the source electrodes 156a and 156b and also from the drain electrodes 158a and 158b.

In the driving transistor 106, a channel is formed in a first semiconductor layer 160a. In the selection transistor 104, a channel is formed in a second semiconductor layer 160b. The first semiconductor layer 160a and the second semiconductor layer 160b are provided on the first insulating layer 126. A gate insulating layer 162 is provided on the first semiconductor layer 160a and the second semiconductor layer 160b. The first gate electrode 152c includes a region overlapping the first semiconductor layer 160a with the gate insulating layer 162 being provided between the region and the first semiconductor layer 160a. The second gate electrode 152d includes a region overlapping the second semiconductor layer 160b with the gate insulating layer 162 being provided between the region and the second semiconductor layer 160b. The first semiconductor layer 160a and the second semiconductor layer 160b are formed of polycrystalline silicon.

The EL element 102 has a structure in which the first electrode 124, the first insulating layer 126, the electron transfer layer 130 (the first electron transfer layer 130a and the second electron transfer layer 130b), the electron injection layer 132, the light emitting layer 134, the hole transfer layer 136, the hole injection layer 138 and the third electrode 140 are stacked in the first opening 146a and the second opening 146b, and in which the second electrode 128 is connected with the first electron transfer layer 130a outside the first opening 146a and the second opening 146b. The second electrode 128 is provided to enclose the first opening 146a and the second opening 146b, and may be connected with the drain electrode 158a of the driving transistor 106 or may be formed of an oxide semiconductor.

The driving transistor 106 and the selection transistor 104 are each of an n-channel type. In the first semiconductor layer 160a, a region overlapping the first gate electrode 152c is a channel region, and a region outer thereto is contaminated with an impurity element providing an n-type conductivity. Also in the second semiconductor layer 160b, a region overlapping the first gate electrode 152d is a channel region, and a region outer thereto is contaminated with an impurity element providing an n-type conductivity. The common line Cn has a structure in which a transparent conductive layer 121g and a conductive layer 123g formed of a low-resistance metal material are stacked on each other. The capacitive element 108 is formed in a region where the n-type region of the second semiconductor layer 160b and the common line Cn overlap each other with the first insulating layer 126 being provided therebetween.

In the EL element 102, the first insulating layer 126 may be used as an underlying insulating film for the first semiconductor layer 160a and the second semiconductor layer 160b. Namely, the first insulating layer 126 provides a structure in which neither the first semiconductor layer 160a nor the second semiconductor layer 160b is in direct contact with the substrate 110. Thus, the first insulating layer 126 prevents the first semiconductor layer 160a and the second semiconductor layer 160b from being contaminated by the substrate 110 to improve the reliability. The second insulating layer 142 insulating the second electrode 128 and the third electrode 140 from each other is provided as an upper layer to the source electrodes 156a and 156b and the drain electrodes 158a and 158b. The third insulating layer 144 is provided as an upper layer to the second insulating layer 142. The EL elements 102 can be provided on the same substrate with no influence on the structure of the driving transistor 106 and the selection transistor 104.

As shown in FIG. 27, FIG. 28A and FIG. 28B, the driving transistor 106 and the selection transistor 104 may be formed of a silicon semiconductor, so that the display device is formed in substantially the same manner as described above. In the case where the first semiconductor layer 160a and the second semiconductor layer 160b are formed of a polycrystalline silicon semiconductor, a higher mobility is realized than in the case where the first semiconductor layer 160a and the second semiconductor layer 160b are formed of an oxide semiconductor. Therefore, the display device may be driven even when the frame frequency is higher.

2-2-3. Structure 3 of the Display Device

Figure 29:
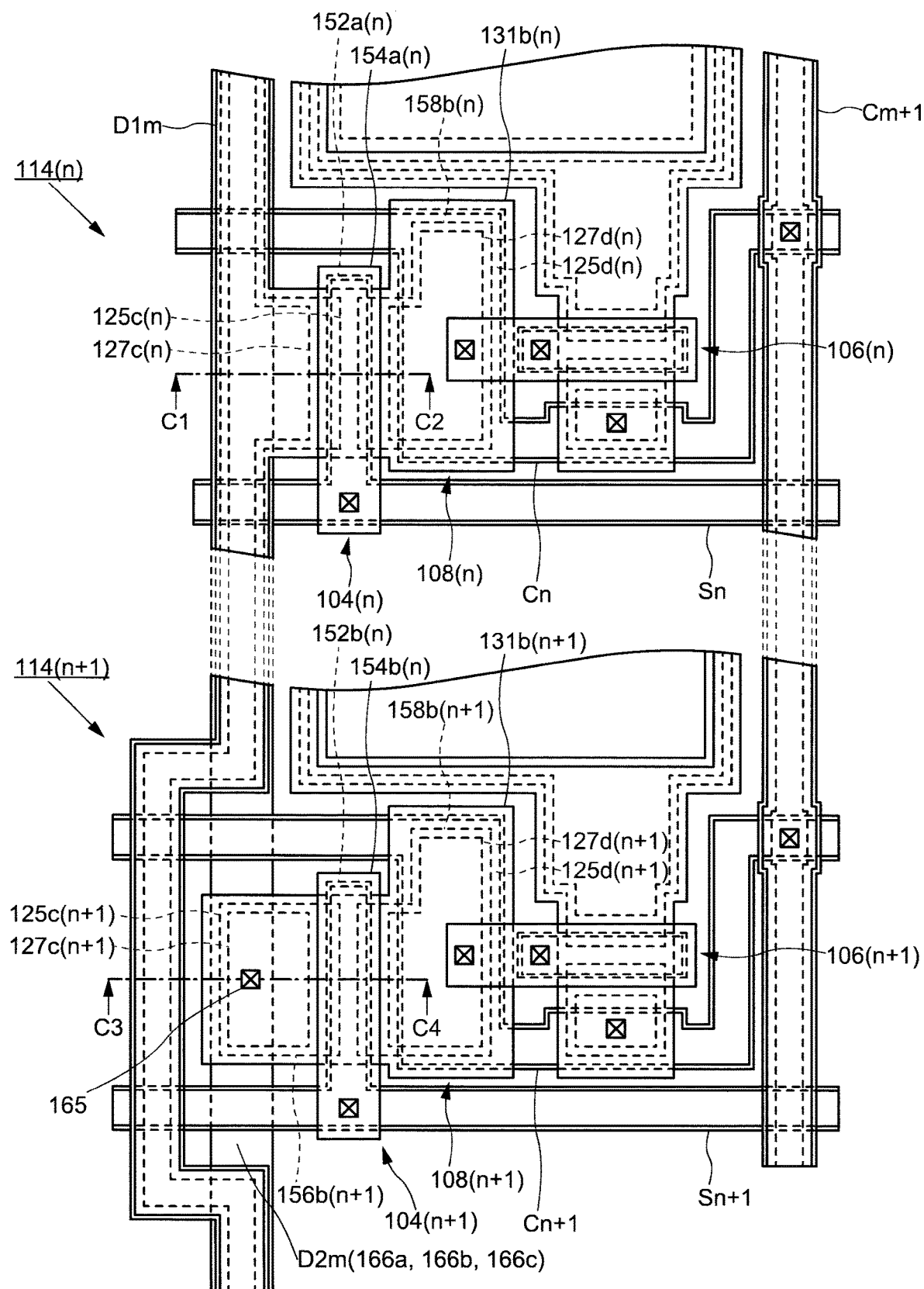
FIG. 29 is a plan view showing a partial structure of pixels in the n'th row and the (n+1)'th row of the EL display device according to an embodiment of the present invention.
Figure 30A:
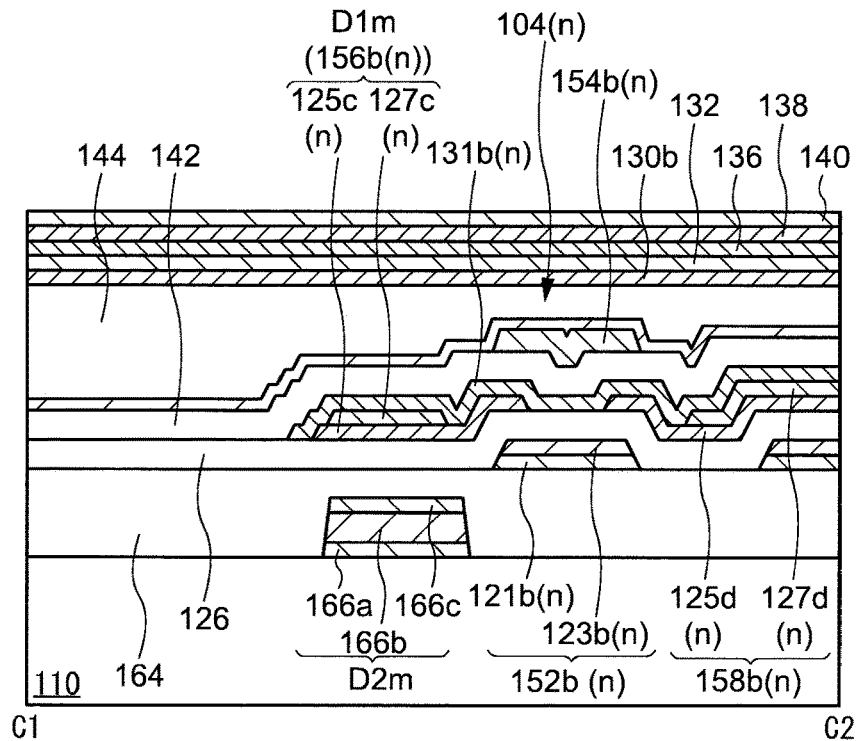
FIG. 30A shows a cross-sectional structure of the EL display device according to an embodiment of the present invention, specifically, a structure of a connection portion of a first data signal line and a selection transistor of a pixel in the n'th row.
Figure 30B:
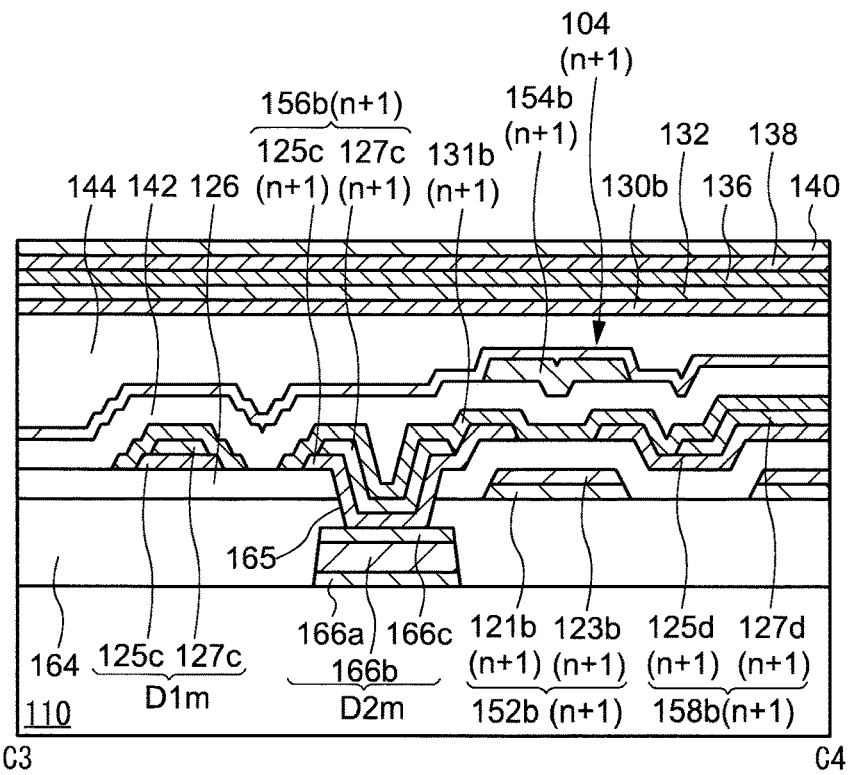
FIG. 30B shows a cross-sectional structure of the EL display device according to an embodiment of the present invention, specifically, a structure of a connection portion of a second data signal line and a selection transistor of a pixel in the (n+1)'th row.

FIG. 24 shows a pixel circuit in which the first data signal line D1m and the second data signal line D2m are provided on one column. FIG. 29 shows an example of layout corresponding to the pixel circuit shown in FIG. 24. FIG. 30A shows a cross-sectional structure taken along line C1-C2 in FIG. 29, and FIG. 30B shows a cross-sectional structure taken along line C3-C4 in FIG. 29.

FIG. 29 shows a partial structure of the first pixel 114(n) and the second pixel 114(n+1) located adjacent to each other in the column direction. The details of the structure of the first pixel 114(n) and the second pixel 114(n+1) are substantially the same as those in FIG. 25. In the first pixel 114(n) belonging to the n'th row, the selection transistor 104(n) is electrically connected to the first data signal line D1m. In the second pixel 114(n+1) belonging to the (n+1)'th row, the selection transistor 104(n+1) is electrically connected to the second data signal line D2m. The first data signal line D1m and the second data signal line D2m are located to overlap each other as seen in a plan view. FIG. 29 shows an embodiment in which the first data signal line D1m is provided in an upper layer and the second data signal line D2m is provided in a lower layer.

The selection transistor 104(n) of the first pixel 114(n) and the selection transistor 104(n+1) of the second pixel 114(n+1) have the same layer structure as each other (are provided in the same layer). A source electrode 156b(n) of the first pixel 114(n) is electrically connected with the first data signal line D1m. The source electrode 156b(n) and the first data signal line D1m are provided in the same layer. In a region where the selection transistor 104(n+1) of the second pixel 114(n+1) is electrically connected with the second data signal line D2m, the first data signal line D1m is provided to be curved so as not to interfere with a source electrode 156b(n+1) of the selection transistor 104(n+1).

FIG. 30A shows a cross-sectional structure of a connection portion of the selection transistor 104(n) of the first pixel 114(n) and the first data signal line D1m. FIG. 30B shows a cross-sectional structure of a connection portion of the selection transistor 104(n+1) of the second pixel 114(n+1) and the second data signal line D2m. Like in FIG. 26, the first data signal line D1m is provided between the first insulating layer 126 and the second insulating layer 142. The second data signal line D2m is provided as a lower layer to the first insulating layer 126. The second data signal line D2m is provided to be embedded in an insulating layer 164 so as not to interfere with the scanning signal line Sn.

As shown in FIG. 30A, the first data signal line D1m and the second data signal line D2m are located to overlap each other. The first data signal line D1m and the second data signal line D2m are supplied with data signals of different voltage levels. Therefore, delay of the signals caused by the parasitic capacitance needs to be considered. However, since the first insulating layer 126 and the second insulating layer 142 are provided between the first data signal line D1m and the second data signal line D2m, the distance between the lines is extended and the influence of the parasitic capacitance is decreased.

As shown in FIG. 29 and FIG. 30B, the second data signal line D2m is electrically connected with the source electrode 156b(n+1) of the selection transistor 104(n+1) of the second pixel 114(n+1) via a contact hole 165 formed in the first insulating layer 126 and the insulating layer 164. The source electrode 156b(n+1), which has a stack structure of a third metal oxide conductive layer 125c(n+1) and a third metal layer 127c(n+1), has a sufficient thickness, and therefore, is not disconnected in the contact hole 165. The second data signal line D2m is formed of a metal material. For example, the second data signal line D2m has a structure in which a second metal layer 166b formed of a highly conductive material such as aluminum (Al), copper (Cu) or the like is provided between a first metal layer 166a and a third metal layer 166c each formed of a high melting point metal material such as molybdenum (Mo), titanium (Ti) or the like. The second data signal line D2m is formed of a highly conductive metal material such as aluminum (Al), copper (Cu) or the like, and therefore, may decrease the line resistance thereof.

Figure 31A:
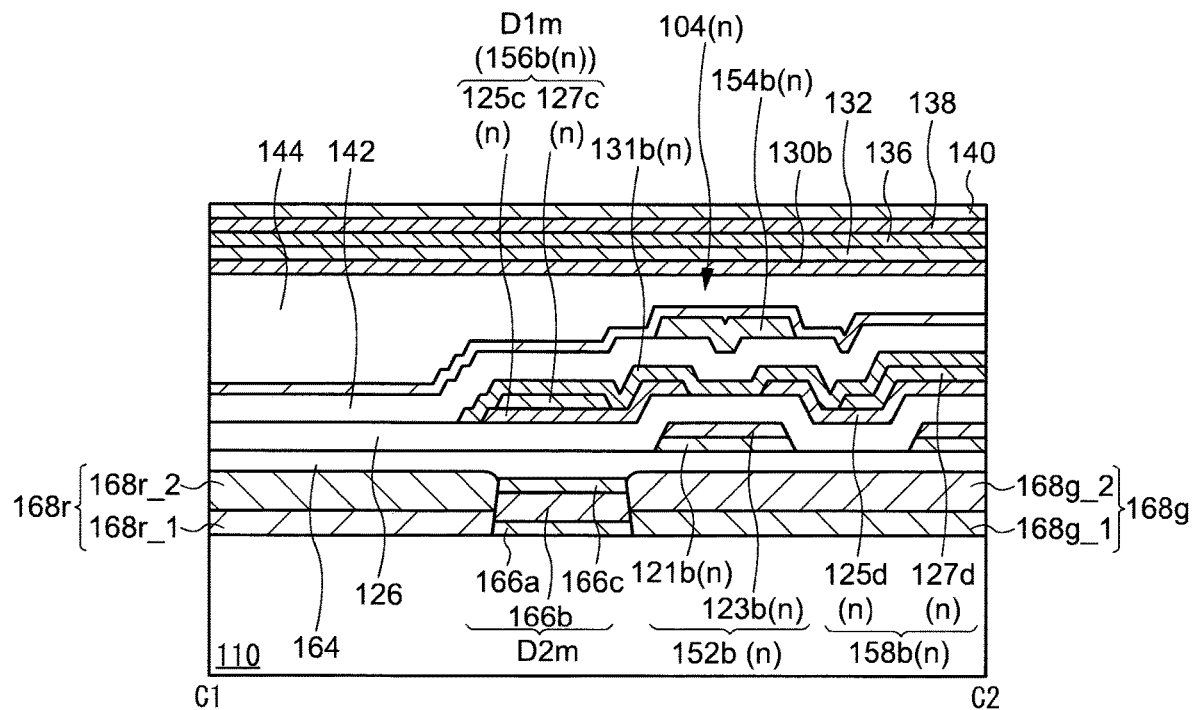
FIG. 31A shows a cross-sectional structure of the EL display device according to an embodiment of the present invention, specifically, a structure of the connection portion of the first data signal line and the selection transistor of the pixel in the n'th row.
Figure 31B:
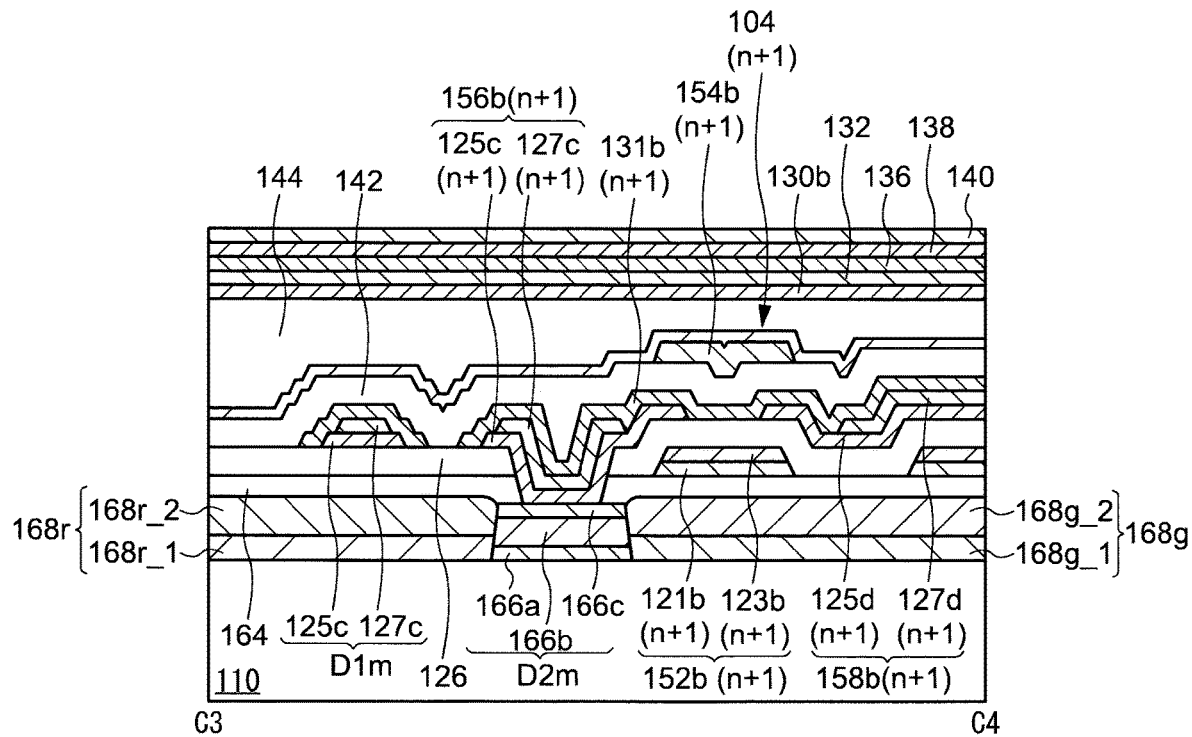
FIG. 31B shows a cross-sectional structure of the EL display device according to an embodiment of the present invention, specifically, a structure of the connection portion of the second data signal line and the selection transistor of the pixel in the (n+1)'th row.

FIG. 31A shows a structure including, in addition to the components shown in FIG. 30A, a color filter layer 168g provided as a lower layer to the insulating layer 164, namely, between the insulating layer 164 and the substrate 110. FIG. 31B also shows a structure including a color filter layer 168r in addition to the components shown in FIG. 30B. The insulating layer 164 is used as a flattening film that prevents the step provided by the second data signal line D2m from being reflected in the layers on the insulating layer 164. Therefore, the color filter layers 168g and 168r are embedded in the insulating layer 164, like the color filter layer 168r. The insulating layer 164 may have a thickness of 3 to 5 μm, so as to embed the second data signal line D2m and the color filter layers 168r and 168g. The insulating layer 164 flattens top surfaces of the second data signal line D2m and the color filter layers 168r and 168g, and therefore, the EL element and the transistors may be formed thereon. The structures shown in FIG. 31A and FIG. 31B are usable in the case where the EL element included in the pixel is of the bottom-emission type as shown in FIG. 1 and the light emitting layers 134 of the EL elements 102 of the display 112 all emit blue light.

FIG. 31A and FIG. 31B each show a structure in which the red color filter layer 168r and the green color filter layer 168g are separated from each other by the second data signal line D2m. As shown in FIG. 29, the second data signal line D2m is provided on each column. The second data signal line D2m is used as a line transmitting a signal and is also usable as a black matrix (light blocking film) demarcating the color filter layers on a column-by-column basis. In the case where the EL display device of the bottom-emission type adopts a so-called array-on-color filter structure, the second data signal line D2m may be used as a black matrix, so that the structure and the production process of the EL display device are simplified. FIG. 31A and FIG. 31B show only the red color filter layer 168r and the green color filter layer 168g. In actuality, color filter layers corresponding to R (red), green (G) and blue (B) are provided, and a color filter layer corresponding to another color (e.g., yellow (Y)) may be optionally provided.

FIG. 31A and FIG. 31B each show a case where the color filter layers 168r and 168g are formed by use of quantum dots (QD). Specifically, the red color filter 168r includes a red-colored layer 168r_1 and a red-converted quantum dot-containing layer 168r_2 stacked from the side of the substrate 110. The green color filter 168g includes a green-colored layer 168g_1 and a green-converted quantum dot-containing layer 168g_2 stacked from the side of the substrate 110. In this manner, the colored layer and the color-converted layer containing the quantum dots may be combined, so that the color purity of each of the red pixel and the green pixel is improved. Although not shown, a blue-colored layer may be provided in the region corresponding to the blue pixel, and a blue color scattering layer may be stacked thereon.

As shown in FIG. 29, FIG. 30A and FIG. 30B, the first data signal line D1m and the second data signal line D2m may be provided on the same column, so that the signal is written to two rows at the same time. In this case, the first data signal line D1m and the second data signal line D2m may be provided to overlap each other with the insulating layer being provided therebetween. With such a structure, even if the pixel pitch is decreased, the numerical aperture may be suppressed from being decreased to realize a high definition display panel. As shown in FIG. 31A and FIG. 31B, the color filter layers 168r and 168g may be provided, so that the color purity of the display device of the bottom-emission type is improved.

As described above, in the EL display device according to an embodiment of the present invention, an electrode that controls the carrier injection amount is provided in the EL element. This may suppress the deterioration in the luminance and improve the reliability of the EL display device. In order to apply a signal to the carrier injection amount control electrode, a dedicated line (carrier injection amount control signal line) needs to be provided. Such a carrier injection amount control signal line may be shared by two adjacent rows, so that the number of the lines is suppressed from being increased. The signal applied to the carrier injection amount control electrode controls the light emission period of the EL element. With such a structure, even in the case where, for example, the frame frequency is 60 Hz, the moving image characteristic are improved.

The invention claimed is:

1. An electroluminescence display device, comprising:
a pixel including a selection transistor, a driving transistor, and an EL element;
a scanning signal line electrically connected with a gate of the selection transistor;
a data signal line electrically connected with a source of the selection transistor; and
a carrier injection amount control signal line applying a voltage to the EL element, wherein:
the EL element includes:
a first electrode,
a third electrode including a region facing the first electrode,
a first insulating layer between the first electrode and the third electrode,
an electron transfer layer between the first insulating layer and the third electrode,
a light emitting layer containing an electroluminescence material between the electron transfer layer and the third electrode, and
a second electrode located outer to a region where the first electrode, the first insulating layer, the electron transfer layer and the third electrode overlap each other, the second electrode being in contact with the electron transfer layer,
the first electrode is electrically connected with the carrier injection amount control signal line,
the second electrode is connected with a drain of the driving transistor, and
the third electrode is supplied with a constant voltage,
wherein: the EL element has a light emission period and a light non-emission period, and the carrier injection amount control signal line applies a voltage having a step-like waveform or a sine waveform to the first electrode in the light emission period.

2. The electroluminescence display device according to claim 1, wherein a light emission point in the light emitting layer of the EL element is controlled by the voltage applied by the carrier injection amount control signal line.

3. The electroluminescence display device according to claim 1, wherein the electron transfer layer contains a metal oxide semiconductor material.

4. The electroluminescence display device according to claim 3, wherein the driving transistor includes a metal oxide semiconductor layer forming a channel region, and the metal oxide semiconductor layer is continuous to the electron transfer layer.

5. An electroluminescence display device, comprising:
a plurality of pixels each including a selection transistor, a driving transistor, and an EL element, the plurality of pixels being arrayed in a first direction and in a second direction crossing the first direction;
a plurality of scanning signal lines electrically connected with gates of the selection transistors, the plurality of scanning signal lines extending in the first direction and being arrayed in the second direction;
a plurality of data signal lines electrically connected with sources of the selection transistors, the plurality of data signal lines extending in the second direction and being arrayed in the first direction; and
a plurality of carrier injection amount control signal lines connected with the EL elements, the plurality of carrier injection amount control signal lines extending in the first direction or the second direction and being arrayed in the second direction or the first direction,
wherein:
the EL element of each of the plurality of pixels includes:
a first electrode,
a third electrode including a region facing the first electrode,
a first insulating layer between the first electrode and the third electrode,
an electron transfer layer between the first insulating layer and the third electrode, a light emitting layer containing an electroluminescence material between the electron transfer layer and the third electrode, and a second electrode located outer to a region where the first electrode, the first insulating layer, the electron transfer layer and the third electrode overlap each other, the second electrode being in contact with the electron transfer layer, the first electrode is electrically connected with one of the carrier injection amount control signal lines, the second electrode is connected with a drain of the driving transistor, and the third electrode is supplied with a constant voltage, wherein: the plurality of pixels each have a light emission period and a light non-emission period, and the plurality of carrier injection amount control signal lines each apply a voltage having a step-like waveform to the first electrode of each of the corresponding pixels in the light emission period.

6. The electroluminescence display device according to claim 5, wherein:

at least a first data signal line and a second data signal line among the plurality of data signal lines extend to belong to the same column, the selection transistor of an n'th pixel in the second direction, among the plurality of pixels, is electrically connected with the first data signal line, and the selection transistor of an (n+1)'th pixel in the second direction, among the plurality of pixels, is electrically connected with the second data signal line.

7. The electroluminescence display device according to claim 6, wherein the first data signal line and the second data signal line overlap each other with an insulating layer being provided therebetween.

8. The electroluminescence display device according to claim 5, wherein a plurality of pixels arrayed in an n'th row extending in the first direction and a plurality of pixels arrayed in an (n+1)'th row extending in the first direction, among the plurality of pixels, share one of the plurality of scanning signal lines.

9. The electroluminescence display device according to claim 8, wherein the plurality of pixels arrayed in the n'th row extending in the first direction and the plurality of pixels arrayed in the (n+1)'th row extending in the first direction further share one of the plurality of carrier injection amount control signal lines.

10. The electroluminescence display device according to claim 9, wherein the plurality of pixels include a plurality of pixels arrayed in the n'th row extending in the first direction and corresponding to red, a plurality of pixels arrayed in the (n+1)'th row extending in the first direction and corresponding to green, and a plurality of pixels arrayed in an (n+2)'th row extending in the first direction and corresponding to blue, and the plurality of carrier injection amount control signal lines include an n'th carrier injection amount control signal line corresponding to the plurality of pixels arrayed in the n'th row and corresponding to red, an (n+1)'th carrier injection amount control signal line corresponding to the plurality of pixels arrayed in the (n+1)'th row and corresponding to green, and an (n+2)'th carrier injection amount control signal line corresponding to the plurality of pixels arrayed in the (n+2)'th row and corresponding to blue.

11. The electroluminescence display device according to claim 10, wherein the n'th carrier injection amount control signal line, the (n+1)'th carrier injection amount control signal line and the (n+2)'th carrier injection amount control signal line apply carrier injection amount control signals of different voltage levels from each other.

* * * * *